US012804898B2

(12) United States Patent
Kim et al.

(10) Patent No.: US 12,804,898 B2
(45) Date of Patent: Nov. 17, 2026

(54) INTEGRATED CIRCUIT DEVICE AND ELECTRONIC SYSTEM INCLUDING THE SAME

(71) Applicant: Samsung Electronics Co., Ltd., Suwon-si (KR)

(72) Inventors: Junhyoung Kim, Suwon-si (KR); Jimo Gu, Suwon-si (KR); Jiyoung Kim, Suwon-si (KR); Sukkang Sung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 352 days.

(21) Appl. No.: 18/498,673

(22) Filed: Oct. 31, 2023

(65) Prior Publication Data

US 2024/0224514 A1 Jul. 4, 2024

(30) Foreign Application Priority Data

Dec. 28, 2022 (KR) ........................ 10-2022-0187757

(51) Int. Cl.
*H10B 41/27* (2023.01)
*G11C 16/04* (2006.01)
(Continued)

(52) U.S. Cl.
CPC ......... *H10B 41/27* (2023.02); *G11C 16/0483* (2013.01); *H10B 41/10* (2023.02);
(Continued)

(58) Field of Classification Search
CPC ........ H10B 41/27; H10B 41/10; H10B 41/35; H10B 43/10; H10B 43/27; H10B 43/35;
(Continued)

(56) References Cited

U.S. PATENT DOCUMENTS 10,262,936 B2 4/2019 Yazawa
10,861,789 B2 12/2020 Mizukami et al.
(Continued)

FOREIGN PATENT DOCUMENTS

KR 10-2014-0122890 A 10/2014

OTHER PUBLICATIONS

Extended European Search Report dated Jun. 4, 2024 issued in European Patent Application No. 23214447.7-1211.
(Continued)

*Primary Examiner* — Jonathan Han
(74) *Attorney, Agent, or Firm* — HARNESS, DICKEY & PIERCE, P.L.C.

(57) ABSTRACT

An integrated circuit device includes a substrate including a memory cell area and a connection area, a gate stack including a plurality of gate electrodes apart from each other in a vertical direction on the substrate, a plurality of gate connection openings arranged in the connection area to extend inward from an upper surface of the gate stack, one of the plurality of gate electrodes being exposed at a bottom surface of each of the plurality of gate connection openings, a plurality of gate connection structures respectively covering at least inner side surfaces of the plurality of gate connection openings, each of the plurality of gate connection structures being connected with the one gate electrode, and a plurality of gate contacts respectively connected to upper ends of the plurality of gate connection structures.

20 Claims, 54 Drawing Sheets

(51) Int. Cl.

| | |
|---|---|
| ***H10B 41/10*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10B 80/00*** | (2026.01) |
| ***H10W 90/00*** | (2026.01) |

(52) U.S. Cl.
CPC ............. *H10B 41/35* (2023.02); *H10B 43/10* (2023.02); *H10B 43/27* (2023.02); *H10B 43/35* (2023.02); *H10B 80/00* (2023.02); *H10W 90/00* (2026.01); *H10W 90/752* (2026.01)

(58) Field of Classification Search
CPC ........ H10B 80/00; H10B 41/50; H10B 43/50; H10B 43/20; H10B 43/40; G11C 16/0483; H10W 90/00; H10W 90/752
See application file for complete search history.

(56) References Cited

U.S. PATENT DOCUMENTS

| | | | |
|---|---|---|---|
| 10,886,289 B2 | 1/2021 | Kang et al. | |
| 10,930,585 B2 | 2/2021 | Smith et al. | |
| 11,107,729 B2 | 8/2021 | Lee | |
| 11,233,004 B2 | 1/2022 | Lim | |
| 2018/0226341 A1* | 8/2018 | Yazawa | H01L 21/76805 |
| 2021/0143100 A1 | 5/2021 | Chakravarthi et al. | |
| 2021/0257301 A1 | 8/2021 | Matsumoto | |
| 2022/0130852 A1* | 4/2022 | Totoki | H01L 23/5226 |
| 2023/0125995 A1 | 4/2023 | Kim et al. | |

OTHER PUBLICATIONS

Korean Office Action dated Aug. 30, 2026 for corresponding Korean Patent Application No. 10-2022-0187757 and its English-language translation.

* cited by examiner

II-II'

INTEGRATED CIRCUIT DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0187757, filed on Dec. 28, 2022, in the Korean Intellectual Property Office, the disclosure of which is incorporated by reference herein in its entirety.

BACKGROUND

Various example embodiments relate to an integrated circuit device and/or an electronic system including the integrated circuit device, and more particularly, to an integrated circuit device including a nonvolatile memory device and/or an electronic system including the integrated circuit device.

Consumers require or desire integrated circuit devices exhibiting high performance, having small sizes and/or low prices. Therefore, to achieve integrated circuit devices having high degrees of integration, integrated circuit devices including 3-dimensional nonvolatile memory devices, in which a plurality of memory cells are arranged in a vertical direction, and electronic systems including such integrated circuit devices have been proposed.

SUMMARY

Various example embodiments provide an integrated circuit device, which has an improved electrical connection reliability, and/or an electronic system including the integrated circuit device.

According to various example embodiments, there is provided an integrated circuit device including a substrate including a memory cell area and a connection area, a gate stack on the substrate and including a plurality of gate electrodes that are apart from each other in a vertical direction, with a plurality of gate connection openings defined in the connection area and extending inward from an upper surface of the gate stack, one of the plurality of gate electrodes being exposed at a bottom surface of each of the plurality of gate connection openings, a plurality of gate connection structures respectively covering at least inner side surfaces of the plurality of gate connection openings, each of the plurality of gate connection structures being connected with the one gate electrode, and a plurality of gate contacts respectively connected to upper ends of the plurality of gate connection structures.

Alternatively or additionally according to some example embodiments, there is provided an integrated circuit device including a substrate including a memory cell area and a connection area, a gate stack on the substrate and including a plurality of insulating layers and a plurality of gate electrodes, which are alternately arranged in a vertical direction, a plurality of channel structures passing through the gate stack in the memory cell area, with a plurality of gate connection openings defined in the connection area to extend inward from an upper surface of the gate stack, one of the plurality of gate electrodes being exposed at a bottom surface of each of the plurality of gate connection openings, a plurality of dummy structures apart from the plurality of channel structures and passing through the gate stack, at least one of the plurality of dummy structures being arranged in each of the plurality of gate connection openings, a plurality of gate connection structures conformally covering inner side surfaces of and bottom surfaces of the plurality of gate connection openings, respectively, wherein each of the plurality of gate connection structures is connected with the one gate electrode, which is exposed at the bottom surface of each of the plurality of gate connection openings, and covers the at least one dummy structure arranged in each of the plurality of gate connection openings, and a plurality of gate contacts respectively connected to upper ends of the plurality of gate connection structures.

Alternatively or additionally according to some example embodiments, there is provided an electronic system including a main substrate, an integrated circuit device on the main substrate, and a controller on the main substrate and electrically connected with the integrated circuit device, wherein the integrated circuit device includes a gate stack including a plurality of gate electrodes on a second substrate and are apart from each other in a vertical direction, the second substrate including a memory cell area and a connection area, a plurality of channel structures passing through the gate stack in the memory cell area with a plurality of gate connection openings defined in the connection area to extend inward from an upper surface of the gate stack, one of the plurality of gate electrodes being exposed at a bottom surface of each of the plurality of gate connection openings, a plurality of dummy structures apart from the plurality of channel structures and passing through the gate stack, at least one of the plurality of dummy structures being arranged in each of the plurality of gate connection openings, a plurality of gate connection structures respectively covering inner side surfaces and bottom surfaces of the plurality of gate connection openings, each of the plurality of gate connection structures being connected with the one gate electrode, and a plurality of gate contacts respectively connected to upper ends of the plurality of gate connection structures.

BRIEF DESCRIPTION OF THE DRAWINGS

Various example embodiments will be more clearly understood from the following detailed description taken in conjunction with the accompanying drawings in which.

DETAILED DESCRIPTION OF VARIOUS EXAMPLE EMBODIMENTS

Figure 1:
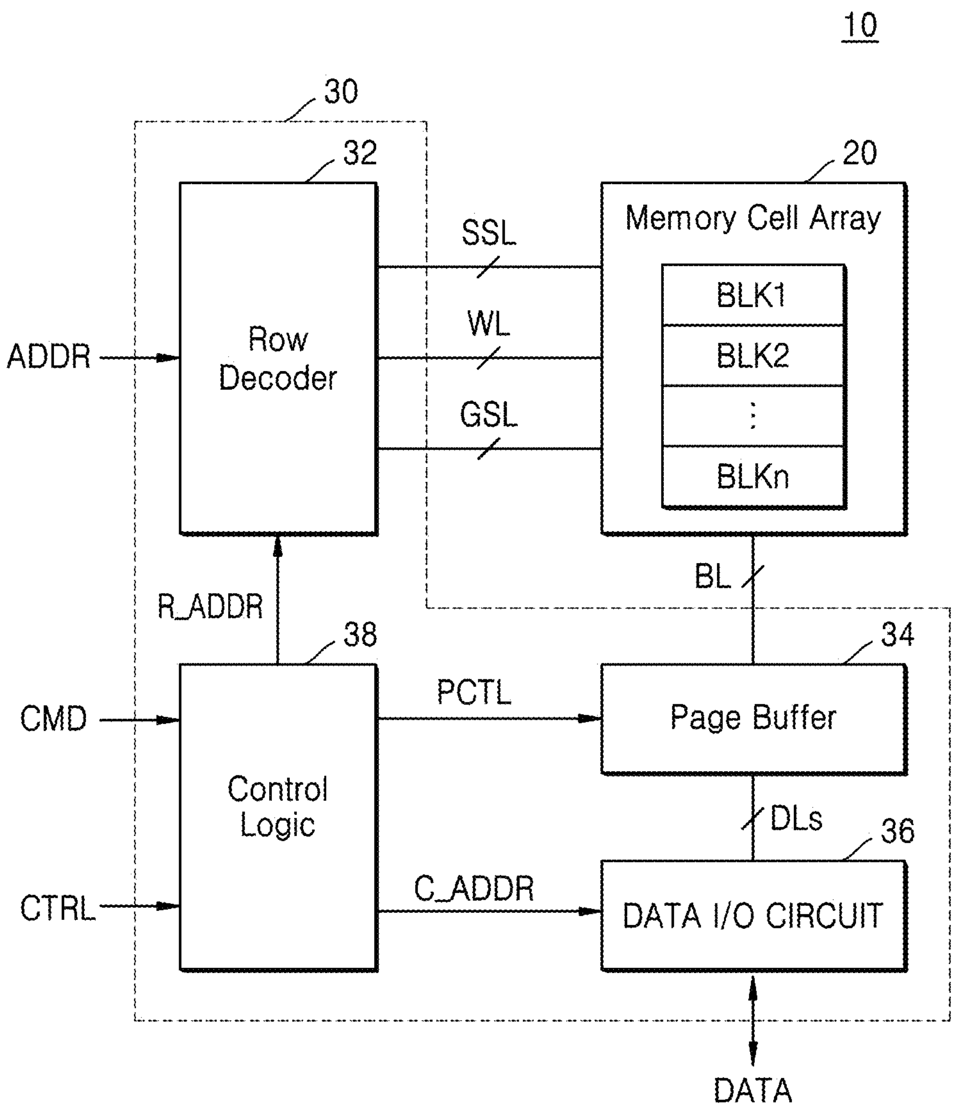
FIG. 1 is a block diagram of an integrated circuit device according to some example embodiments.

FIG. 1 is a block diagram of an integrated circuit device according to some example embodiments.

Referring to FIG. 1, an integrated circuit device 10 may include a memory cell array 20 and a peripheral circuit 30. The memory cell array 20 includes a plurality of memory cell blocks BLK1, BLK2, . . . , and BLKn. Each of the plurality of memory cell blocks BLK1, BLK2, . . . , and BLKn may include a plurality of memory cells. Each of (or at least some of) the memory cell blocks BLK1, BLK2, . . . , and BLKn may be connected to the peripheral circuit 30 via a bit line BL, a word line WL, a string select line SSL, and a ground select line GSL. There may or may not be dummy memory cells; these dummy memory cells may or may not be connected to the peripheral circuit 30.

The peripheral circuit 30 may include a row decoder 32, a page buffer 34, a data input/output circuit 36, and control logic 38. Although not shown in FIG. 1, the peripheral circuit 30 may further include an input/output interface, column logic, a voltage generator, a pre-decoder, a temperature sensor, a command decoder, an address decoder, an amplifier circuit, or the like.

The memory cell array 20 may be connected to the page buffer 34 via the bit line BL and may be connected to the row decoder 32 via the word line WL, the string select line SSL, and the ground select line GSL. In the memory cell array 20, each of the plurality of memory cells, which are included in the plurality of memory cell blocks BLK1, BLK2, . . . , and BLKn, may include a flash memory cell. The memory cell array 20 may include a 3-dimensional memory cell array. The 3-dimensional memory cell array may include a plurality of NAND strings, and each of the plurality of NAND strings may include a plurality of memory cells respectively connected to a plurality of word lines WL that are vertically stacked on a substrate.

The peripheral circuit 30 may receive an address ADDR, a command CMD, and a control signal CTRL, each from outside the integrated circuit device 10, and may transmit data DATA to and receive the data DATA from a device external to the integrated circuit device 10.

The row decoder 32 may select at least one of the plurality of memory cell blocks BLK1, BLK2, . . . , and BLKn in response to the address ADDR from outside the integrated circuit device 10 and may select the word line WL, the string select line SSL, and the ground select line GSL of the selected memory cell block. The row decoder 32 may transfer a signal such as a voltage for performing a memory operation to the word line WL of the selected memory cell block.

The page buffer 34 may be connected to the memory cell array 20 via the bit line BL. The page buffer 34 may apply a voltage according to the data DATA, which is intended to be stored in the memory cell array 20, to the bit line BL, by operating as a write driver during a program operation and may sense the data DATA, which is stored in the memory cell array 20, by operating as a sense amplifier during a read operation. The page buffer 34 may operate according to a control signal PCTL provided by the control logic 38.

The data input/output circuit 36 may be connected with the page buffer 34 via data lines DLs. The data input/output circuit 36, during the program operation, may receive the data DATA from a memory controller (not shown) and may provide program data DATA to the page buffer 34 based on a column address C_ADDR provided by the control logic 38. During the read operation, the data input/output circuit 36 may provide read data DATA stored in the page buffer 34 to the memory controller based on the column address C_ADDR provided by the control logic 38.

The data input/output circuit 36 may transfer an address or a command, which is input thereto, to the control logic 38 or the row decoder 32. The peripheral circuit 30 may further include an electrostatic discharge (ESD) circuit and/or a pull-up/pull-down driver.

The control logic 38 may receive the command CMD and the control signal CTRL from the memory controller. The control logic 38 may provide a row address R_ADDR to the row decoder 32 and provide the column address C_ADDR to the data input/output circuit 36. The control logic 38 may generate various internal control signals, which are used in the integrated circuit device 10, in response to the control signal CTRL. For example, when a memory operation, such as a program operation and/or an erase operation, is performed, the control logic 38 may adjust levels of voltages respectively provided to the word line WL and the bit line BL.

Figure 2:
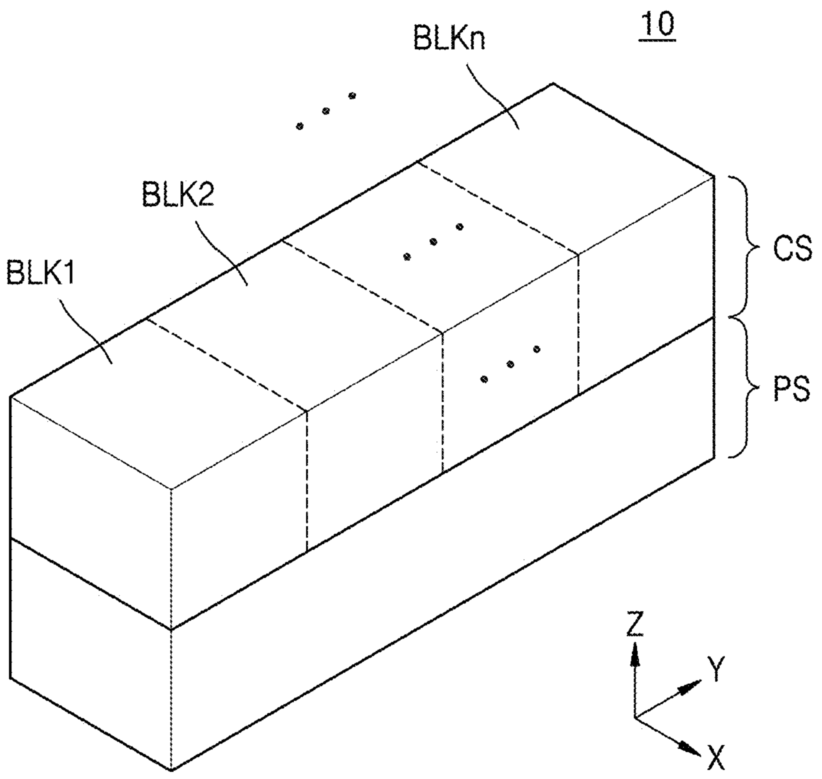
FIG. 2 is a schematic perspective view of an integrated circuit device according to some example embodiments.

FIG. 2 is a schematic perspective view of an integrated circuit device according to some example embodiments.

Referring to FIG. 2, the integrated circuit device 10 includes a cell array structure CS and a peripheral circuit structure PS, which at least partly overlap each other or are flush with each other in a vertical direction (Z direction). The cell array structure CS may include the memory cell array 20 described with reference to FIG. 1. The peripheral circuit structure PS may include the peripheral circuit 30 described with reference to FIG. 1.

The cell array structure CS may include the plurality of memory cell blocks BLK1, BLK2, . . . , and BLKn. Each of the plurality of memory cell blocks BLK1, BLK2, . . . , and BLKn may include memory cells that are 3-dimensionally arranged.

Figure 3:
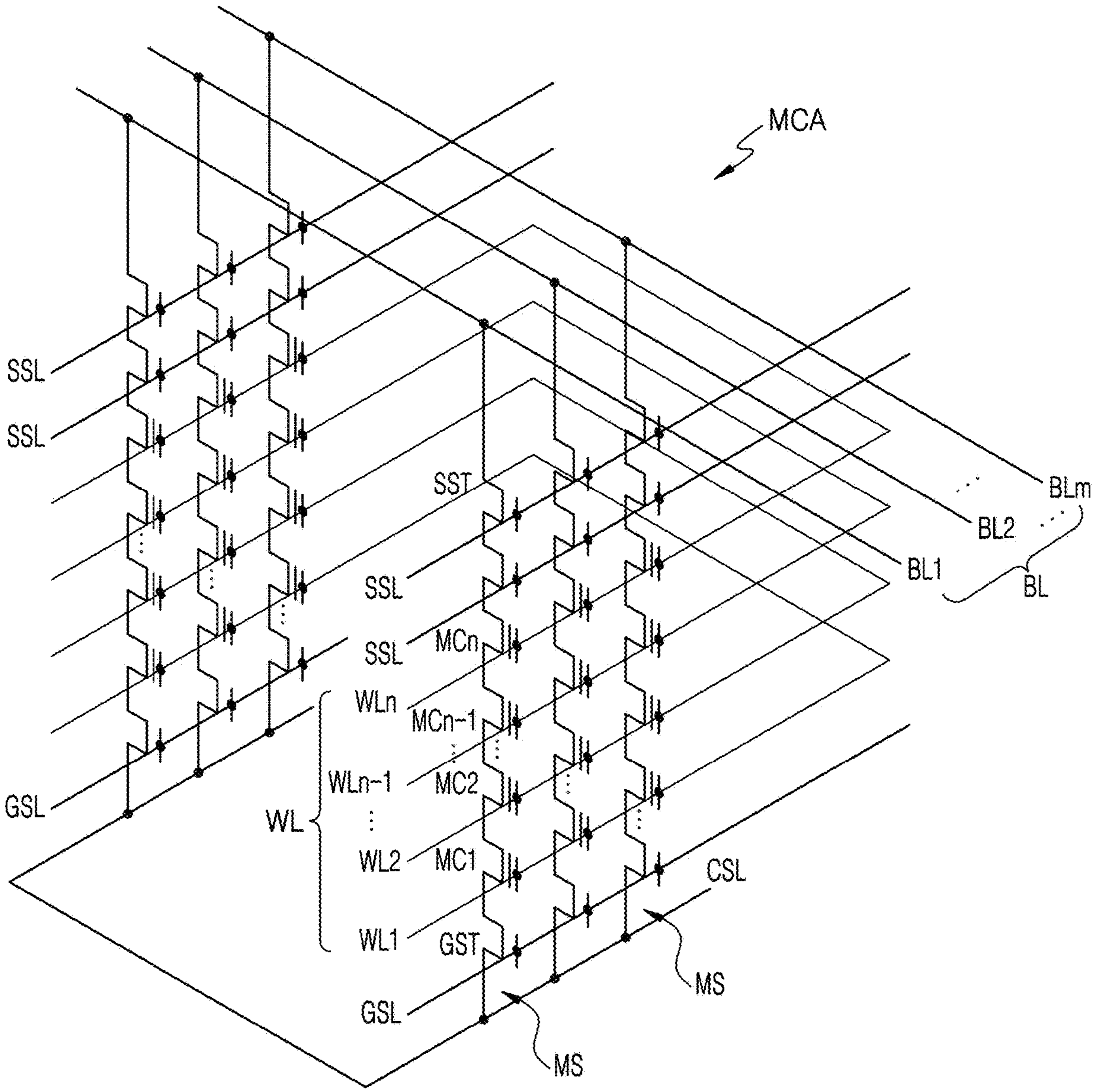
FIG. 3 is an equivalent circuit diagram of a memory cell array of an integrated circuit device according to some example embodiments.

FIG. 3 is an equivalent circuit diagram of a memory cell array of an integrated circuit device according to some example embodiments.

Referring to FIG. 3, a memory cell array MCA may include a plurality of memory cell strings MS. The memory cell array MCA may include a plurality of bit lines BL (that is, BL1, BL2, . . . , and BLm), a plurality of word lines WL (that is, WL1, WL2, . . . , WLn−1, and WLn), at least one string select line SSL, at least one ground select line GSL, and a common source line CSL. The plurality of memory cell strings MS may be formed between the plurality of bit lines BL (that is, BL1, BL2, . . . , and BLm) and the common source line CSL. Although FIG. 3 illustrates an example in which each of the plurality of memory cell strings MS includes two string select lines SSL, the inventive concept is not limited thereto. For example, each of the plurality of memory cell strings MS may include one string select line SSL.

Each of the plurality of memory cell strings MS may include a string select transistor SST, a ground select transistor GST, and a plurality of memory cell transistors MC1, MC2, . . . , MCn−1, and MCn. A drain region of the string select transistor SST may be connected to the bit line BL (that is, BL1, BL2, . . . , or BLm), and a source region of the ground select transistor GST may be connected to the common source line CSL. The common source line CSL may be a region to which source regions of a plurality of ground select transistors GST are commonly connected.

The string select transistor SST may be connected to the string select line SSL, and the ground select transistor GST may be connected to the ground select line GSL. The plurality of memory cell transistors MC1, MC2, . . . , MCn−1, and MCn may be respectively connected to the plurality of word lines WL (that is, WL1, WL2, . . . , WLn−1, and WLn).

Figure 4:
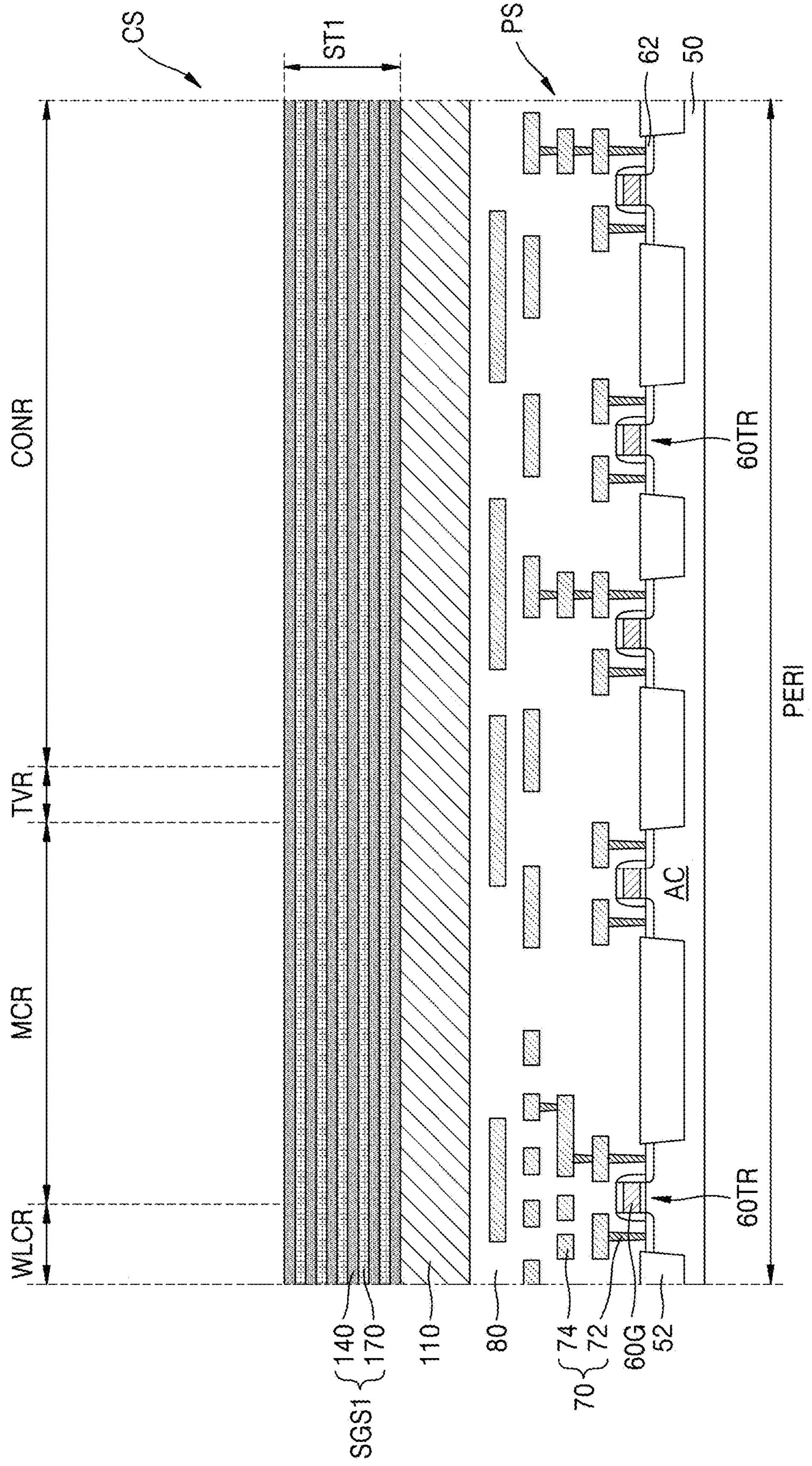
FIGS. 4 to 27 are cross-sectional views illustrating a method of fabricating an integrated circuit device, according to some example embodiments.
Figure 5A:
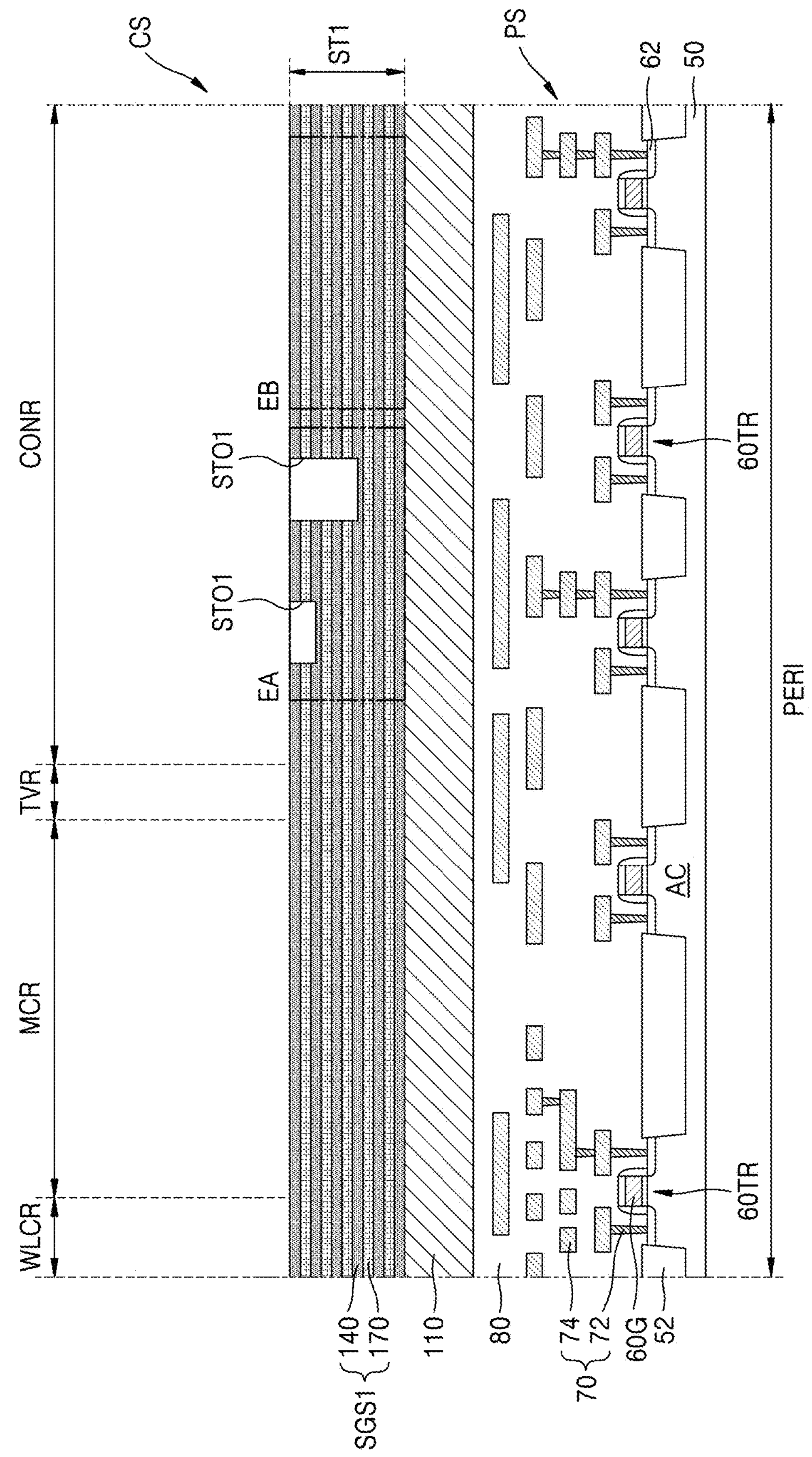
Figure 5B:
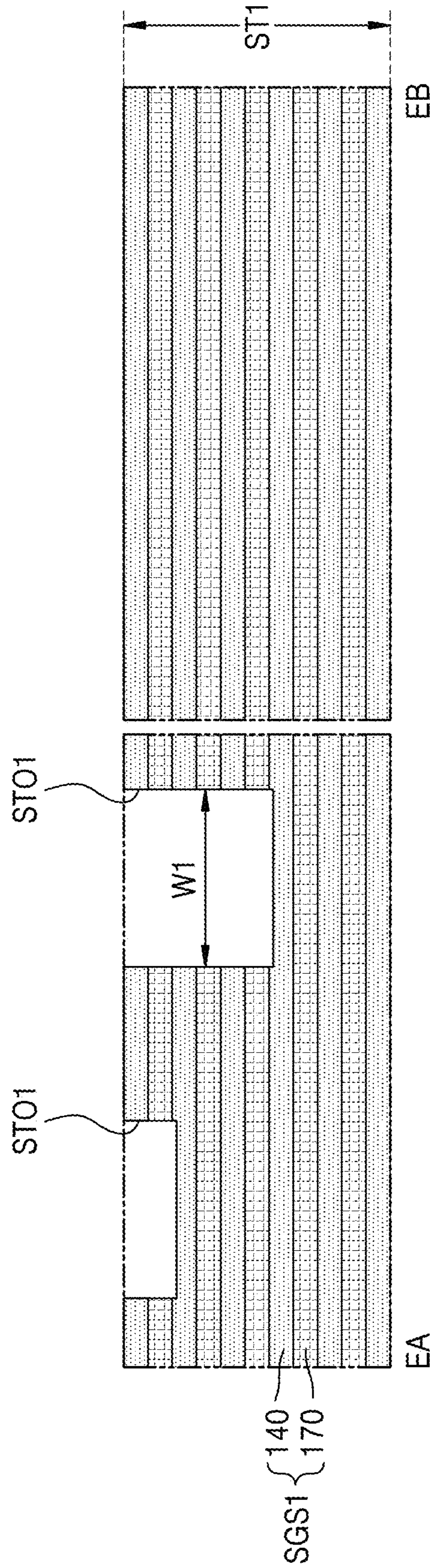
Figure 19:
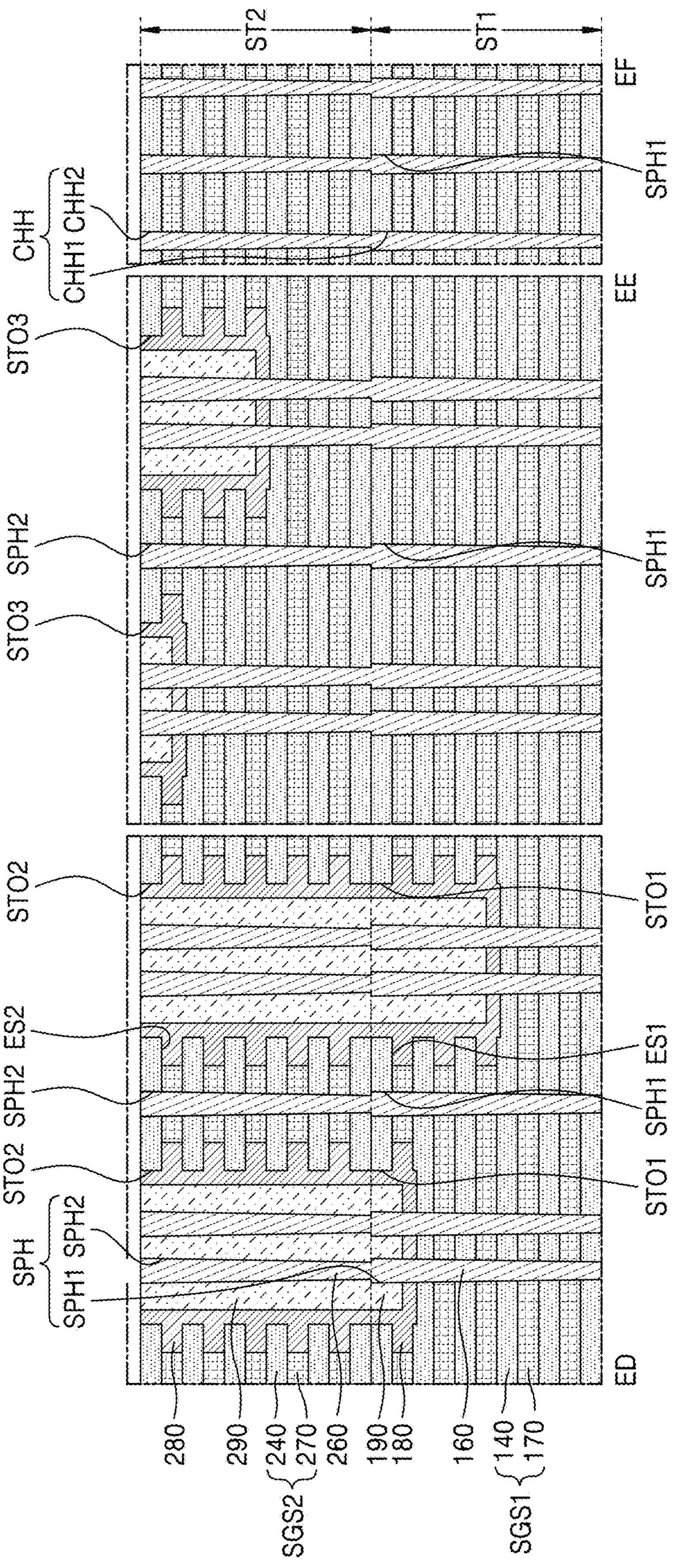
Figure 20:
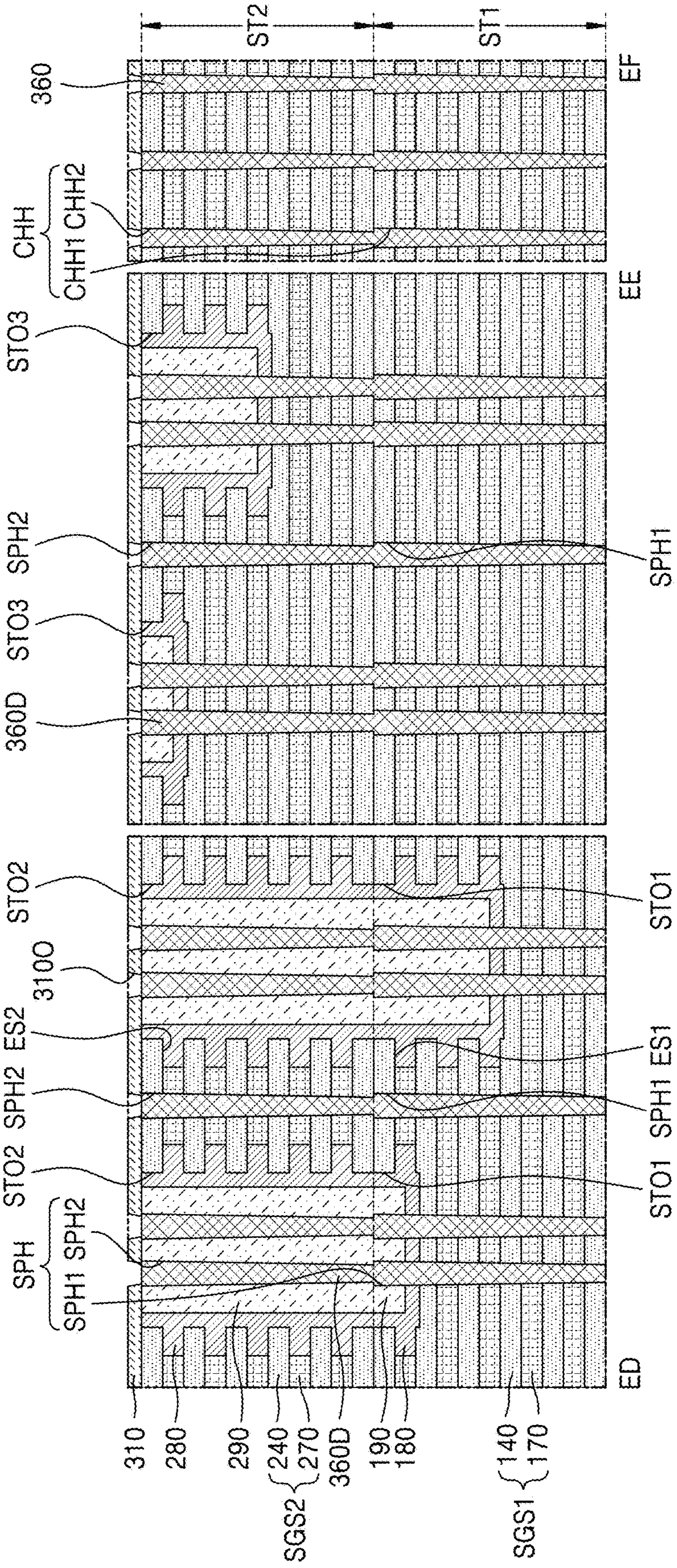
Figure 22:
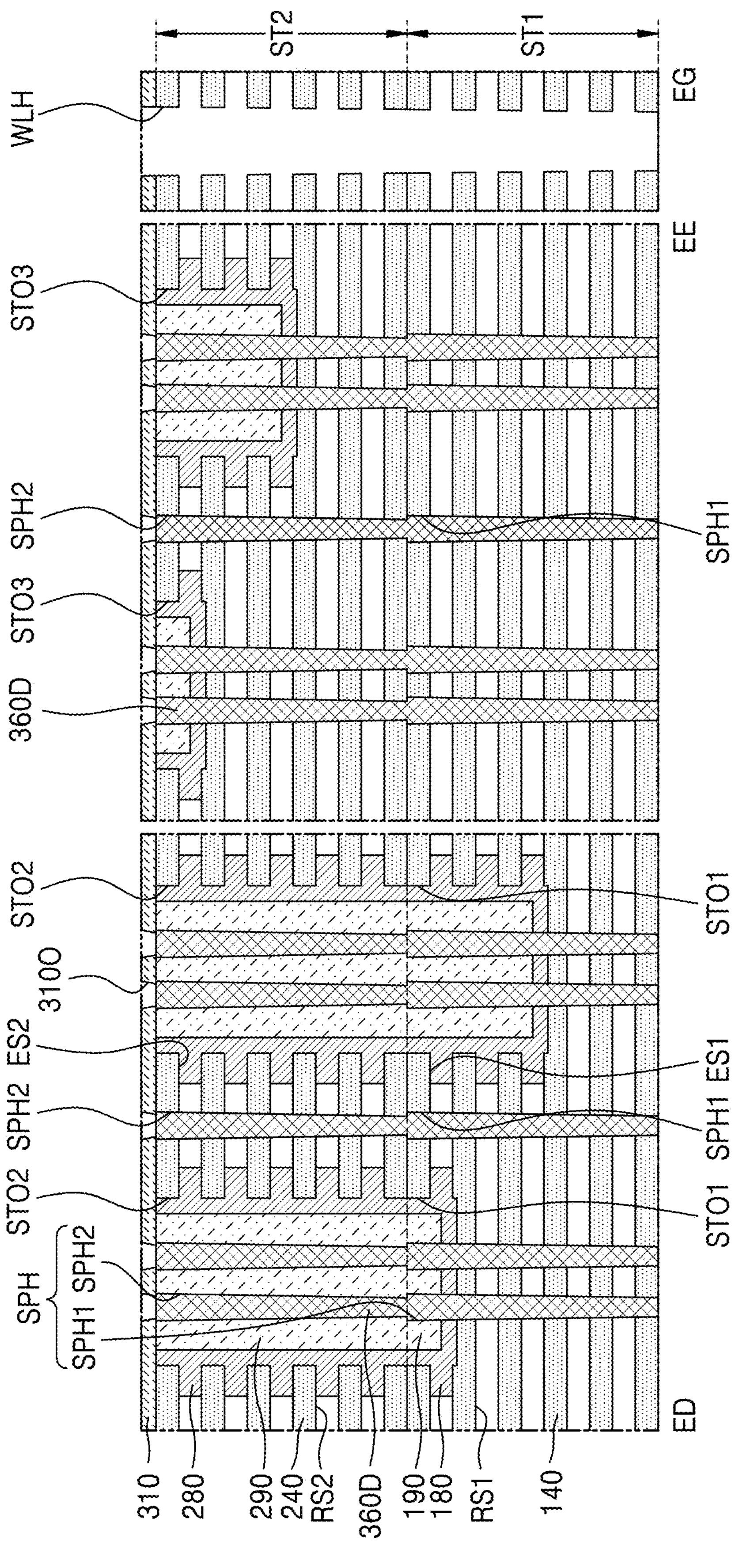
Figure 23:
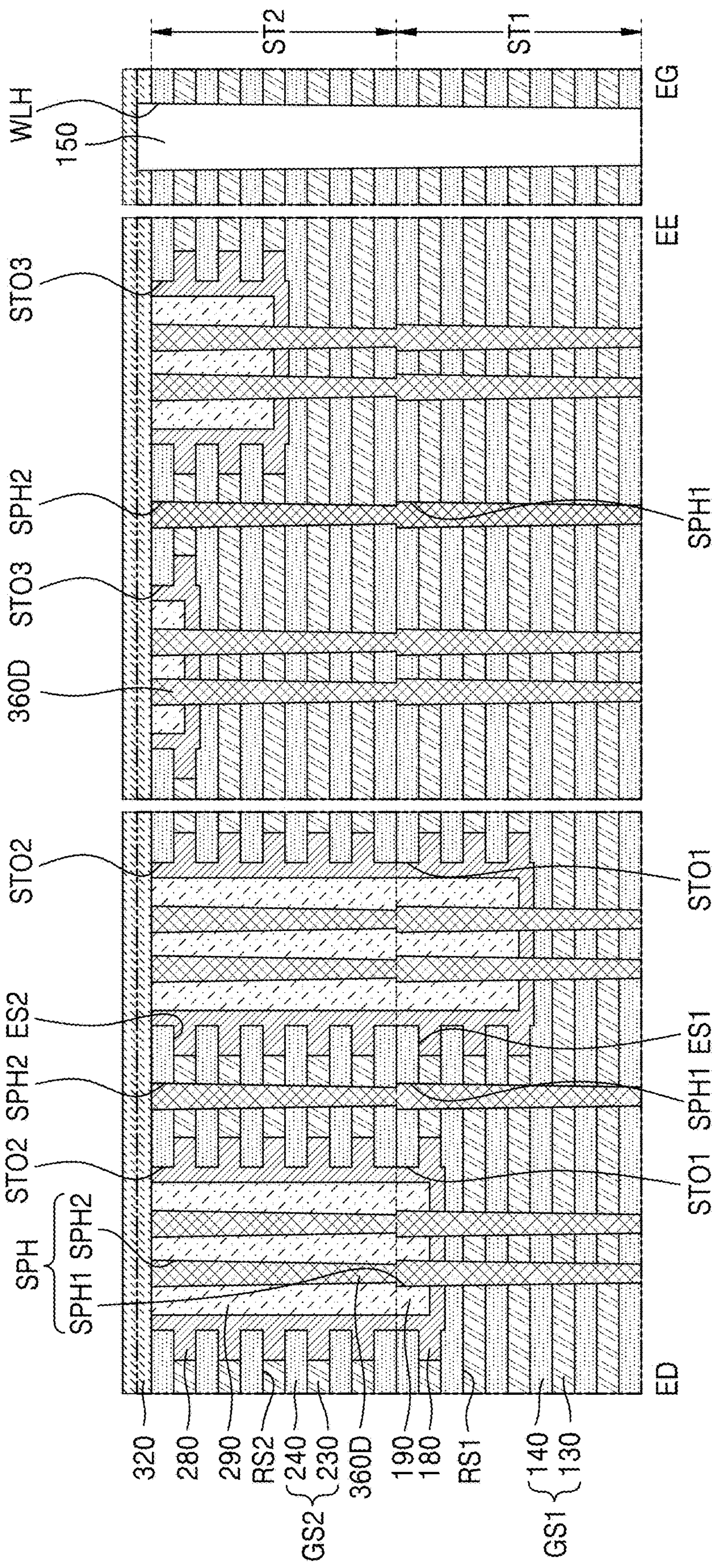
Figure 27:
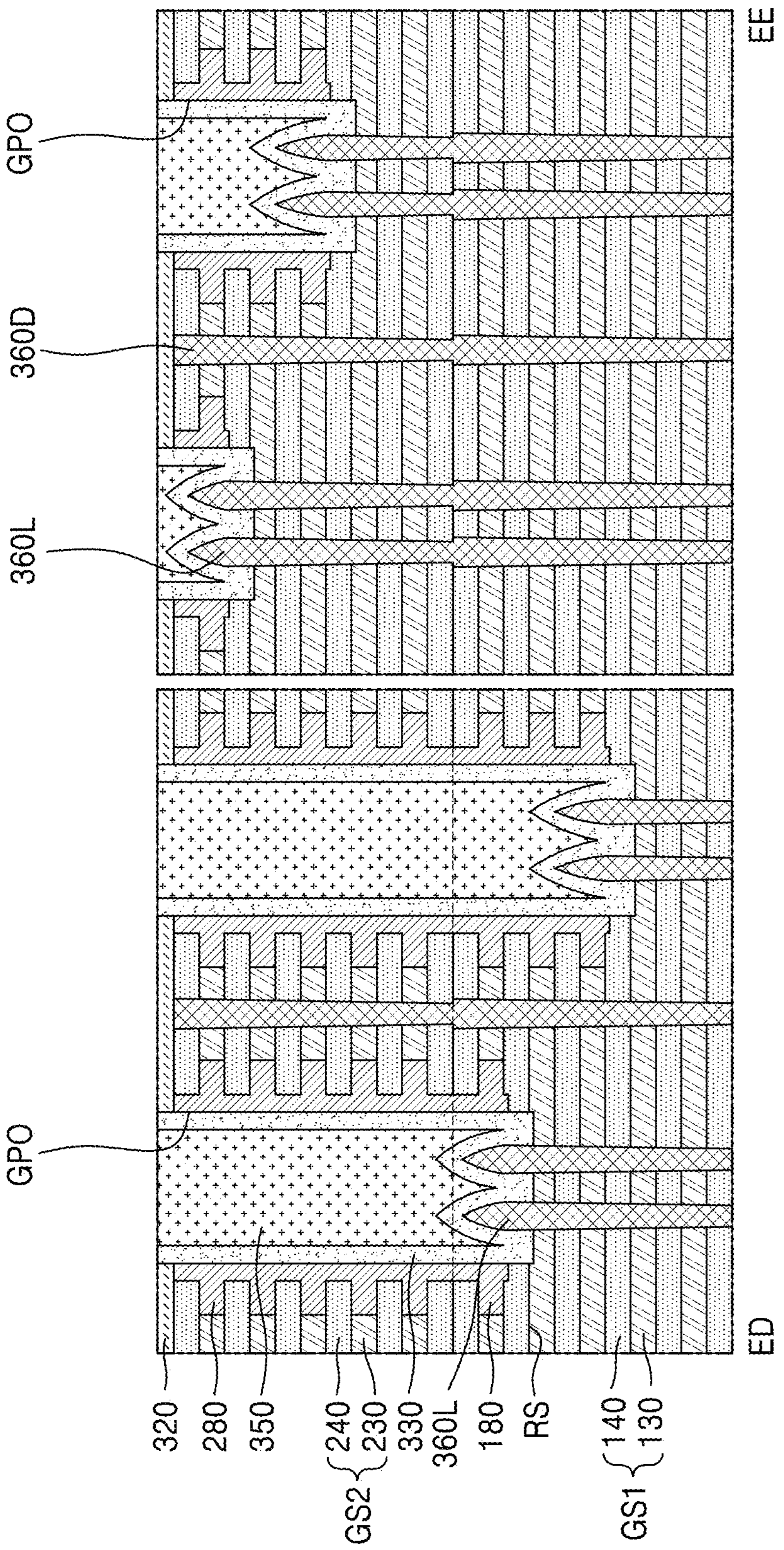
Figure 28A:
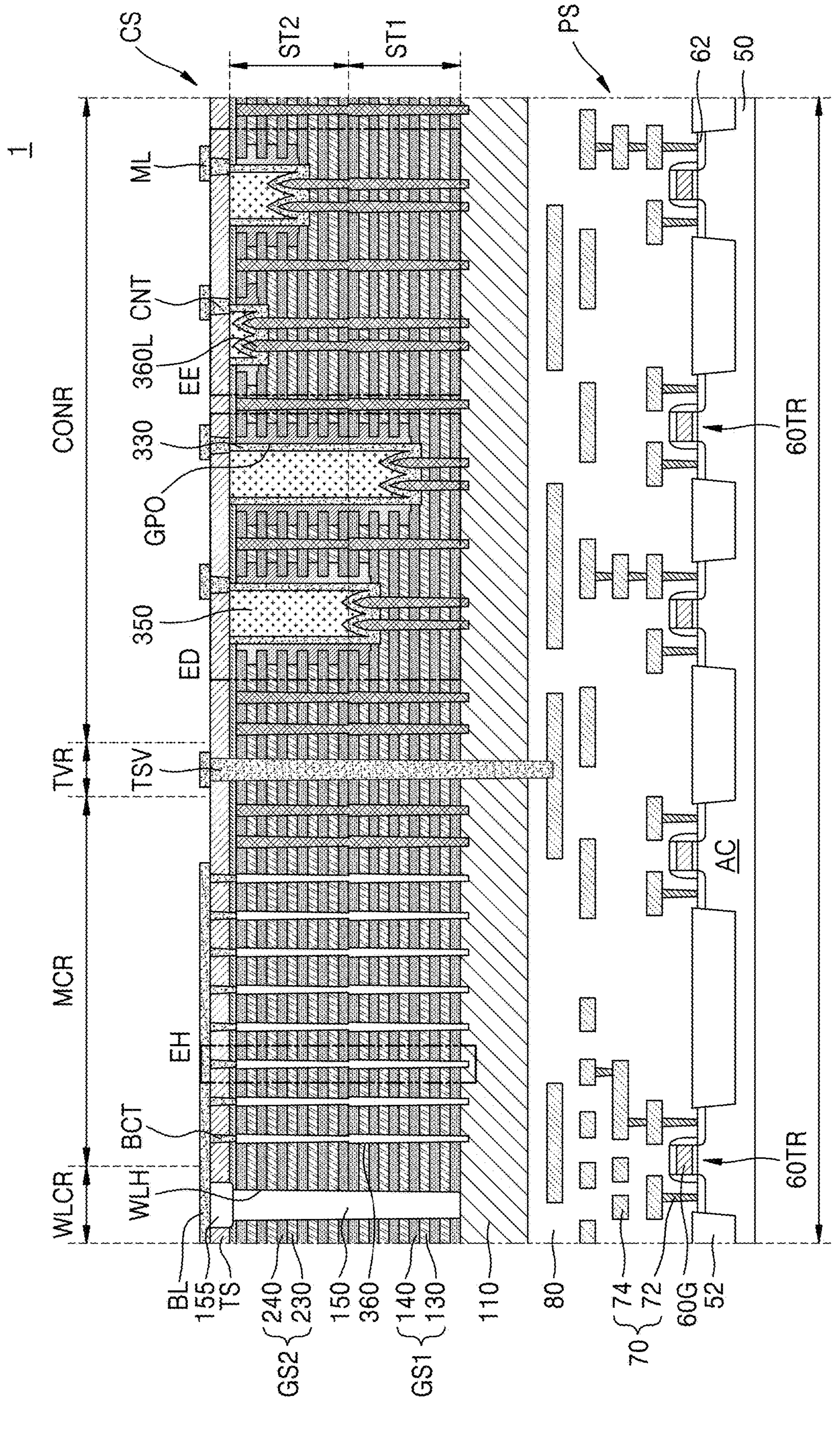
FIGS. 28A to 28C are cross-sectional views illustrating an integrated circuit device according to some example embodiments.
Figure 28B:
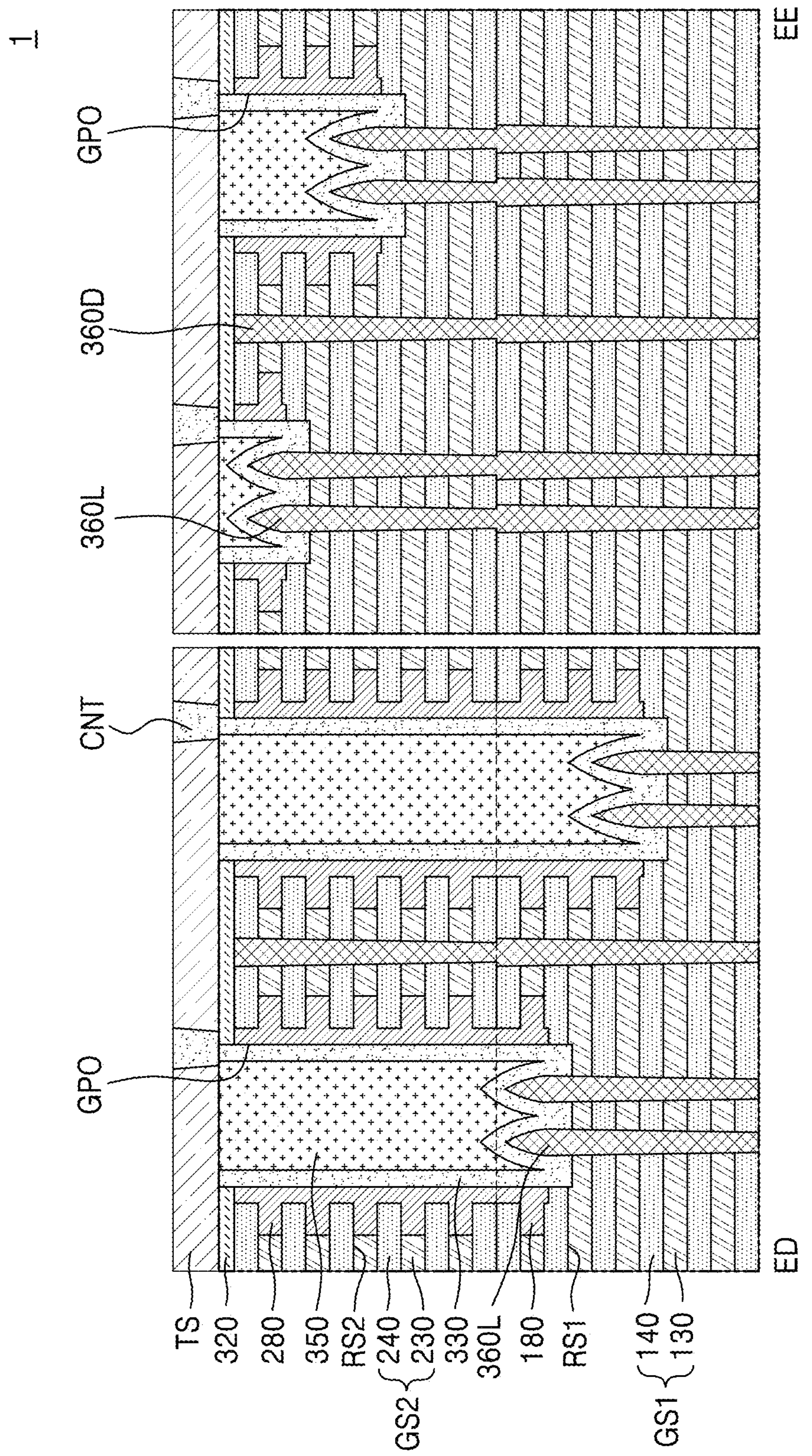
Figure 28C:
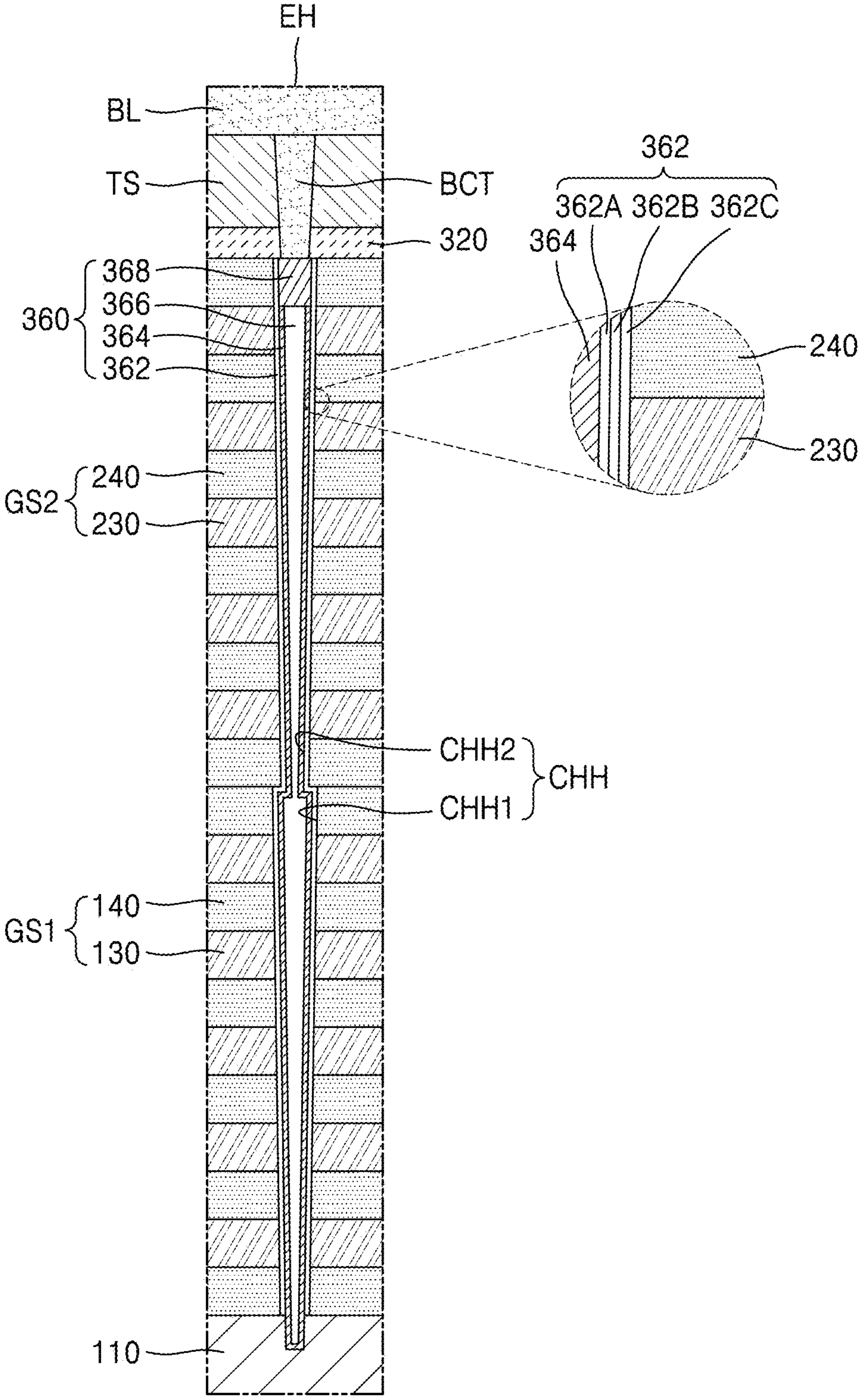

FIGS. 4 to 27 are cross-sectional views illustrating a method of fabricating an integrated circuit device, according to some example embodiments, and FIGS. 28A to 28C are cross-sectional views illustrating an integrated circuit device according to some example embodiments. Specifically, FIGS. 4 and 5A are cross-sectional views of a semiconductor device such as a cell-over-peripheral (COP) device; FIG. 5B is an enlarged cross-sectional view illustrating regions EA and EB of FIG. 5A; FIGS. 6, 7, 8, and 9 are enlarged cross-sectional views each illustrating regions corresponding to the regions EA and EB of FIG. 5A; FIG. 10B is an enlarged cross-sectional view illustrating regions EA, EB, and EC of FIG. 10A; FIG. 11 is an enlarged cross-sectional view illustrating regions corresponding to the regions EA, EB, and EC of FIG. 10A; FIG. 12B is an enlarged cross-sectional view illustrating regions ED and EE of FIG. 12A; FIGS. 13, 14, 15, 16, and 17 are enlarged cross-sectional views each illustrating regions corresponding to the regions ED and EE of FIG. 12A; FIG. 18B is an enlarged cross-sectional view illustrating regions ED, EE, and EF of FIG. 18A; FIGS. 19 and 20 are enlarged cross-sectional views each illustrating regions corresponding to the regions ED, EE, and EF of FIG. 18A; FIG. 21B is an enlarged cross-sectional view illustrating regions ED, EE, and EG of FIG. 21A; FIGS. 22 and 23 are enlarged cross-sectional views each illustrating regions corresponding to the regions ED, EE, and EG of FIG. 21A; FIGS. 24, 25, 26, and 27 are enlarged cross-sectional views each illustrating regions corresponding the regions ED and EE of FIG. 21A; FIG. 28B is an enlarged cross-sectional view illustrating regions ED and EE of FIG. 28A; and FIG. 28C is an enlarged cross-sectional view illustrating a region EH of FIG. 28A.

Referring to FIG. 4, a base structure 110 is formed on the peripheral circuit structure PS, and a first sacrificial gate stack SGS1 is formed on the base structure 110. The base structure 110 and the first sacrificial gate stack SGS1 may each overlap the peripheral circuit structure PS in the vertical direction.

The cell array structure CS including a plurality of stacks may be arranged over the peripheral circuit structure PS; the cell array structure CS may include a memory cell area MCR, a connection area CONR, and a through-electrode area TVR; and the peripheral circuit structure PS may include a peripheral circuit area PERI. The cell array structure CS may include a plurality of cell blocks (that is, BLK1, BLK2, . . . , and BLKn of FIG. 2), which are separated from each other by a word line cut area WLCR. The first sacrificial gate stack SGS1 may correspond to a first stack ST1 from among the plurality of stacks.

The peripheral circuit structure PS may include a peripheral circuit transistor 60TR and a peripheral circuit wiring structure 70, which are arranged on a substrate 50. As illustrated in FIG. 4 the peripheral circuit transistors 60TR may be planar transistors each extending in a first direction; however, example embodiments are not limited thereto, and at least one of the peripheral circuit transistors 60TR may be three-dimensional transistors, and at least one of the peripheral circuit transistors 60TR may extend in a second direction. An active region AC may be defined in the substrate 50 by a device isolation film 52, and a plurality of peripheral circuit transistors 60TR may be respectively formed on active regions AC. Each of the plurality of peripheral circuit transistors 60TR may include a peripheral circuit gate 60G and a source/drain region 62 arranged in a portion of the substrate 50 on both sides of the peripheral circuit gate 60G.

The substrate 50 may include a semiconductor material, for example, a Group IV semiconductor, a Group III-V compound semiconductor, or a Group II-VI compound semiconductor. For example, the Group IV semiconductor may include silicon (Si), germanium (Ge), or silicon-germanium. The substrate 50 may be provided as a bulk wafer or an epitaxial layer. In some example embodiments, the substrate 50 may include a silicon-on-insulator (SOI) substrate or a germanium-on-insulator (GeOI) substrate.

The peripheral circuit wiring structure 70 includes a plurality of peripheral circuit contacts 72 and a plurality of peripheral circuit wiring layers 74. An interlayer dielectric 80 may be arranged on the substrate 50 to cover the peripheral circuit transistor 60TR and the peripheral circuit wiring structure 70. The plurality of peripheral circuit wiring layers 74 may have a multilayer structure including a plurality of metal layers that are arranged at different vertical levels from each other. Although FIGS. 4 and 5A illustrate an example in which all the plurality of peripheral circuit wiring layers 74 are formed to the same height, unlike this, peripheral circuit wiring layers 74 arranged at some levels (for example, at the uppermost level) may be formed to greater heights than peripheral circuit wiring layers 74 arranged at the other levels. Additionally although FIGS. 4 and 5A illustrate that there are four layers of peripheral circuit wiring layers 74, example embodiments are not limited thereto, and there may be more, or less, peripheral circuit wiring layers 74 than the four illustrated.

The base structure 110 may be arranged on the interlayer dielectric 80. In some example embodiments, the base structure 110 may function as a source area supplying currents to vertical memory cells formed in the cell array structure CS. In some example embodiments, the base structure 110 may include some regions functioning as the common source line CSL described with reference to FIG. 3. In some example embodiments, the base structure 110 may be formed of a semiconductor material, such as silicon. In some example embodiments, the base structure 110 may include a lower base layer formed of a metal material, such as tungsten (W), and an upper base layer, which is stacked on the lower base layer and formed of a semiconductor material, such as silicon.

The first sacrificial gate stack SGS1 may be formed on an upper surface of the base structure 110. The first sacrificial gate stack SGS1 may be formed by alternately forming a plurality of first insulating layers 140 and a plurality of first mold layers 170 on the upper surface of the base structure 110, e.g. with a deposition process such as an atomic layer deposition (ALD) process. A first insulating layer 140 and a first mold layer 170 may be respectively formed of materials having etch selectivity to each other, e.g., having different etch rates. For example, the plurality of first insulating layers 140 may each include an insulating material, such as silicon oxide or silicon oxynitride, and the plurality of first mold layers 170 may each include silicon nitride, silicon oxynitride, impurity-doped polysilicon, or the like. Additionally thicknesses of each of the first insulating layer 140 may be the same as each other or at least one thickness may be different than at least one other. Thicknesses of the first mold layer 170 may be the same as each other or at least one may be different than at least another. A thickness of each layer of the first insulating layer 140 may be the same as an adjacent one of the first mold layer 170, or may be different.

Referring together to FIGS. 5A and 5B, in the connection area CONR, the first sacrificial gate stack SGS1 is partially removed, thereby forming a plurality of first stack openings STO1. Each of the plurality of first stack openings STO1 may expose one of the plurality of first insulating layers 140 at a bottom surface thereof by partially removing the first sacrificial gate stack SGS1 from an upper surface of the first sacrificial gate stack SGS1, and stopping the etch in a bottom surface of one of the first insulating layers 140. The plurality of first stack openings STO1 may be formed apart from each other. Each of the plurality of first stack openings STO1 may have a first horizontal width W1. For example, the first horizontal width W1 may range from hundreds of nanometers (nm) to several micrometers (μm). In some example embodiments, a horizontal cross-section of each of the plurality of first stack openings STO1 may have a polygonal or curved shape, such as a circle, an ellipse, a rectangle, or a corner-rounded or beveled rectangle.

In some example embodiments, a vertical level of the bottom surface of each of the plurality of first stack openings STO1 may be lower than or below a vertical level of an upper surface of the first insulating layer 140 exposed at the bottom surface of each of the plurality of first stack openings STO1. For example, each of the plurality of first stack openings STO1 may extend to the inside of the first insulating layer 140 exposed at the bottom surface of each of the plurality of first stack openings STO1 and may not pass through or fully etch the first insulating layer 140 exposed at the bottom surface of each of the plurality of first stack openings STO1.

In some example embodiments, depths from the upper surface of the first sacrificial gate stack SGS1 to the respective bottom surfaces of the plurality of first stack openings STO1 may be different from each other. In some example embodiments, the plurality of first stack openings STO1 may include a plurality of first opening groups each including two or more first stack openings STO1 having the same depth, and depths from the upper surface of the first sacrificial gate stack SGS1 to respective bottom surfaces of the plurality of first opening groups may be different from each other.

The number of first stack openings STO1 may correspond to the number of first mold layers 170. For example, the number of first stack openings STO1 may be equal to the number of first mold layers 170 of the first sacrificial gate stack SGS1. Alternatively, for example, the number of first stack openings STO1 may be ½, ⅓, ¼, or the like of the number of first mold layers 170 of the first sacrificial gate stack SGS1 or may be somewhat greater than ½, ⅓, ¼, or the like thereof. For example, the number of first stack openings STO1 may be a multiple of the number of first mold layers 170 of the first sacrificial gate stack SGS1 or may be somewhat greater than the multiple thereof.

In some example embodiments, the plurality of first stack openings STO1 may be formed by performing n etching processes for removing portions of the first sacrificial gate stack SGS1, where n is an integer greater than or equal to one. For example, when the number of first stack openings STO1 is equal to the number of first mold layers 170 of the first sacrificial gate stack SGS1, 2 to the power of n may be the number of first mold layers 170.

Figure 6:
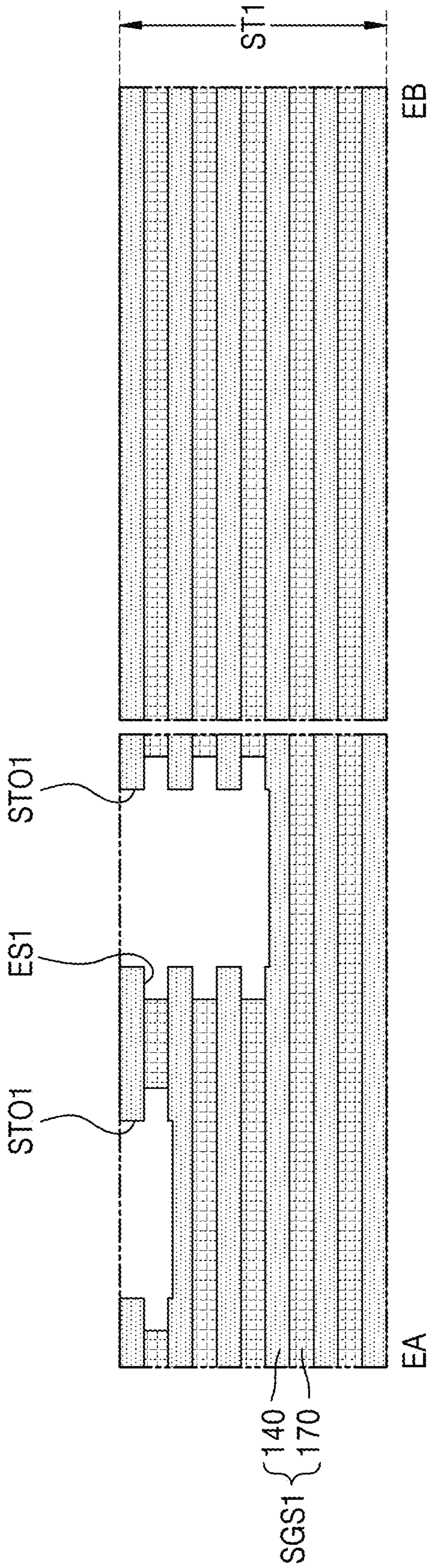

Referring to FIG. 6, first extension spaces ES1 are formed by selectively removing portions of the first mold layers 170 exposed by the plurality of first stack openings STO1. The first extension spaces ES1 may be formed with an isotropic etching process such as a wet etching process; however, example embodiments are not limited thereto. The first extension spaces ES1 may communicate with the plurality of first stack openings STO1. The first extension spaces ES1 may extend between two first insulating layers 140, which are adjacent to each other in the vertical direction, from the plurality of first stack openings STO1. For example, each of the first extension spaces ES1 may be formed between two first insulating layers 140 adjacent to each other in the vertical direction.

Figure 7:
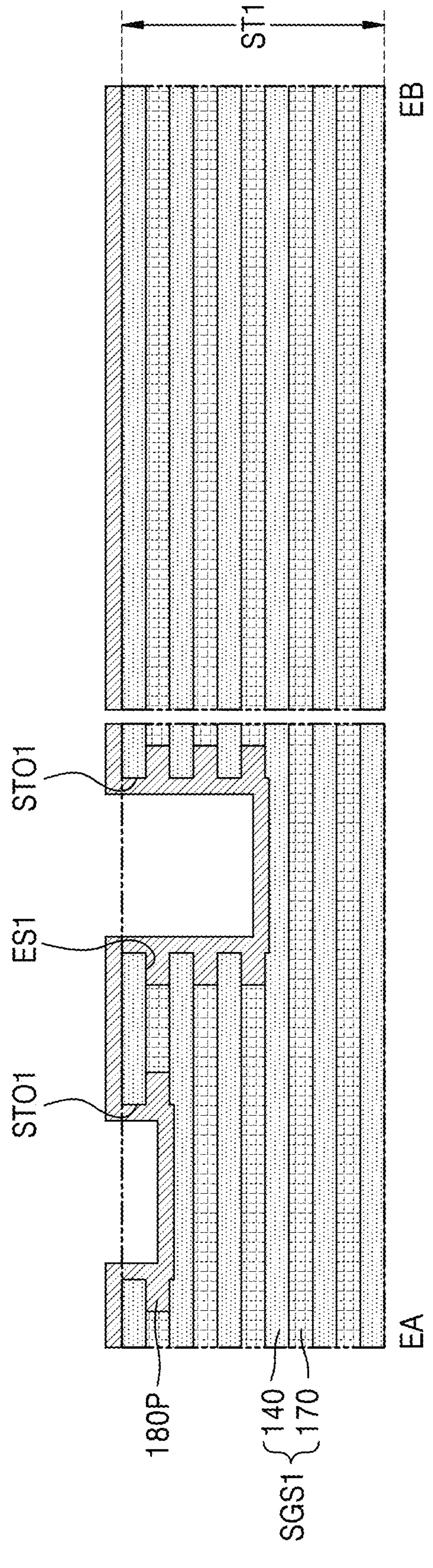

Referring to FIG. 7, a first preliminary spacer insulating layer 180P may be formed to fill the first extension spaces ES1 and cover inner surfaces of the plurality of first stack openings STO1 and the upper surface of the first sacrificial gate stack SGS1. The first preliminary spacer insulating layer 180P may fill the first extension spaces ES1 and may conformally cover the inner surfaces of the plurality of first stack openings STO1 and the upper surface of the first sacrificial gate stack SGS1. For example, the first preliminary spacer insulating layer 180P may be formed not to completely fill the plurality of first stack openings STO1. The first preliminary spacer insulating layer 180P may include an insulating material, such as silicon oxide or silicon oxynitride. The first preliminary spacer insulating layer 180P may be formed not to contact the first mold layer 170. In some example embodiments, the first preliminary spacer insulating layer 180P may include the same material, e.g. exactly the same or nearly exactly the same material, as the first mold layer 170. In some example embodiments, there may or may not be seams or voids in the portions of the first preliminary spacer insulating layer 180P that is within the first extension spaces ES1.

Figure 8:
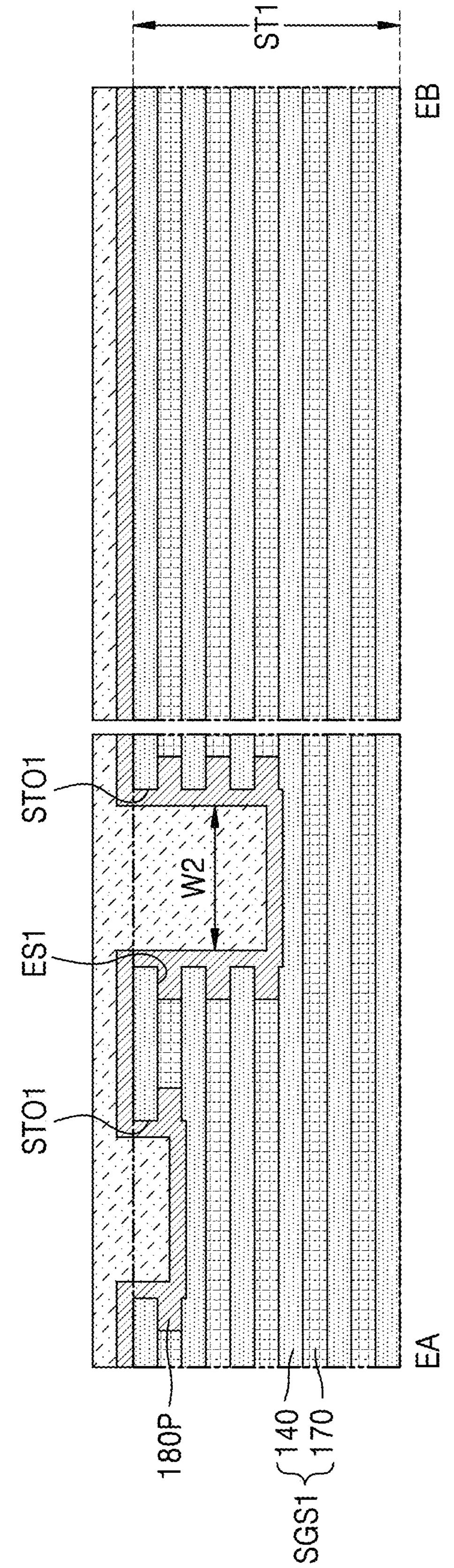

Referring to FIG. 8, a first preliminary sacrificial layer 190P is formed to fill the plurality of first stack openings STO1 and cover the upper surface of the first sacrificial gate stack SGS1. For example, the first preliminary sacrificial layer 190P may include silicon nitride, silicon oxynitride, polysilicon, or a combination thereof.

Figure 9:
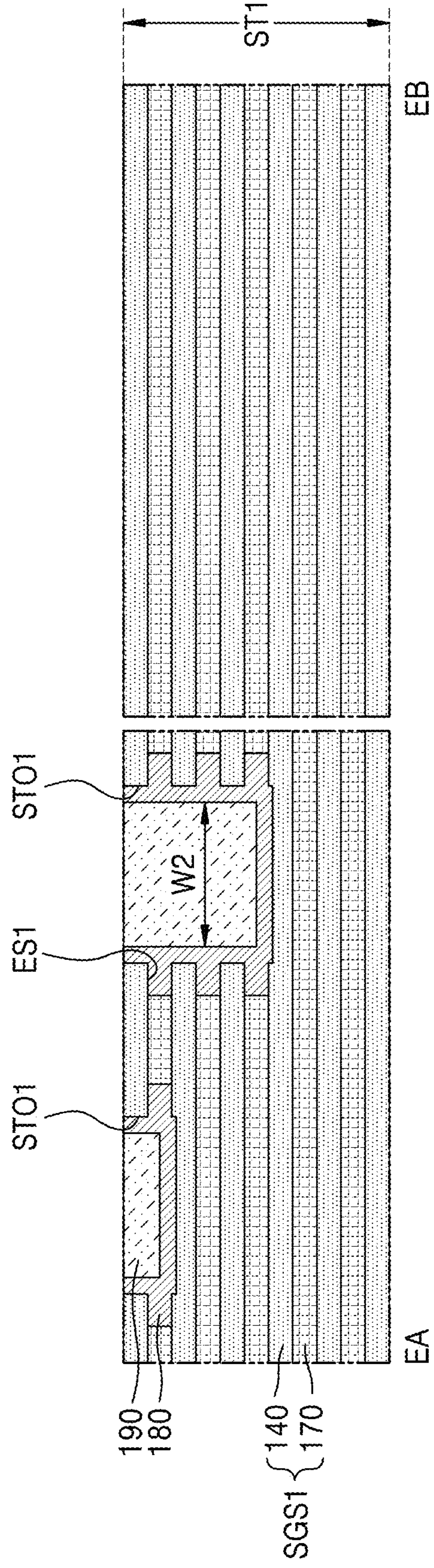

Referring together to FIGS. 8 and 9, a portion of the first preliminary sacrificial layer 190P and a portion of the first preliminary spacer insulating layer 180P are removed such that the upper surface of the first sacrificial gate stack SGS1 is exposed, thereby forming a plurality of first sacrificial layers 190 and a plurality of first spacer insulating layers 180. The plurality of first spacer insulating layers 180 may fill the first extension spaces ES1 between two first insulating layers 140, which are adjacent to each other in the vertical direction, and cover the inner surfaces, that is, inner side surfaces and bottom surfaces, of the plurality of first stack openings STO1. The plurality of first sacrificial layers 190 may completely fill spaces in the plurality of first stack openings STO1, respectively, the spaces being respectively defined by the plurality of first spacer insulating layers 180. For example, the plurality of first spacer insulating layers 180 and the plurality of first sacrificial layers 190 may be formed by removing the portion of the first preliminary sacrificial layer 190P and the portion of the first preliminary spacer insulating layer 180P through a chemical mechanical polishing (CMP) process and/or an etch-back process.

Each of the plurality of first sacrificial layers 190 may have a second horizontal width W2. The second horizontal width W2 may be less than the first horizontal width W1 (see FIG. 5B). For example, the second horizontal width W2 may be less than the first horizontal width W1 and may range from hundreds of nm to several μm.

Figure 10A:
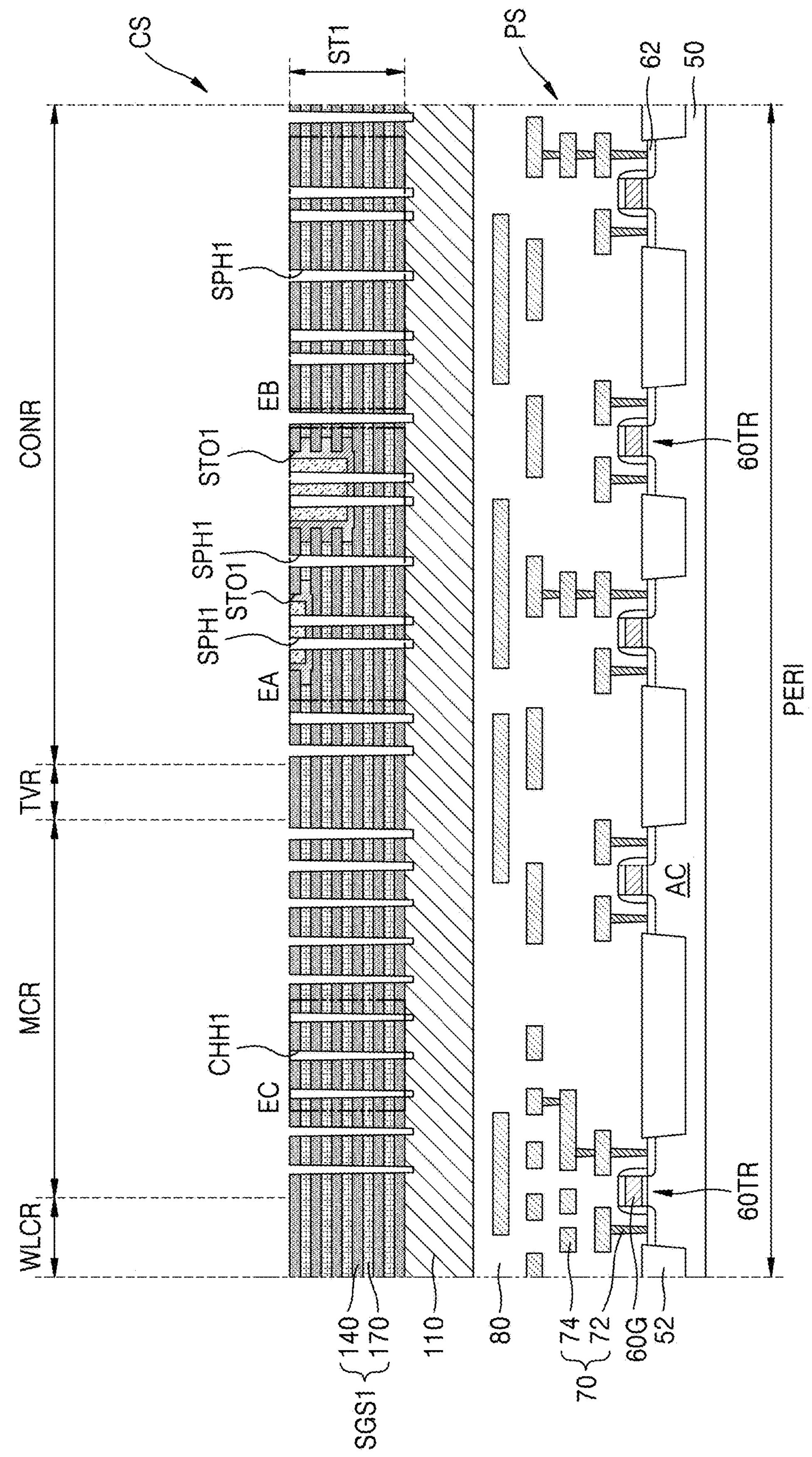
Figure 10B:
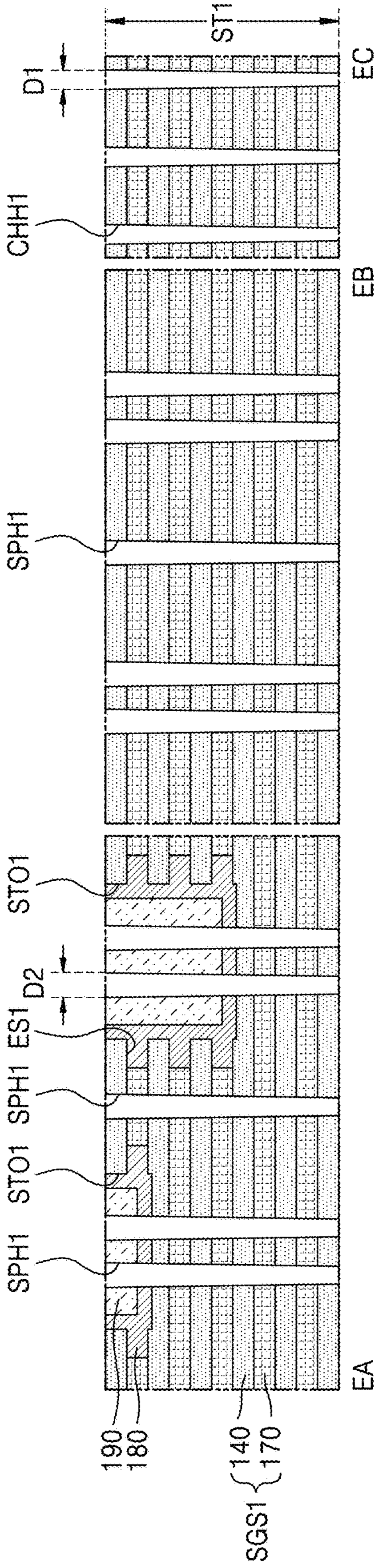
Figure 11:
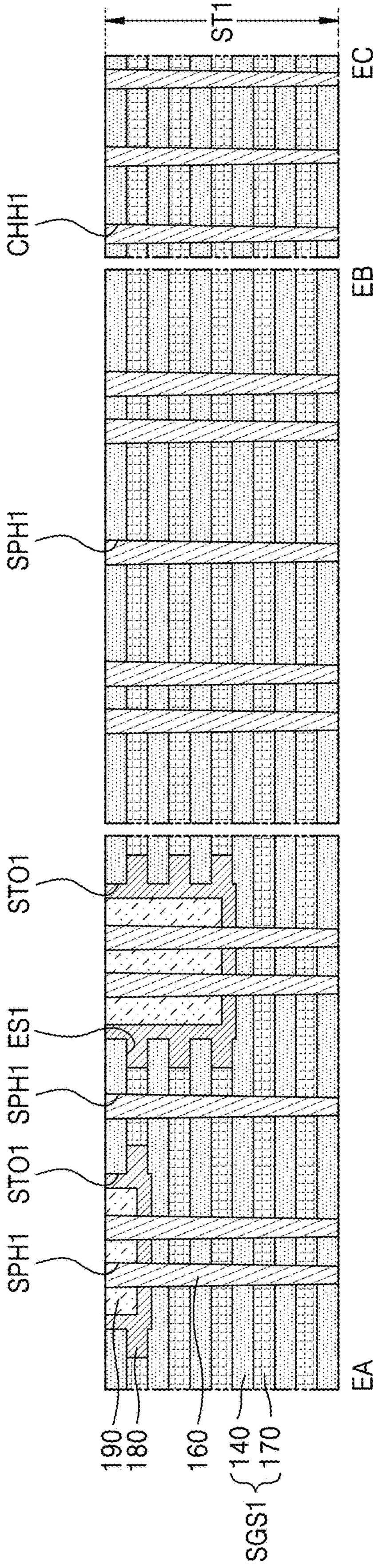

Referring together to FIGS. 10A and 10B, a plurality of first channel holes CHH1 and a plurality of first support holes SPH1 are formed through the first sacrificial gate stack SGS1. The plurality of first channel holes CHH1 may be formed in the memory cell area MCR to pass through all the plurality of first insulating layers 140 and the plurality of first mold layers 170 of the first sacrificial gate stack SGS1. In some example embodiments, the plurality of first channel holes CHH1 may pass through the first sacrificial gate stack SGS1 and extend to the inside of the base structure 110.

The plurality of first support holes SPH1 may be formed to completely pass through the first sacrificial gate stack SGS1. In some example embodiments, the plurality of first support holes SPH1 may pass through the first sacrificial gate stack SGS1 and extend to the inside of the base structure 110. The plurality of first support holes SPH1 may be formed in the connection area CONR, but example embodiments are not limited thereto. For example, at least some of the plurality of first support holes SPH1 may be arranged in the connection area CONR, and at least some others may be arranged in the through-electrode area TVR and/or the memory cell area MCR.

Some of the plurality of first support holes SPH1 may each be arranged in the connection area CONR to pass through the first sacrificial layer 190 and the first spacer insulating layer 180 and to pass through the first insulating layers 140 and the first mold layers 170 under the first sacrificial layer 190 and the first spacer insulating layer 180. Some others of the plurality of first support holes SPH1 may each be arranged in the connection area CONR, the through-electrode area TVR, and/or the memory cell area MCR to pass through all the plurality of first insulating layers 140 and the plurality of first mold layers 170 of the first sacrificial gate stack SGS1.

Each of the plurality of first channel holes CHH1 may have a first horizontal diameter D1 at least at an upper portion thereof, and each of the plurality of first support holes SPH1 may have a second horizontal diameter D2 at least at an upper portion thereof. The second horizontal diameter D2 may be equal to or greater than the first horizontal diameter D1. The second horizontal diameter D2 may be less than the second horizontal width W2 (see FIG. 9). In some example embodiments, at least two first support holes SPH1 may be arranged in each of the plurality of first stack openings STO1. For example, at least two first support holes SPH1 from among the plurality of first support holes SPH1 may pass through one of the plurality of first sacrificial layers 190. For example, the first horizontal diameter D1 may range from tens of nm to hundreds of nm, and the second horizontal diameter D2 may be equal to or greater than the first horizontal diameter D1 and may range from tens of nm to hundreds of nm. In some example embodiments, a horizontal cross-section of each of the plurality of first channel holes CHH1 and the plurality of first support holes SPH1 may have a circular shape or an elliptical shape.

In some example embodiments, each of the plurality of first channel holes CHH1 and the plurality of first support holes SPH1 may have a tapered shape, which extends from top to bottom toward the base structure 110 and has a horizontal width and a horizontal area that substantially decrease; however, example embodiments are not limited thereto, and at least one of the plurality of first channel holes CHH1 and/or at least one of the plurality of first support holes SPH1 may have a cylindrical shape.

Referring to FIG. 11, a plurality of first sacrificial filling layers 160 are formed to fill the plurality of first channel holes CHH1 and the plurality of first support holes SPH1, respectively. For example, a first sacrificial filling layer 160 may include a metal and/or a carbon-based film including carbon. The carbon-based film may include an amorphous carbon layer (ACL) and/or a carbon-based spin-on hardmask (C-SOH) film.

Figure 12A:
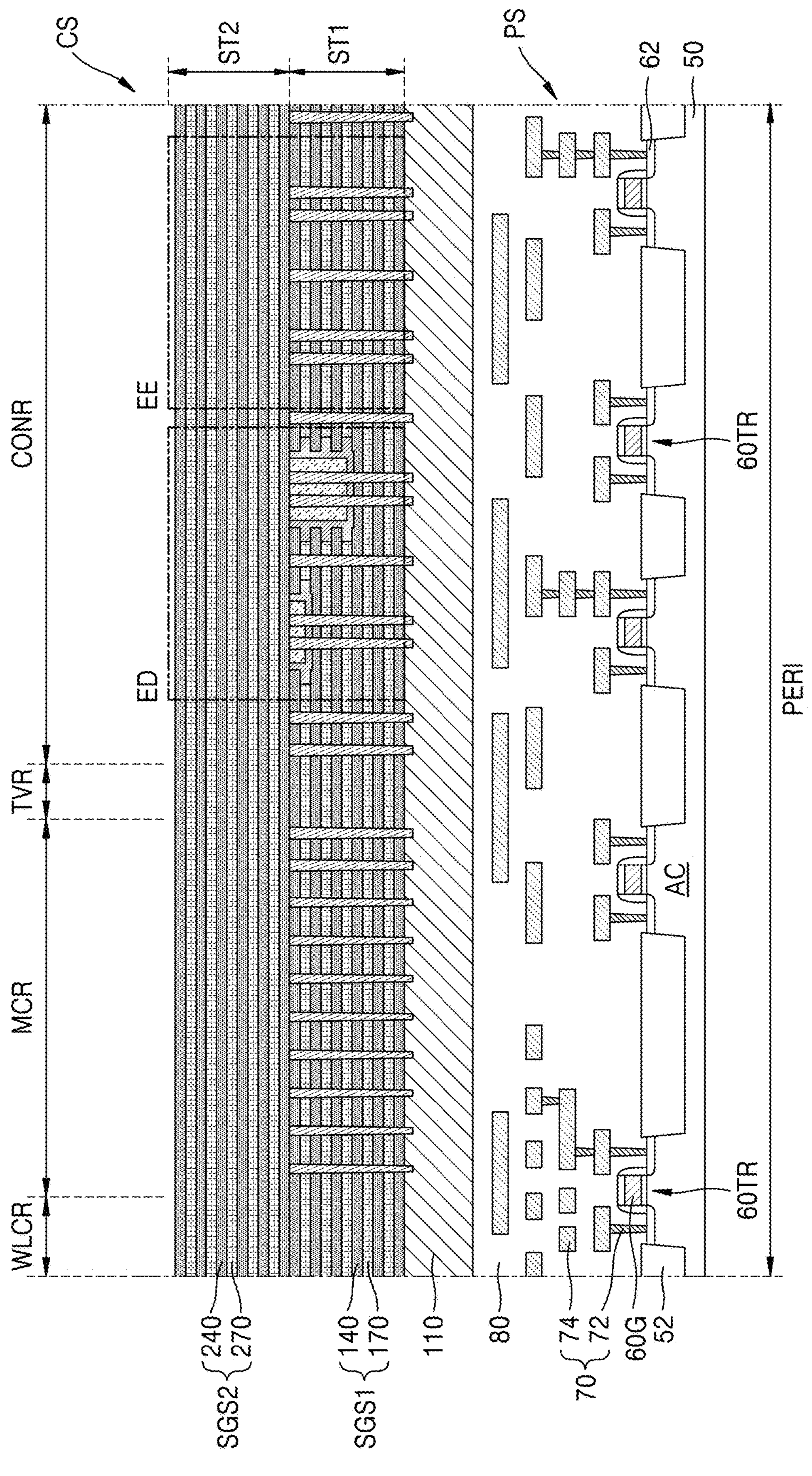
Figure 12B:
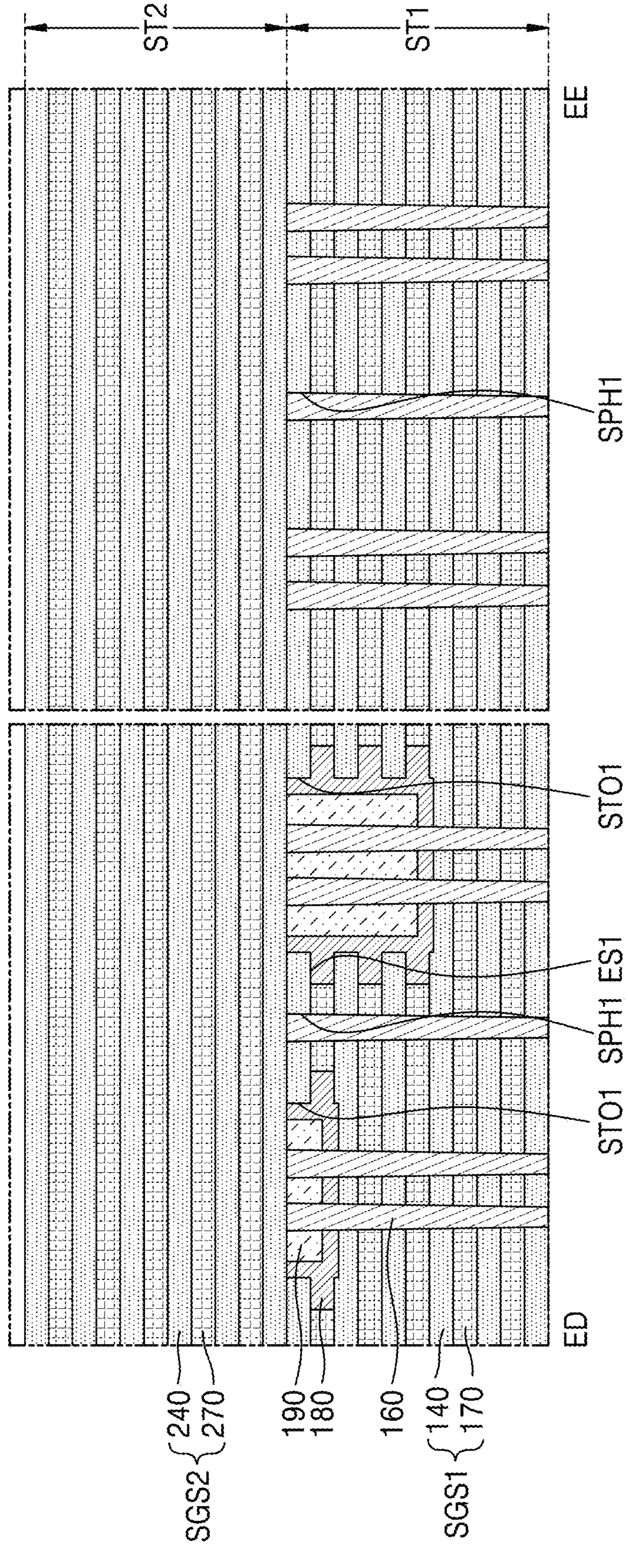

Referring together to FIGS. 12A and 12B, a second sacrificial gate stack SGS2 is formed on the first sacrificial gate stack SGS1. The second sacrificial gate stack SGS2 may correspond to a second stack ST2 from among the plurality of stacks of the cell array structure CS.

The second sacrificial gate stack SGS2 may be formed on the upper surface of the first sacrificial gate stack SGS1, uppermost surfaces of the plurality of first spacer insulating layers 180, upper surfaces of the plurality of first sacrificial layers 190, and upper surfaces of the plurality of first sacrificial filling layers 160. The second sacrificial gate stack SGS2 may be formed by alternately forming a plurality of second insulating layers 240 and a plurality of second mold layers 270 on the first sacrificial gate stack SGS1, e.g. with an ALD process. A second insulating layer 240 and a second mold layer 270 may be respectively formed of materials having etch selectivity to each other. For example, the plurality of second insulating layers 240 may each include an insulating material, such as silicon oxide or silicon oxynitride, and the plurality of second mold layers 270 may each include one or more of silicon nitride, silicon oxynitride, impurity-doped polysilicon, or the like. In some example embodiments, the second mold layer 270 may include the same material as the first mold layer 170, and the second insulating layer 240 may include the same material as the first insulating layer 140; however, example embodiments are not limited thereto. Additionally or alternatively, a number of layers in the second mold layer 270 may be the same as, greater than, or less than, a number of layers of the first mold layer 170.

Figure 13:
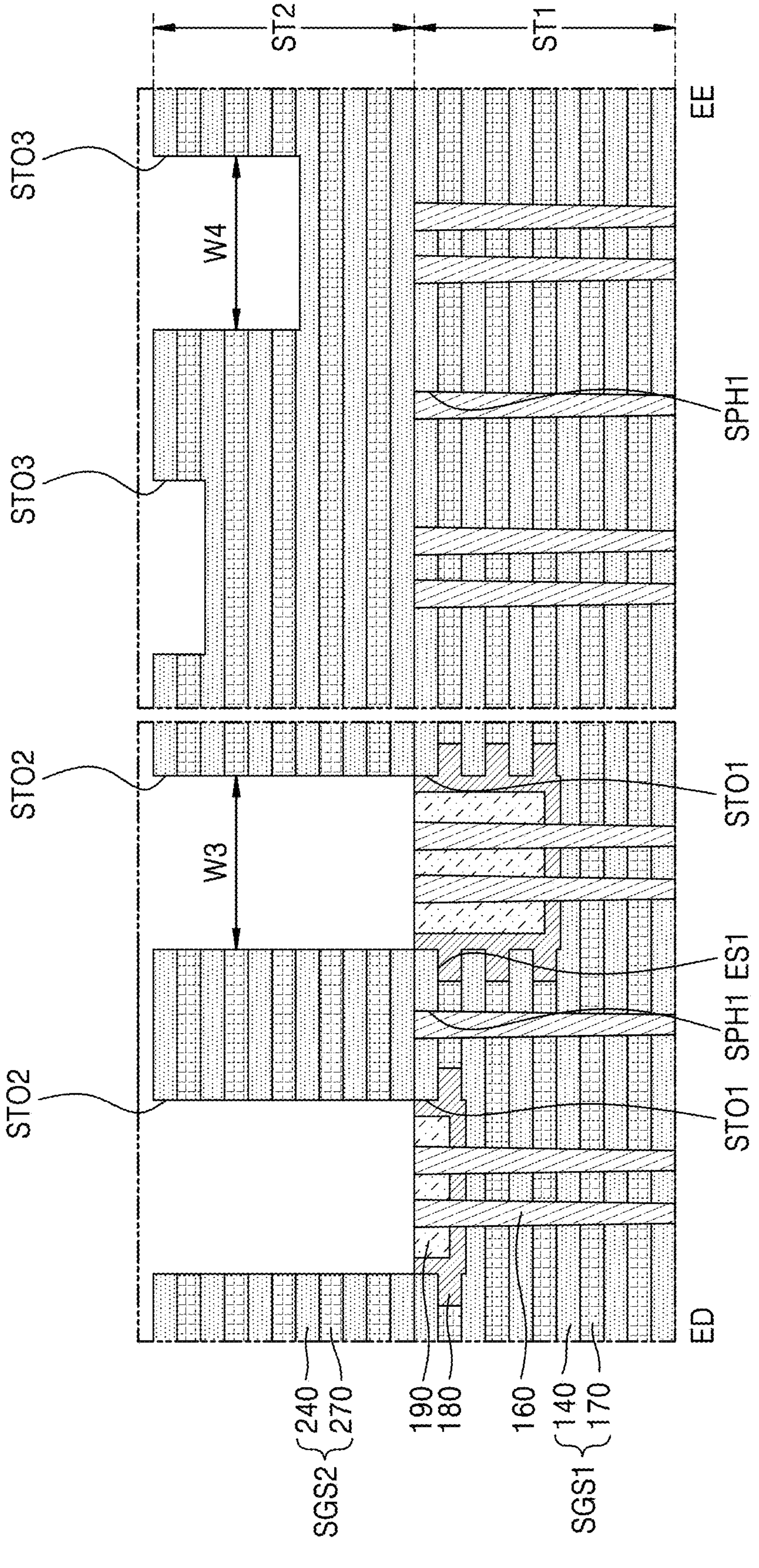

Referring to FIG. 13, in the connection area CONR, the second sacrificial gate stack SGS2 is partially removed, thereby forming a plurality of second stack openings STO2 and a plurality of third stack openings STO3.

The plurality of second stack openings STO2 may completely pass through the second sacrificial gate stack SGS2 from an upper surface to a lower surface of the second sacrificial gate stack SGS2 and thus may respectively communicate with the plurality of first stack openings STO1. For example, the first spacer insulating layer 180, the first sacrificial layer 190, and at least one first sacrificial filling layer 160, which fill each of the plurality of first stack openings STO1, may be exposed at a bottom surface of each of the plurality of second stack openings STO2. The plurality of second stack openings STO2 may be formed apart from each other. Each of the plurality of second stack openings STO2 may have a third horizontal width W3. For example, the third horizontal width W3 may range from hundreds of nanometers (nm) to several microns (μm). In some example embodiments, the third horizontal width W3 may be substantially equal to the first horizontal width W1 (see FIG. 5B). In some example embodiments, a horizontal cross-section of each of the plurality of second stack openings STO2 may have a polygonal or curved shape, such as a circle, an ellipse, a rectangle, or a corner-rounded or beveled rectangle. For example, the horizontal cross-section and the third horizontal width W3 of each of the plurality of second stack openings STO2 may be substantially equal to the horizontal cross-section and the first horizontal width W1 of each of the plurality of first stack openings STO1 communicating therewith, respectively. In some example embodiments, the plurality of second stack openings STO2 may overlap, in the vertical direction, the plurality of first stack openings STO1 communicating therewith, respectively. In some example embodiments, the number of second stack openings STO2 may be equal to the number of first stack openings STO1.

Each of the plurality of third stack openings STO3 may expose one of the plurality of second insulating layers 240 at a bottom surface thereof by partially removing the second sacrificial gate stack SGS2 from an upper surface of the second sacrificial gate stack SGS2. The plurality of third stack openings STO3 may be formed apart from each other. Each of the plurality of third stack openings STO3 may have a fourth horizontal width W4. For example, the fourth horizontal width W4 may range from hundreds of nm to several μm. In some example embodiments, a horizontal cross-section of each of the plurality of third stack openings STO3 may have a polygonal shape or curved shape, such as a circle, an ellipse, a rectangle, or a corner-rounded rectangle. For example, the horizontal cross-section and the fourth horizontal width W4 of each of the plurality of third stack openings STO3 may be substantially equal to the horizontal cross-section and the third horizontal width W3 of each of the plurality of second stack openings STO2, respectively.

In some example embodiments, a vertical level of the bottom surface of each of the plurality of third stack openings STO3 may be lower than (or below) a vertical level of an upper surface of the second insulating layer 240 exposed at the bottom surface of each of the plurality of third stack openings STO3. For example, each of the plurality of third stack openings STO3 may extend to the inside of the second insulating layer 240 exposed at the bottom surface of each of the plurality of third stack openings STO3 and may not pass through the second insulating layer 240 exposed at the bottom surface of each of the plurality of third stack openings STO3.

In some example embodiments, depths from the upper surface of the second sacrificial gate stack SGS2 to the respective bottom surfaces of the plurality of third stack openings STO3 may be different from each other. In some example embodiments, the plurality of third stack openings STO3 may include a plurality of second opening groups each including two or more third stack openings STO3 having the same depth, and depths from the upper surface of the second sacrificial gate stack SGS2 to respective bottom surfaces of the plurality of second opening groups may be different from each other.

The number of third stack openings STO3 may correspond to the number of second mold layers 270. For example, the number of third stack openings STO3 may be equal to the number of second mold layers 270 of the second sacrificial gate stack SGS2. Alternatively, for example, the number of third stack openings STO3 may be ½, ⅓, ¼, or the like of the number of second mold layers 270 of the second sacrificial gate stack SGS2 or may be somewhat greater than ½, ⅓, ¼, or the like thereof. For example, the number of third stack openings STO3 may be a multiple of the number of second mold layers 270 of the second sacrificial gate stack SGS2 or may be somewhat greater than the multiple thereof.

In some example embodiments, the plurality of third stack openings STO3 may be formed by performing m etching processes for removing portions of the second sacrificial gate stack SGS2. For example, when the number of third stack openings STO3 is equal to the number of second mold layers 270 of the second sacrificial gate stack SGS2, 2 to the power of m may be the number of second mold layers 270.

The plurality of second stack openings STO2 may be formed in the connection area CONR to respectively pass through portions of the second sacrificial gate stack SGS2, which overlap the plurality of first stack openings STO1 in the vertical direction, and the plurality of third stack openings STO3 may be formed in the connection area CONR to respectively and partially penetrate portions of the second sacrificial gate stack SGS2, which do not overlap the plurality of first stack openings STO1 in the vertical direction.

Figure 14:
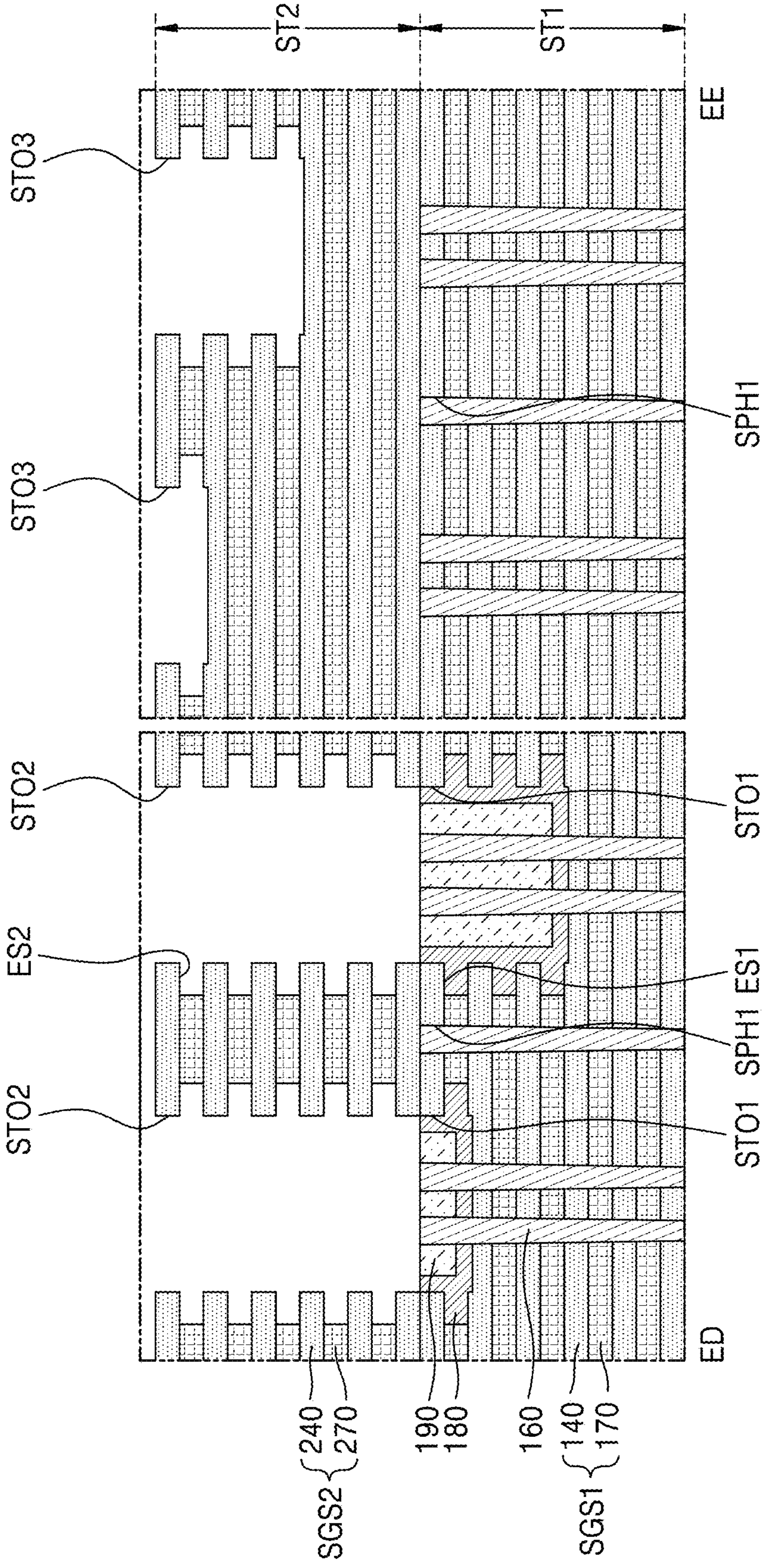

Referring to FIG. 14, second extension spaces ES2 are formed by selectively removing portions of the second mold layers 270 exposed by the plurality of second stack openings STO2 and the plurality of third stack openings STO3. The second extension spaces ES2 may be formed with an isotropic etching process, such as with a wet etching process; however, example embodiments are not limited thereto. The second extension spaces ES2 may communicate with the plurality of second stack openings STO2 and the plurality of third stack openings STO3, respectively. The second extension spaces ES2 may extend between two second insulating layers 240, which are adjacent to each other in the vertical direction, from the plurality of second stack openings STO2 and the plurality of third stack openings STO3, respectively. That is, each of the second extension spaces ES2 may be formed between two second insulating layers 240 adjacent to each other in the vertical direction.

Figure 15:
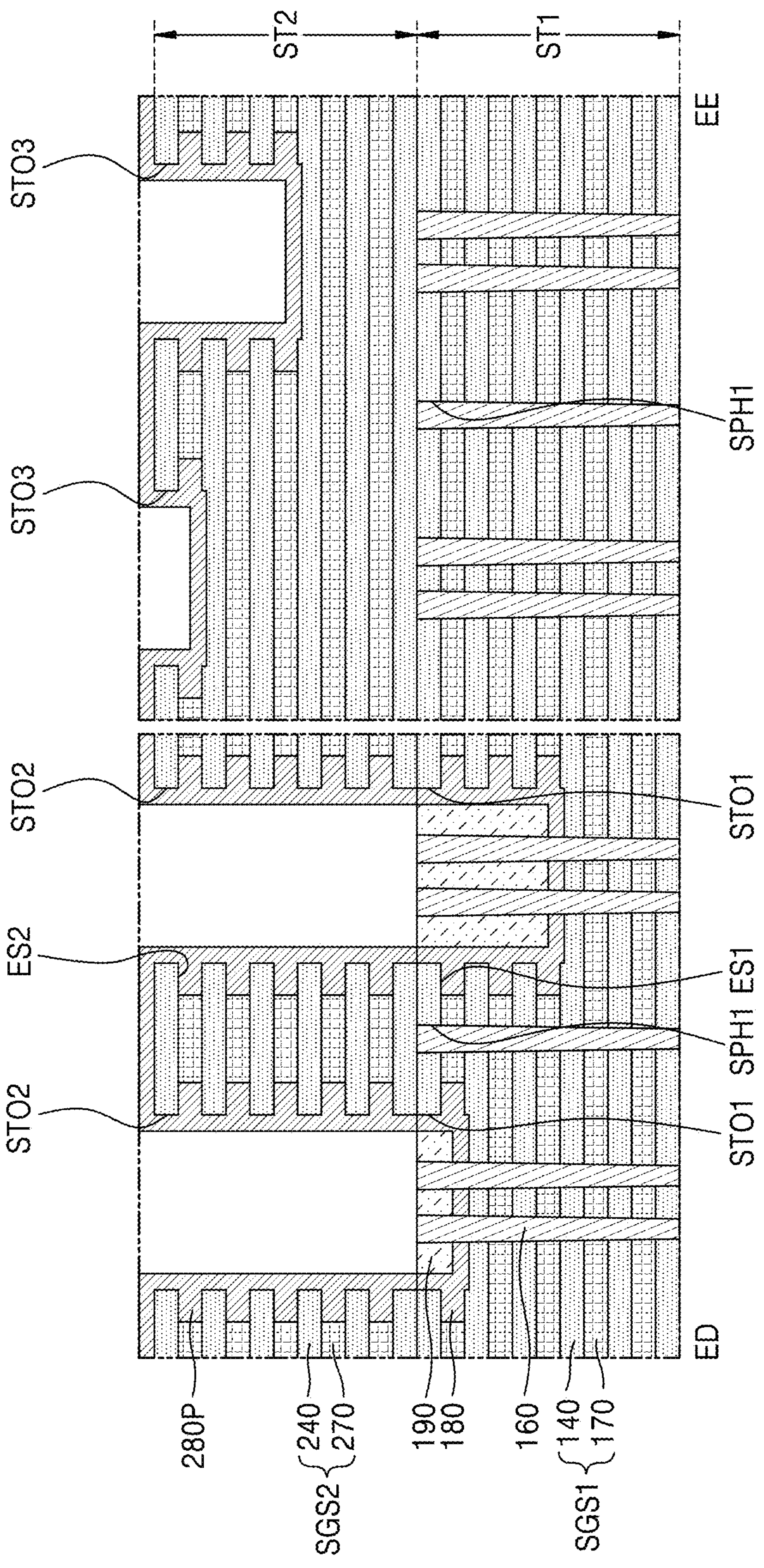

Referring to FIG. 15, a second preliminary spacer insulating layer 280P may be formed to fill the second extension spaces ES2 and cover inner surfaces of the plurality of second stack openings STO2, inner surfaces of the plurality of third stack openings STO3, and the upper surface of the second sacrificial gate stack SGS2. The second preliminary spacer insulating layer 280P may fill the second extension spaces ES2 and conformally cover the inner surfaces of the plurality of second stack openings STO2, the inner surfaces of the plurality of third stack openings STO3, and the upper surface of the second sacrificial gate stack SGS2. For example, the second preliminary spacer insulating layer 280P may be formed not to completely fill the plurality of second stack openings STO2 and the plurality of third stack openings STO3. The second preliminary spacer insulating layer 280P may include an insulating material, such as silicon oxide and/or silicon oxynitride. In some example embodiments, the second preliminary spacer insulating layer 280P may include the same material as the first spacer insulating layer 180 or may be formed of a material having etching characteristics similar to those of the first spacer insulating layer 180. The second preliminary spacer insulating layer 280P may be formed not to contact the second mold layer 270. In some example embodiments, the second preliminary spacer insulating layer 280P may include the same material as the second mold layer 270. There may or may not be seams or voids in the second preliminary spacer insulating layer 280P in the portions of the second extension spaces ES2.

Figure 16:
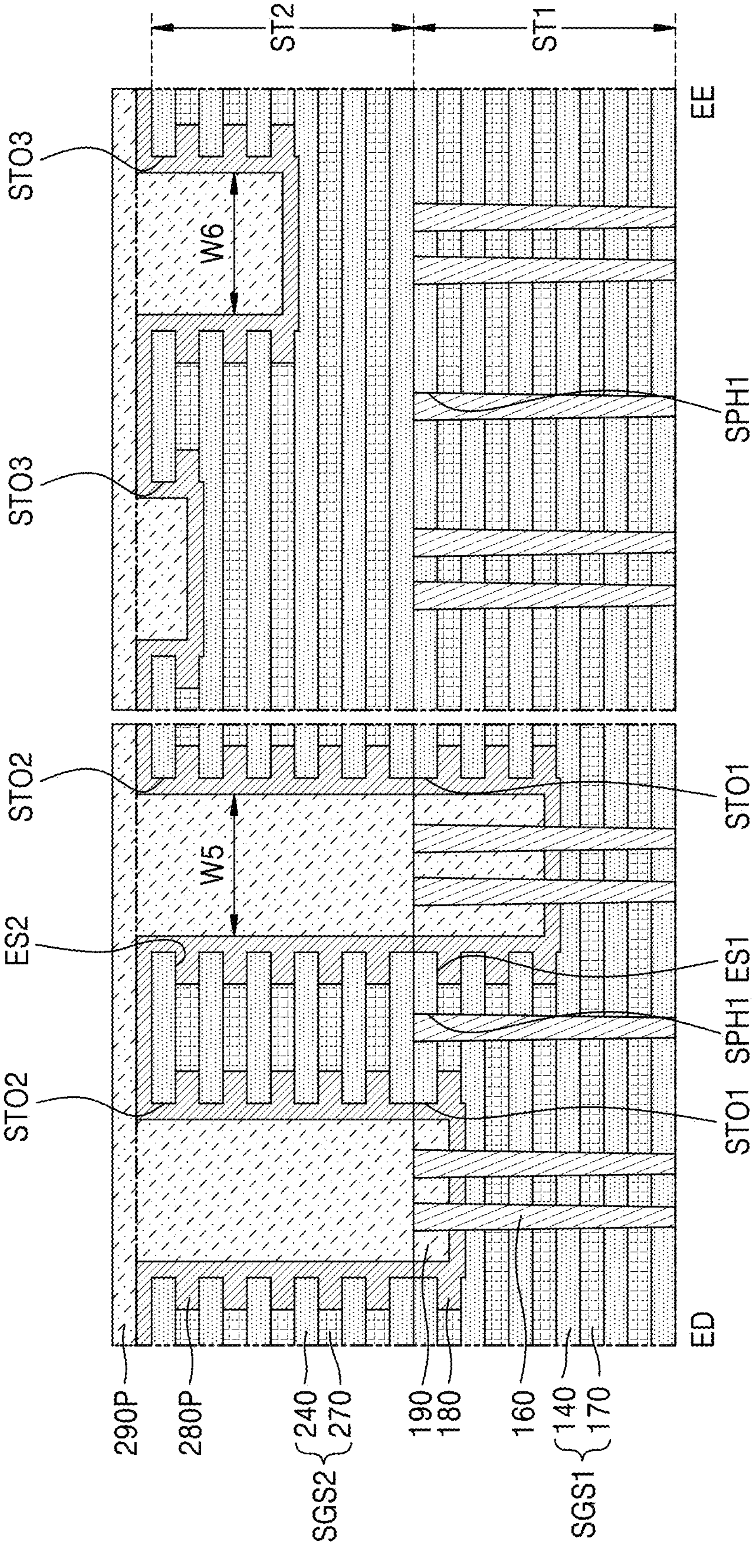

Referring to FIG. 16, a second preliminary sacrificial layer 290P may be formed to fill the plurality of second stack openings STO2 and the plurality of third stack openings STO3 and cover the upper surface of the second sacrificial gate stack SGS2. For example, the second preliminary sacrificial layer 290P may include silicon nitride, silicon oxynitride, polysilicon, or a combination thereof. In some example embodiments, the second preliminary sacrificial layer 290P may include the same material as the first sacrificial layer 190 or may be formed of a material having etching characteristics similar to those of the first sacrificial layer 190.

Figure 17:
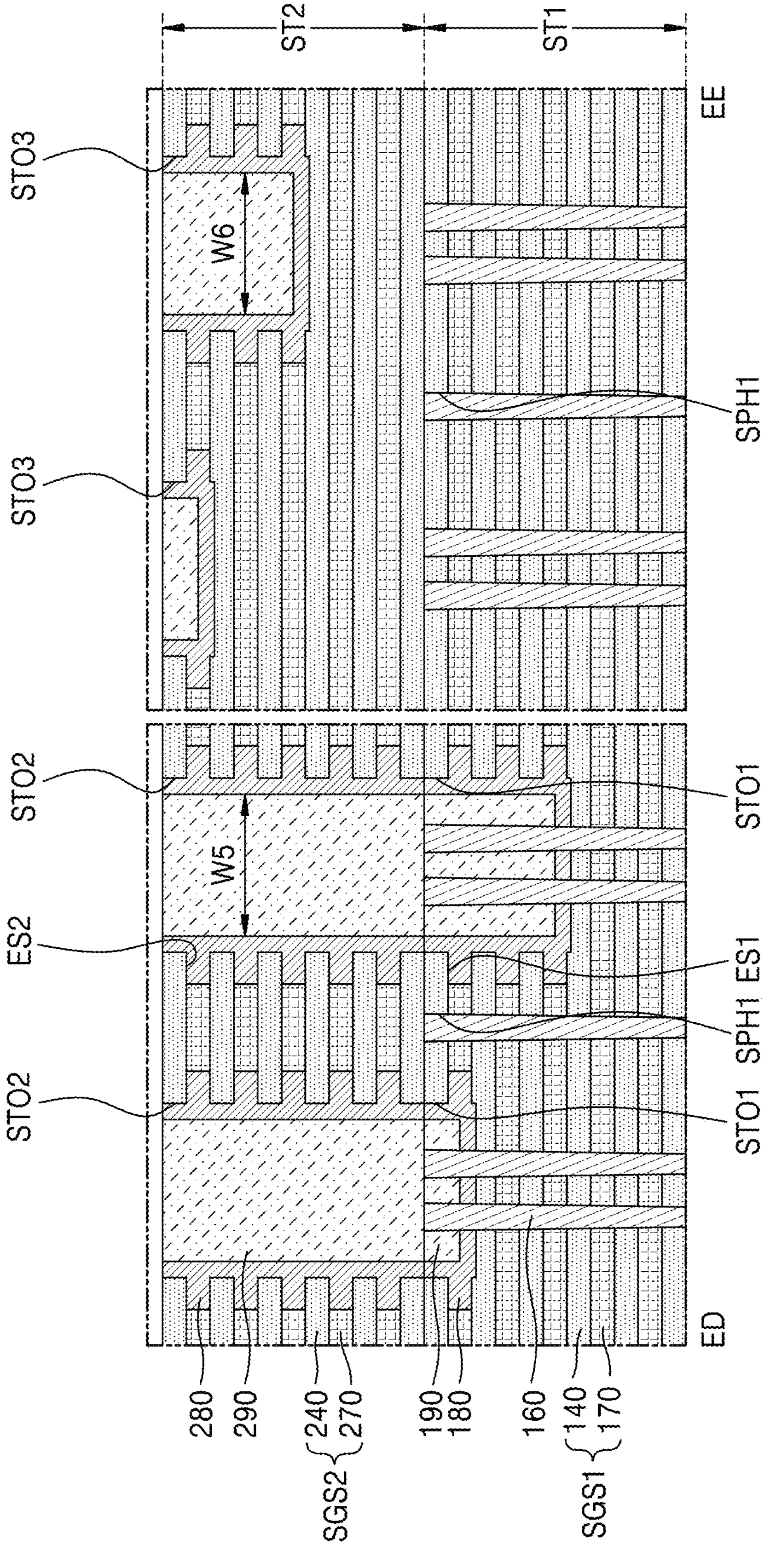

Referring together to FIGS. 16 and 17, a portion of the second preliminary sacrificial layer 290P and a portion of the second preliminary spacer insulating layer 280P are removed such that the upper surface of the second sacrificial gate stack SGS2 is exposed, thereby forming a plurality of second sacrificial layers 290 and a plurality of second spacer insulating layers 280. The plurality of second spacer insulating layers 280 may fill the second extension spaces ES2 between two second insulating layers 240, which are adjacent to each other in the vertical direction, and may cover the inner surfaces of the plurality of second stack openings STO2 and the inner surfaces of the plurality of third stack openings STO3. The plurality of second sacrificial layers 290 may fill all spaces in the plurality of second stack openings STO2 and the plurality of third stack openings STO3, respectively, the spaces in the plurality of second stack openings STO2 and the plurality of third stack openings STO3 being respectively defined by the plurality of second spacer insulating layers 280. For example, the plurality of second spacer insulating layers 280 and the plurality of second sacrificial layers 290 may be formed by removing the portion of the second preliminary sacrificial layer 290P and the portion of the second preliminary spacer insulating layer 280P through a CMP process and/or an etch-back process.

Each of the plurality of second sacrificial layers 290 may have a fifth horizontal width W5. The fifth horizontal width W5 may be less than the third horizontal width W3 (see FIG. 13). The fifth horizontal width W5 may be substantially equal to the second horizontal width W2 (see FIG. 9).

Figure 18A:
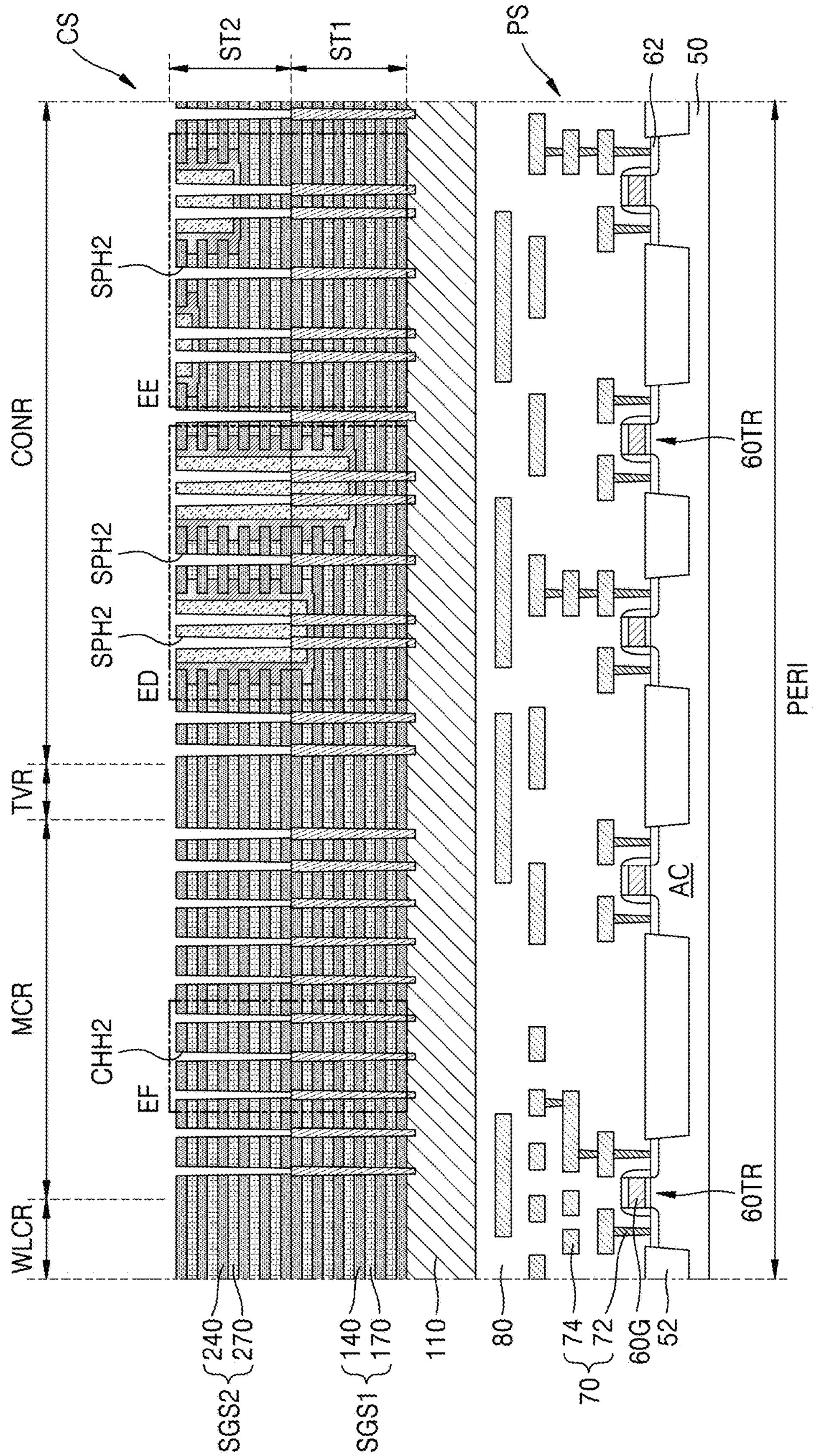
Figure 18B:
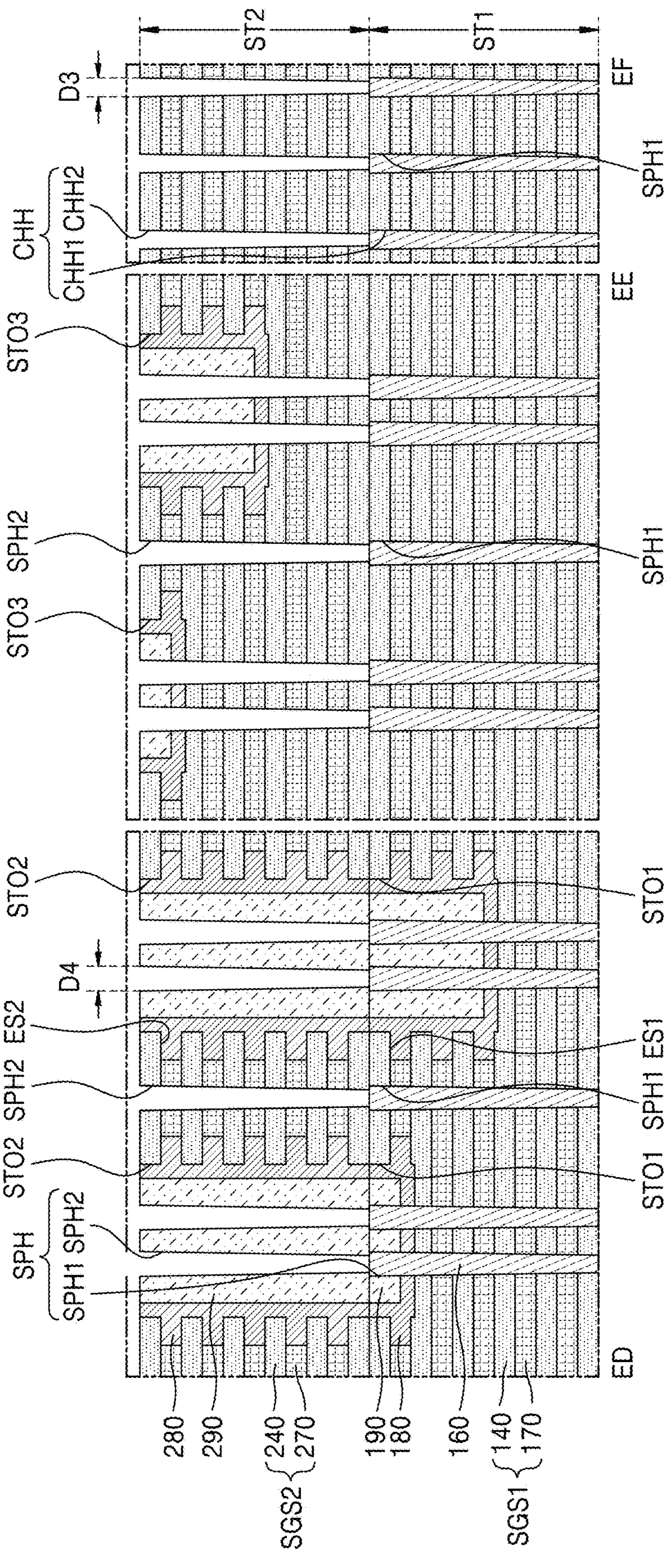

Referring together to FIGS. 18A and 18B, a plurality of second channel holes CHH2 and a plurality of second support holes SPH2 are formed through the second sacrificial gate stack SGS2. The plurality of second channel holes CHH2 may be formed to pass through all the plurality of second insulating layers 240 and the plurality of second mold layers 270 of the second sacrificial gate stack SGS2. The plurality of second channel holes CHH2 may communicate with the plurality of first channel holes CHH1 corresponding thereto, respectively.

The plurality of second support holes SPH2 may communicate with the plurality of first support holes SPH1 corresponding thereto, respectively. The plurality of second support holes SPH2 may be formed in the connection area CONR, but example embodiments are not limited thereto. For example, some of the plurality of second support holes SPH2 may be arranged in the connection area CONR, and some others may be arranged in the through-electrode area TVR and/or the memory cell area MCR.

Some of the plurality of second support holes SPH2 may each be arranged in the connection area CONR to pass through the second sacrificial layer 290 arranged in a second stack opening STO2. Some others of the plurality of second support holes SPH2 may each be arranged in the connection area CONR to pass through the second sacrificial layer 290 and the second spacer insulating layer 280 in a third stack opening STO3 and pass through the second insulating layers 240 and the second mold layers 270 under the second sacrificial layer 290 and the second spacer insulating layer 280. Still further at least some others of the plurality of second support holes SPH2 may each be arranged in the connection area CONR, the through-electrode area TVR, and/or the memory cell area MCR to pass through all the plurality of second insulating layers 240 and the plurality of second mold layers 270 of the second sacrificial gate stack SGS2.

Each of the plurality of second channel holes CHH2 may have a third horizontal diameter D3, e.g., at an upper portion thereof, and each of the plurality of second support holes SPH2 may have a fourth horizontal diameter D4, e.g., at an upper portion thereof. The fourth horizontal diameter D4 may be equal to or greater than the third horizontal diameter D3. The fourth horizontal diameter D4 may be less than the second horizontal width W2 (see FIG. 9). The third horizontal diameter D3 may be equal to or greater than the first horizontal diameter D1 (see FIG. 10B), and the fourth horizontal diameter D4 may be equal to or greater than the second horizontal diameter D2 (see FIG. 10B). In some example embodiments, a horizontal cross-section of each of the plurality of second channel holes CHH2 and the plurality of second support holes SPH2 may have a circular shape or an elliptical shape. In some example embodiments, at least two second support holes SPH2 may be arranged in each of the plurality of second stack openings STO2 and the plurality of third stack openings STO3.

In some example embodiments, each of the plurality of second channel holes CHH2 and the plurality of second support holes SPH2 may have a tapered shape, which extends from top to bottom toward the base structure 110 and has a horizontal width and a horizontal area that substantially decrease; however, example embodiments are not limited thereto.

Referring to FIG. 19, a plurality of second sacrificial filling layers 260 are formed to fill the plurality of second channel holes CHH2 and the plurality of second support holes SPH2, respectively, e.g., with a process such as a chemical vapor deposition (CVD) process. For example, a second sacrificial filling layer 260 may include a metal and/or a carbon-based film including carbon. The second sacrificial filling layer 260 may include the same material as the first sacrificial filling layer 160 or may be formed of a material having etching characteristics similar to those of the first sacrificial filling layer 160.

Referring together to FIGS. 19 and 20, a preliminary cover insulating layer 310, which has a plurality of through-openings 310O, is formed to cover the second sacrificial gate stack SGS2. The plurality of through-openings 310O may be formed to correspond to the plurality of second channel holes CHH2 and the plurality of second support holes SPH2, respectively. For example, some of the plurality of through-openings 310O may communicate with the plurality of second channel holes CHH2 corresponding thereto, respectively, and some other through-openings 310O may communicate with the plurality of second support holes SPH2 corresponding thereto, respectively. The plurality of second sacrificial filling layers 260 may be exposed at bottom surfaces of the plurality of through-openings 310O, respectively.

After the preliminary cover insulating layer 310 having the plurality of through-openings 310O is formed, the plurality of second sacrificial filling layers 260, which respectively fill the plurality of second channel holes CHH2 and the plurality of second support holes SPH2, and the plurality of first sacrificial filling layers 160, which respectively fill the plurality of first channel holes CHH1 and the plurality of first support holes SPH1, are removed, e.g., with a dry etching process, through the plurality of through-openings 310O. The first channel hole CHH1 and the second channel hole CHH2, which communicate with each other, may be collectively referred to as a channel hole CHH, and the first support hole SPH1 and the second support hole SPH2, which communicate with each other, may be collectively referred to as a support hole SPH.

Next, a plurality of channel structures 360, which respectively fill a plurality of channel holes CHH, and a plurality of dummy structures 360D, which respectively fill a plurality of support holes SPH, are formed. Each of the plurality of dummy structures 360D may be referred to as a support structure. In some example embodiments, none of the plurality of dummy structures 360D are connected and/or are electrically active during operation of the semiconductor device.

In some example embodiments, each of the plurality of channel structures 360 may have a substantially similar structure to each of the plurality of dummy structures 360D. For example, as shown in FIG. 28C, each of the plurality of channel structures 360 include a gate insulating layer 362, a channel layer 364, a buried insulating layer 366, and a conductive plug 368. The gate insulating layer 362 and the channel layer 364 may be arranged in the stated order on an inner side surface of the channel hole CHH. For example, the gate insulating layer 362 may be conformally arranged on the inner side surface of the channel hole CHH, and the channel layer 364 may cover the gate insulating layer 362 and be conformally arranged on the inner side surface and a bottom surface of the channel hole CHH. The buried insulating layer 366 may be arranged on the channel layer 364 to fill the remaining space of the channel hole CHH. The conductive plug 368 may be arranged in an upper portion of the channel hole CHH to contact the channel layer 364 and plug an entrance of the channel hole CHH, for example, an upper end of the second channel hole CHH2. In some example embodiments, the buried insulating layer 366 may be omitted, and the channel layer 364 may be formed in a pillar shape that fills the remaining portion of the channel hole CHH. In addition, each of the plurality of dummy structures 360D may also include the gate insulating layer 362, the channel layer 364, the buried insulating layer 366, and the conductive plug 368.

In some example embodiments, the plurality of channel structures 360 and the plurality of dummy structures 360D may have different structures from each other. For example, each of the plurality of channel structures 360 may include the gate insulating layer 362, the channel layer 364, the buried insulating layer 366, and the conductive plug 368, and each of the plurality of dummy structures 360D may include (or consist of) a single film. In some example embodiments, each of the plurality of dummy structures 360D may include silicon oxide.

The plurality of channel structures 360 and the plurality of dummy structures 360D may have substantially similar shapes to each other. As shown in FIG. 28C, each of the plurality of channel structures 360 may have a shape protruding laterally outwards in a boundary region between the first channel hole CHH1 and the second channel hole CHH2, and similar to each of the plurality of channel structures 360, each of the plurality of dummy structures 360D may also have a shape protruding laterally outwards in a boundary region between the first support hole SPH1 and the second support hole SPH2.

Figure 21A:
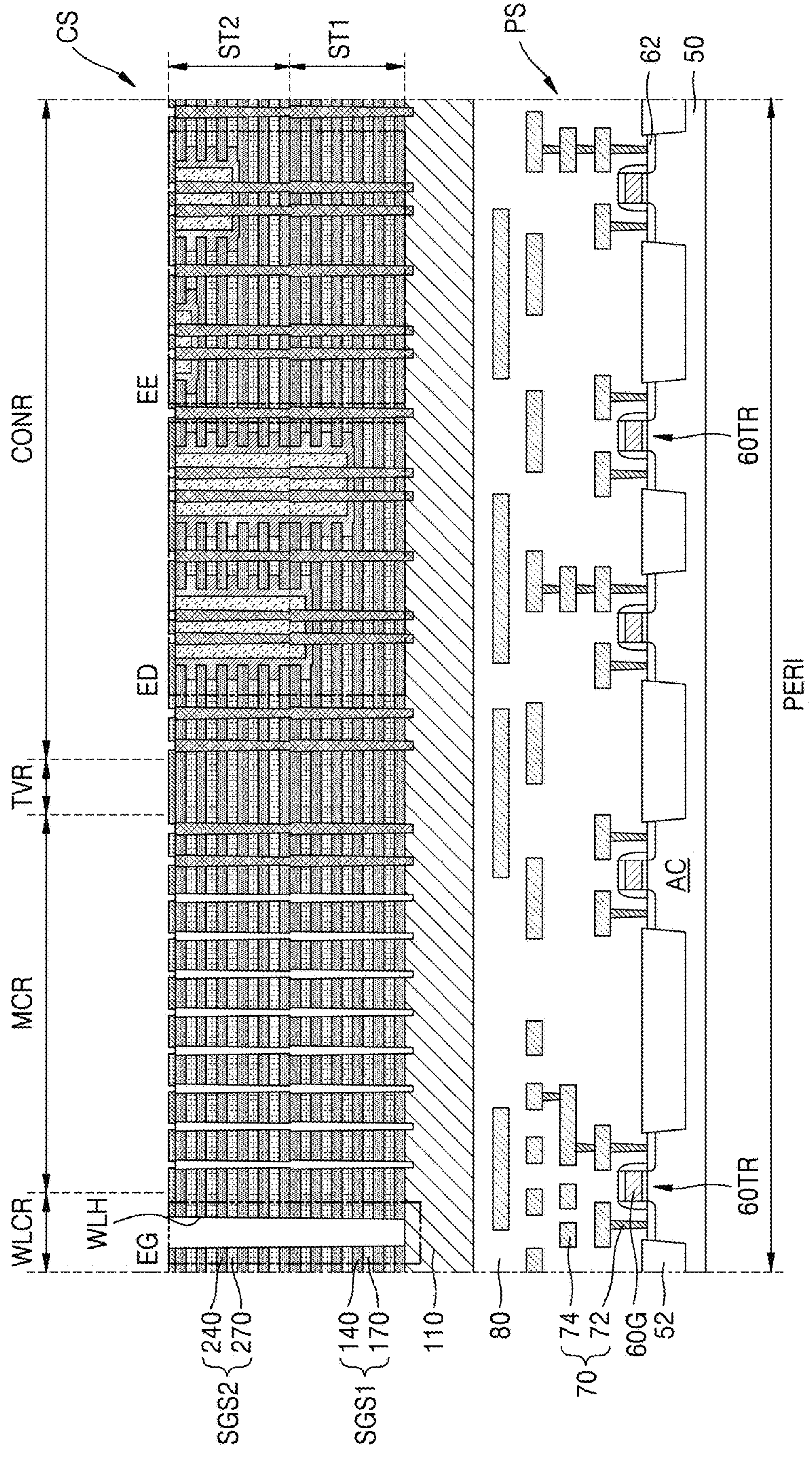
Figure 21B:
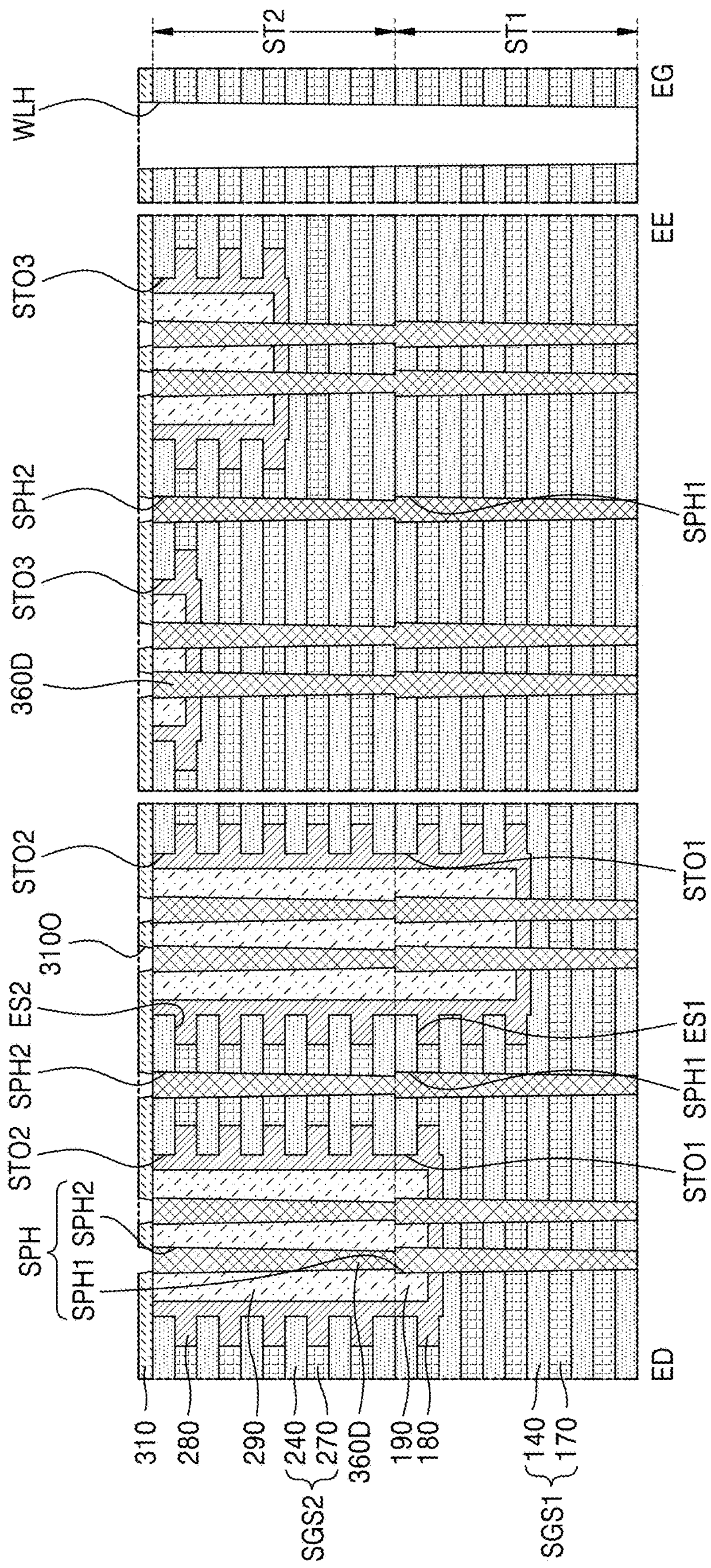

Referring together to FIGS. 21A and 21B, in the word line cut area WLCR, a gate stack separation opening WLH is formed through the preliminary cover insulating layer 310, the second sacrificial gate stack SGS2, and the first sacrificial gate stack SGS1 to expose the base structure 110 at a bottom surface thereof. The gate stack separation opening WLH may extend along a region between the plurality of memory cell blocks BLK1, BLK2, . . . , and BLKn (see FIG. 2), and thus, each of the plurality of memory cell blocks BLK1, BLK2, . . . , and BLKn may be surrounded by the gate stack separation opening WLH. Although FIG. 21A illustrates that the gate stack separation opening WLH is located on one side of the memory cell area MCR, this is only an example, and the gate stack separation opening WLH may be arranged to surround the memory cell area MCR, the connection area CONR, and the through-electrode area TVR.

Referring together to FIGS. 21A, 21B, and 22, the plurality of first mold layers 170 and the plurality of second mold layers 270 are removed through the gate stack separation opening WLH, thereby forming a plurality of first removal spaces RS1 and a plurality of second removal spaces RS2. Each of the plurality of first removal spaces RS1 may be defined between two first insulating layers 140 adjacent to each other in the vertical direction from among the plurality of first insulating layers 140, and each of the plurality of second removal spaces RS2 may be defined between two second insulating layers 240 adjacent to each other in the vertical direction from among the plurality of second insulating layers 240. For example, the plurality of first mold layers 170 and the plurality of second mold layers 270 may be removed by performing an isotropic etching process such as a wet etching process using a phosphoric acid solution as an etchant.

Referring together to FIGS. 22 and 23, a conductive material may fill the plurality of first removal spaces RS1 and the plurality of second removal spaces RS2, thereby forming a plurality of first gate electrodes 130, which respectively fill the plurality of first removal spaces RS1, and a plurality of second gate electrodes 230, which respectively fill the plurality of second removal spaces RS2. The conductive material may be deposited with a process such as a CVD process; however, example embodiments are not limited thereto. For example, the plurality of first gate electrodes 130 and the plurality of second gate electrodes 230 may each include a metal, such as one or more of tungsten, nickel, cobalt, or tantalum, a metal silicide, such as tungsten silicide, nickel silicide, cobalt silicide, or tantalum silicide, doped polysilicon, or a combination thereof.

A first gate stack GS1 may be arranged on the base structure 110, and a second gate stack GS2 may be arranged on the first gate stack GS1. The first gate stack GS1 may include the plurality of first gate electrodes 130 and the plurality of first insulating layers 140, which are alternately arranged, and the second gate stack GS2 may include the plurality of second gate electrodes 230 and the plurality of second insulating layers 240, which are alternately arranged. The first gate stack GS1 and the second gate stack GS2 may be collectively referred to as a gate stack. Alternatively or additionally, the plurality of first gate electrodes 130 and the plurality of second gate electrodes 230 may be collectively referred to as a plurality of gate electrodes, and the plurality of first insulating layers 140 and the plurality of second insulating layers 240 may be collectively referred to as a plurality of insulating layers. The gate stack may be arranged on the base structure 110, and the plurality of gate electrodes may be arranged apart from each other in the vertical direction. The gate stack may include the plurality of gate electrodes and the plurality of insulating layers, which are alternately arranged.

After the plurality of first gate electrodes 130 and the plurality of second gate electrodes 230 are formed, a gate stack separation insulating layer 150 may be formed by filling the gate stack separation opening WLH with an insulating material.

Next, an insulating material layer is formed to fill the plurality of through-openings 310O and to cover the preliminary cover insulating layer 310, and a to cover insulating layer 320, which includes the preliminary cover insulating layer 310 and the insulating material layer, is formed. In some example embodiments, the insulating material layer may include the same material as the preliminary cover insulating layer 310 or may be formed of a material having etching characteristics similar to those of the preliminary cover insulating layer 310.

Figure 24:
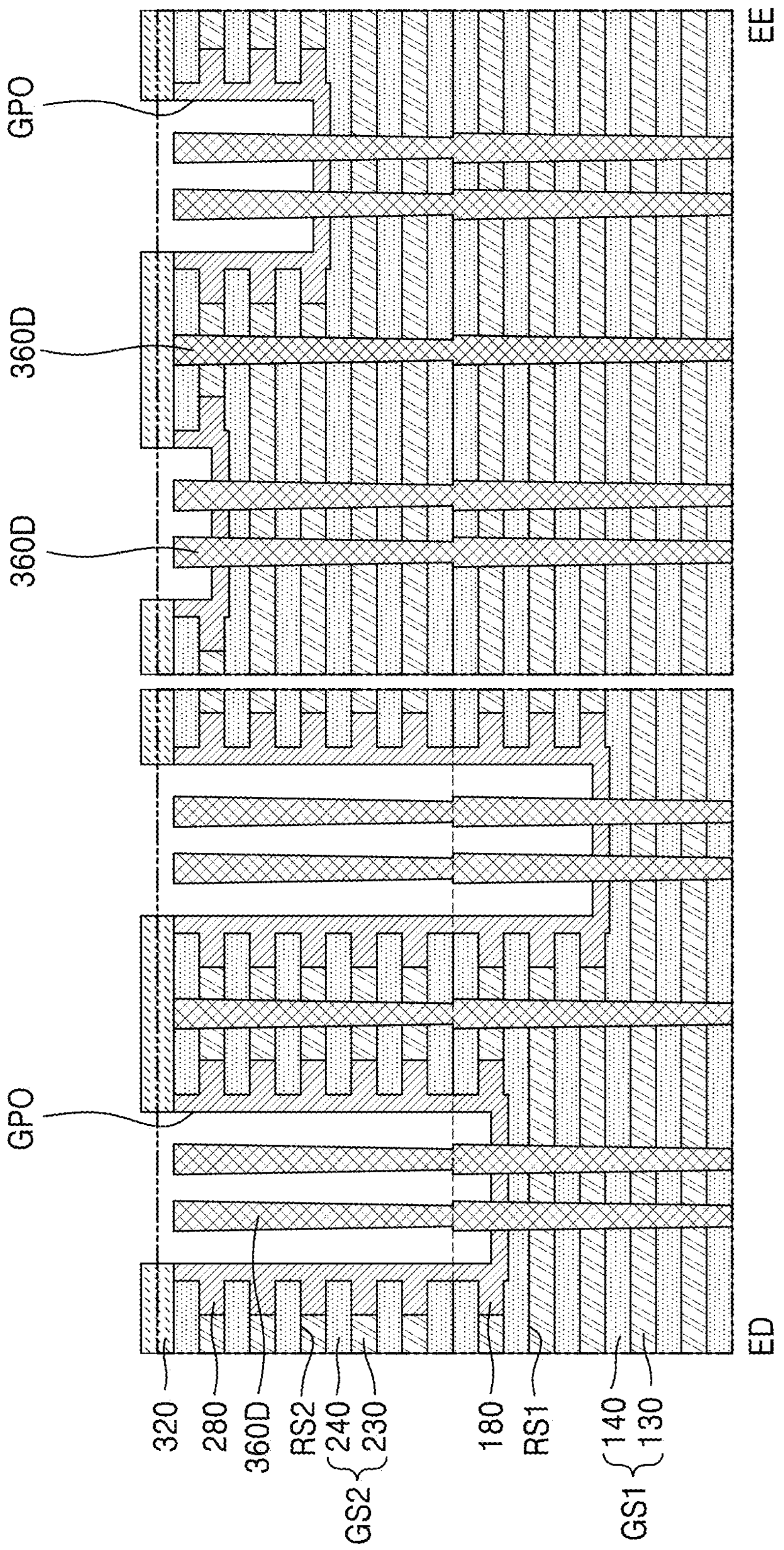

Referring together to FIGS. 23 and 24, portions of the cover insulating layer 320 are removed such that the plurality of second sacrificial layers 290 are exposed, followed by removing the plurality of second sacrificial layers 290 and the plurality of first sacrificial layers 190. A plurality of gate connection openings GPO may be respectively formed in spaces from which the plurality of second sacrificial layers 290 and the plurality of first sacrificial layers 190 are removed.

Figure 25:
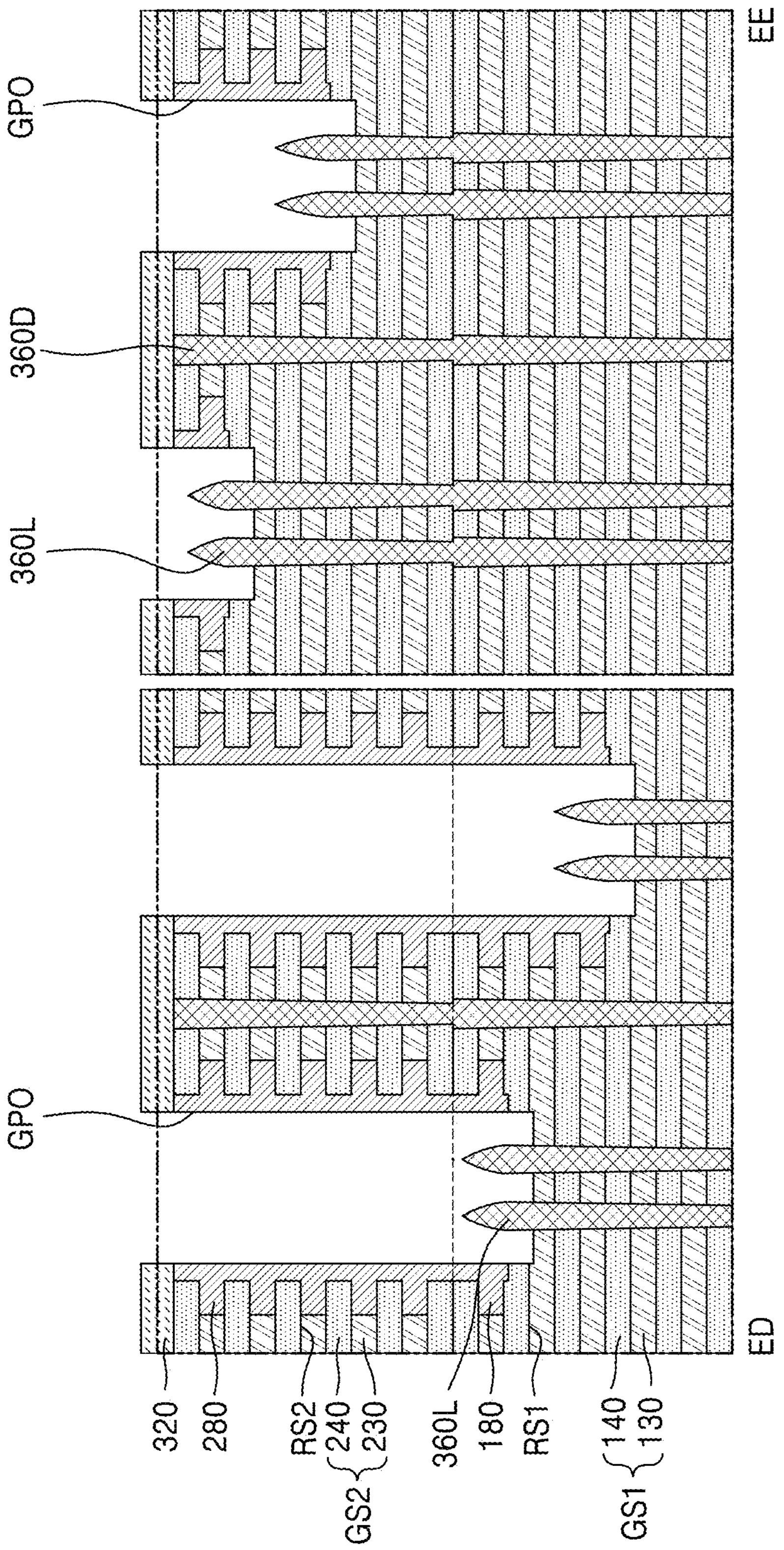

Referring together to FIGS. 24 and 25, portions of the plurality of first spacer insulating layers 180 and portions of the plurality of second spacer insulating layers 280, which are exposed at bottom surfaces of the plurality of gate connection openings GPO, may be removed, followed by removing portions of the plurality of first insulating layers 140 and portions of the plurality of second insulating layers 240 respectively under the removed portions of the plurality of first spacer insulating layers 180 and the removed portions of the plurality of second spacer insulating layers 280, whereby portions of the plurality of first gate electrodes 130 and portions of the plurality of second gate electrodes 230, respectively under the removed portions of the plurality of first insulating layers 140 and the removed portions of the plurality of second insulating layers 240, may be exposed at the bottom surfaces of the plurality of gate connection openings GPO.

In some example embodiments, to expose the plurality of first gate electrodes 130 and the plurality of second gate electrodes 230, during the process of removing or etching the plurality of second sacrificial layers 290 and the plurality of first sacrificial layers 190 and then removing or etching the portions of the plurality of first spacer insulating layers 180, the portions of the plurality of second spacer insulating layers 280, the portions of the plurality of first insulating layers 140, and the portions of the plurality of second insulating layers 240, upper portions of the dummy structures 360D in the plurality of gate connection openings GPO may be removed. To distinguish from the dummy structures 360D, which do not undergo upper portion removal, from among the plurality of dummy structures 360D, each of the dummy structures 360D having undergone upper portion removal may be referred to as a loss dummy structure 360L or a loss support structure. In some example embodiments, loss dummy structures 360L may protrude upward from upper surfaces of the plurality of first gate electrodes 130 and the plurality of second gate electrodes 230, which are exposed at the bottom surfaces of the plurality of gate connection openings GPO. In some example embodiments, a loss dummy structure 360L may have an upper portion shaped as a spire.

Although FIGS. 24 and 25 illustrate that the upper portions of the dummy structures 360D in the plurality of gate connection openings GPO are not removed during the process of removing the plurality of second sacrificial layers 290 and the plurality of first sacrificial layers 190, and that the upper portions of the dummy structures 360D in the plurality of gate connection openings GPO are removed during the process of removing the portions of the plurality of first spacer insulating layers 180, the portions of the plurality of second spacer insulating layers 280, the portions of the plurality of first insulating layers 140, and the portions of the plurality of second insulating layers 240, this is only for convenience of description and illustration, and example embodiments are not limited thereto. For example, during each of the process of removing the plurality of second sacrificial layers 290 and the plurality of first sacrificial layers 190 and the process of removing the portions of the plurality of first spacer insulating layers 180, the portions of the plurality of second spacer insulating layers 280, the portions of the plurality of first insulating layers 140, and the portions of the plurality of second insulating layers 240, the upper portions of the dummy structures 360D in the plurality of gate connection openings GPO may be removed.

Figure 26:
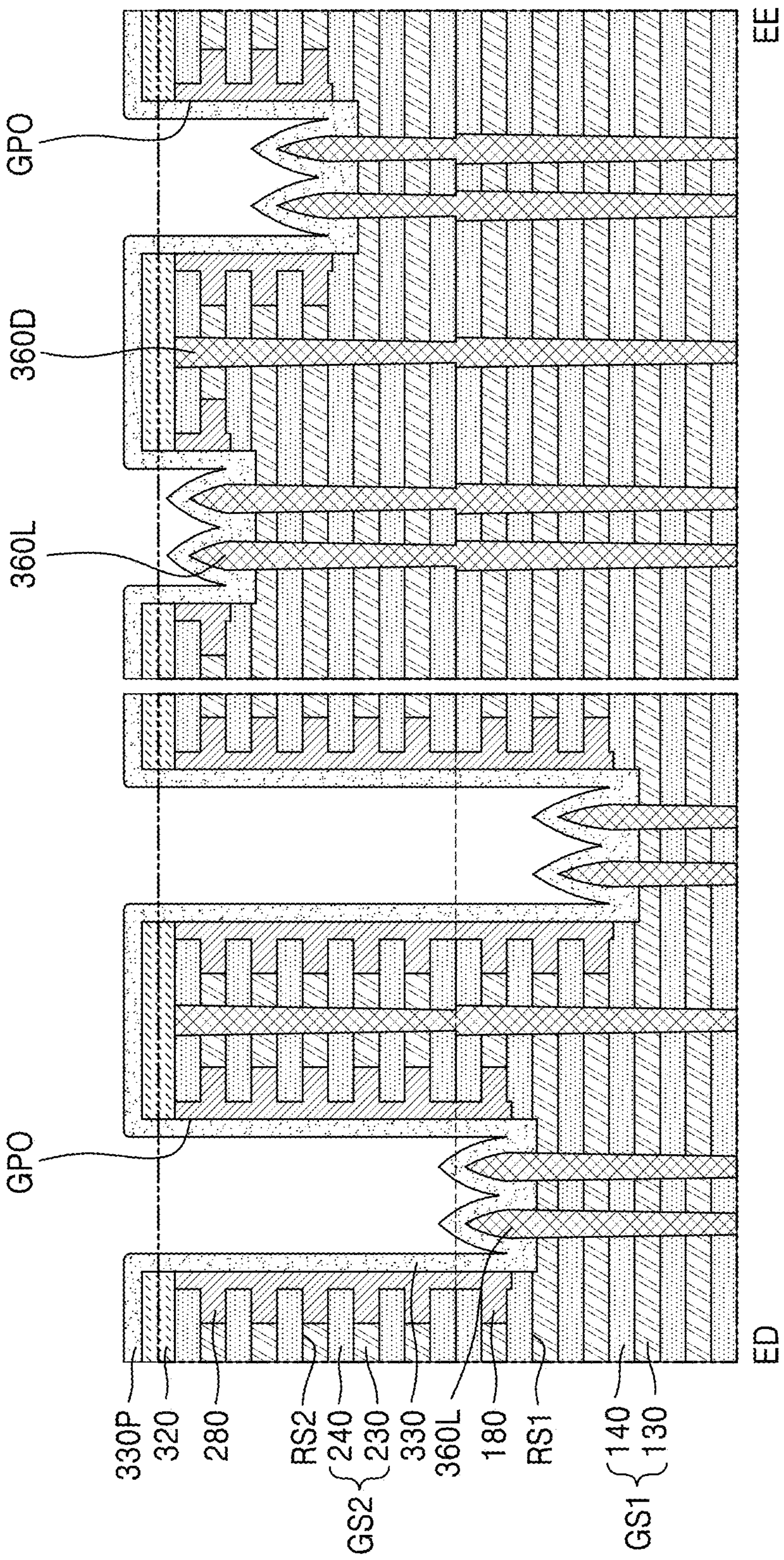

Referring to FIG. 26, a preliminary pad material layer 330P is formed, e.g., with a process such as a CVD process, to cover inner surfaces of the plurality of gate connection openings GPO and an upper surface of the cover insulating layer 320. For example, the preliminary pad material layer 330P may include a metal, such as tungsten, nickel, cobalt, or tantalum, a metal silicide, such as tungsten silicide, nickel silicide, cobalt silicide, or tantalum silicide, or a combination thereof.

The preliminary pad material layer 330P may conformally cover the plurality of first spacer insulating layers 180, the plurality of second spacer insulating layers 280, the loss dummy structures 360L, the plurality of first gate electrodes 130, and the plurality of second gate electrodes 230, which are exposed in the plurality of gate connection openings GPO, and the upper surface of the cover insulating layer 320. The preliminary pad material layer 330P may further cover respective side surfaces of the plurality of first insulating layers 140 and the plurality of second insulating layers 240, which cover respective upper surfaces of the plurality of first gate electrodes 130 and the plurality of second gate electrodes 230 that are in contact with the preliminary pad material layer 330P.

Referring together to FIGS. 26 and 27, a filling insulating layer 350 is formed to fill the plurality of gate connection openings GPO, followed by removing a portion of the preliminary pad material layer 330P such that the upper surface of the cover insulating layer 320 is exposed, thereby forming a plurality of gate connection structures 330. In some example embodiments, during the process of removing the portion of the preliminary pad material layer 330P, an upper portion of the cover insulating layer 320 may be removed together with the portion of the preliminary pad material layer 330P.

The plurality of gate connection structures 330 may be arranged in the plurality of gate connection openings GPO, respectively. Each of the plurality of gate connection structures 330 may be in contact and connected with one of the plurality of first gate electrodes 130 and the plurality of second gate electrodes 230, the one being exposed at the bottom surface of each of the plurality of gate connection openings GPO. Each of the plurality of gate connection structures 330 may extend from the bottom surface of each of the plurality of gate connection openings GPO to an uppermost end of each of the plurality of gate connection openings GPO along an inner side surface thereof.

For example, one gate connection structure 330 may be in contact and connected with one gate electrode, which is exposed at the bottom surface of one gate connection opening GPO, out of the first gate electrode 130 and the second gate electrode 230, and may extend to the uppermost end of the gate connection opening GPO along the inner side surface of the gate connection opening GPO to cover the side surface of one insulating layer out of the first insulating layer 140 and the second insulating layer 240, the side surface of the second spacer insulating layer 280 (or, the side surfaces of the first spacer insulating layer 180 and the second spacer insulating layer 280), and the side surface of the cover insulating layer 320.

At least one loss dummy structure 360L in one gate connection opening GPO may protrude upward from an upper surface of one gate electrode out of the first gate electrode 130 and the second gate electrode 230, the one gate electrode being in contact and connected with one gate connection structure 330 in the one gate connection opening GPO. One gate connection structure 330 may cover a surface of at least one loss dummy structure 360L in one gate connection opening GPO. At least one loss dummy structure 360L in one gate connection opening GPO may pass through one gate electrode, which contacts the gate connection structure 330, out of the first gate electrode 130 and the second gate electrode 230, and a portion of the first gate stack GS1 and/or a portion of the second gate stack GS2 under the one gate electrode.

For example, among a plurality of gate electrodes including the plurality of first gate electrodes 130 and the plurality of second gate electrodes 230 and among a plurality of insulating layers including the plurality of first insulating layers 140 and the plurality of second insulating layers 240, at least one loss dummy structure 360L in one gate connection opening GPO may pass through one gate electrode, which contacts the gate connection structure 330, and other gate electrode(s) and insulating layer(s) under the one gate electrode and thus may extend to the base structure 110. For example, the loss dummy structure 360L may pass through the gate electrode(s) and the insulating layer(s) between the gate connection structure 330, which covers the loss dummy structure 360L, and the base structure 110.

Referring together to FIGS. 28A to 28C, an upper support layer TS may be formed on the cover insulating layer 320, followed by forming a plurality of gate contacts CNT through the upper support layer TS, forming a plurality of bit line contacts BCT through the upper support layer TS and the cover insulating layer 320, and forming an upper buried layer 155 through the upper support layer TS, and then, the bit line BL and a plurality of conductive lines ML may be formed on the upper support layer TS, thereby forming an integrated circuit device 1.

The integrated circuit device 1 may include the peripheral circuit structure PS and the cell array structure CS that is at a higher vertical level than the peripheral circuit structure PS. The cell array structure CS may include the memory cell area MCR, the connection area CONR, and the through-electrode area TVR, and the peripheral circuit structure PS may include the peripheral circuit area PERI. The memory cell area MCR may be an or include or be included in an area in which a vertical channel structure NAND-type memory cell array MCA (see FIG. 3) driven in the manner described with reference to FIG. 3 is formed. The connection area CONR may be an area in which a gate contact CNT for electrical connection between the memory cell array MCA in the memory cell area MCR and the peripheral circuit area PERI is arranged. The through-electrode area TVR may be an area in which a plurality of through-electrodes TSV for electrical connection between the memory cell area MCR and the peripheral circuit area PERI located at a lower vertical level than the memory cell area MCR are arranged.

Although the cell array structure CS is shown as including the first stack ST1, which includes the first gate stack GS1, and the second stack ST2, which includes the second gate stack GS2, this is only an example, and example embodiments are not limited thereto. For example, the cell array structure CS may include three or more stacks each including a gate stack.

The plurality of gate contacts CNT may be in contact and connected with the plurality of gate connection structures 330 through the upper support layer TS, respectively, and the plurality of bit line contacts BCT may be in contact and connected with the plurality of channel structures 360 through the upper support layer TS and the cover insulating layer 320, respectively. The upper buried layer 155 may contact the gate stack separation insulating layer 150 through the upper support layer TS. In some example embodiments, the upper buried layer 155 may be omitted without being formed. The plurality of gate contacts CNT may be in contact and connected with upper ends of the plurality of gate connection structures 330 corresponding thereto, respectively. The plurality of gate contacts CNT may have the same vertical height. The plurality of bit line contacts BCT may be in contact and connected with conductive plugs 368 of the plurality of channel structures 360, respectively. The plurality of bit line contacts BCT may have the same vertical height.

The bit line BL may be in contact and connected with upper surfaces of the plurality of bit line contacts BCT. The bit line BL may be electrically connected with the channel layers 364 of the plurality of channel structures 360 via the plurality of bit line contacts BCT and the conductive plugs 368 of the plurality of channel structures 360.

The plurality of conductive lines ML may be respectively in contact and connected with upper surfaces of the plurality of gate contacts CNT and upper surfaces of the plurality of through-electrodes TSV and thus may respectively and electrically connect the plurality of gate contacts CNT with the plurality of through-electrodes TSV.

In the connection area CONR, the plurality of gate connection openings GPO may be formed. Each of the plurality of gate connection openings GPO may extend inward from an upper surface of the gate stack. One gate electrode from among the plurality of gate electrodes including the plurality of first gate electrodes 130 and the plurality of second gate electrodes 230 may be exposed at the bottom surface of each of the plurality of gate connection openings GPO. The plurality of gate connection structures 330 may respectively cover the inner side surfaces and the bottom surfaces of the plurality of gate connection openings GPO and may be respectively connected to the gate electrodes exposed at the bottom surfaces of the plurality of gate connection openings GPO. The plurality of gate connection structures 330 may respectively extend from the bottom surfaces of the plurality of gate connection openings GPO to the upper ends of the plurality of gate connection openings GPO and may respectively and electrically connect the plurality of first gate electrodes 130 and the plurality of second gate electrodes 230 with the plurality of gate contacts CNT.

The plurality of dummy structures 360D may be formed in the connection area CONR, but example embodiments are not limited thereto. For example, some of the plurality of dummy structures 360D may be arranged in the connection area CONR, and some others may be arranged in the through-electrode area TVR and/or the memory cell area MCR. Respective lower ends of the plurality of dummy structures 360D may be at the same vertical level. Among the plurality of dummy structures 360D, some of the dummy structures 360D arranged in the connection area CONR may be the loss dummy structures 360L having upper ends at a lower vertical level than the other dummy structures 360D.

At least one loss dummy structure 360L in one gate connection opening GPO may protrude upward from an upper surface of one gate electrode out of the first gate electrode 130 and the second gate electrode 230, the one gate electrode being in contact and connected with one gate connection structure 330 in the one gate connection opening GPO. Each of the loss dummy structures 360L may protrude with substantially the same height from the upper surface of the gate electrode connected with the gate connection structure 330 that covers each of the loss dummy structures 360L. One gate connection structure 330 may cover a surface of at least one loss dummy structure 360L in one gate connection opening GPO.

Among a plurality of gate electrodes including the plurality of first gate electrodes 130 and the plurality of second gate electrodes 230 and among a plurality of insulating layers including the plurality of first insulating layers 140 and the plurality of second insulating layers 240, at least one loss dummy structure 360L in one gate connection opening GPO may pass through one gate electrode, which contacts the gate connection structure 330, and other gate electrode(s) and insulating layer(s) under the one gate electrode and thus may extend to the base structure 110. That is, the loss dummy structure 360L may pass through the gate electrode(s) and the insulating layer(s) between the gate connection structure 330, which covers the loss dummy structure 360L, and the base structure 110.

Each of the plurality of channel structures 360 arranged in the memory cell area MCR may include the gate insulating layer 362, the channel layer 364, the buried insulating layer 366, and the conductive plugs 368. The gate insulating layer 362 and the channel layer 364 may be arranged in the stated order on the inner side surface of the channel hole CHH. For example, the gate insulating layer 362 may be conformally arranged on the inner side surface of the channel hole CHH, and the channel layer 364 may cover the gate insulating layer 362 and be conformally arranged on the inner side surface and the bottom surface of the channel hole CHH. The buried insulating layer 366 may be arranged on the channel layer 364 to fill the remaining space of the channel hole CHH. The conductive plug 368 may be arranged in an upper portion of the channel hole CHH to contact the channel layer 364 and plug an entrance of the channel hole CHH, for example, an upper end of the second channel hole CHH2. In some example embodiments, the buried insulating layer 366 may be omitted, and the channel layer 364 may be formed in a pillar shape that fills the remaining portion of the channel hole CHH. The plurality of channel structures 360 may pass through the second gate stack GS2 and the first gate stack GS1 to extend to the inside of the based structure 110. The channel layer 364 may be connected with the base structure 110.

The gate insulating layer 362 may have a structure including a tunneling dielectric film 362A, a charge storage film 362B, and a blocking dielectric film 362C, which are arranged in the stated order on an outer sidewall of the channel layer 364. Relative thicknesses of the tunneling dielectric film 362A, the charge storage film 362B, and the blocking dielectric film 362C, which constitute the gate insulating layer 362, are not limited to the example shown in FIG. 28C and may be variously modified.

The tunneling dielectric film 362A may include one or more of silicon oxide, hafnium oxide, aluminum oxide, zirconium oxide, tantalum oxide, or the like. The charge storage film 362B is a region in which electrons having passed through the tunneling dielectric film 362A from the channel layer 364 may be stored, and may include one or more of silicon nitride, boron nitride, silicon boron nitride, or impurity-doped polysilicon. The blocking dielectric film 362C may include one or more of silicon oxide, silicon nitride, or a metal oxide having a dielectric constant that is greater than that of silicon oxide. The metal oxide may include hafnium oxide, aluminum oxide, zirconium oxide, tantalum oxide, or a combination thereof.

Figure 29A:
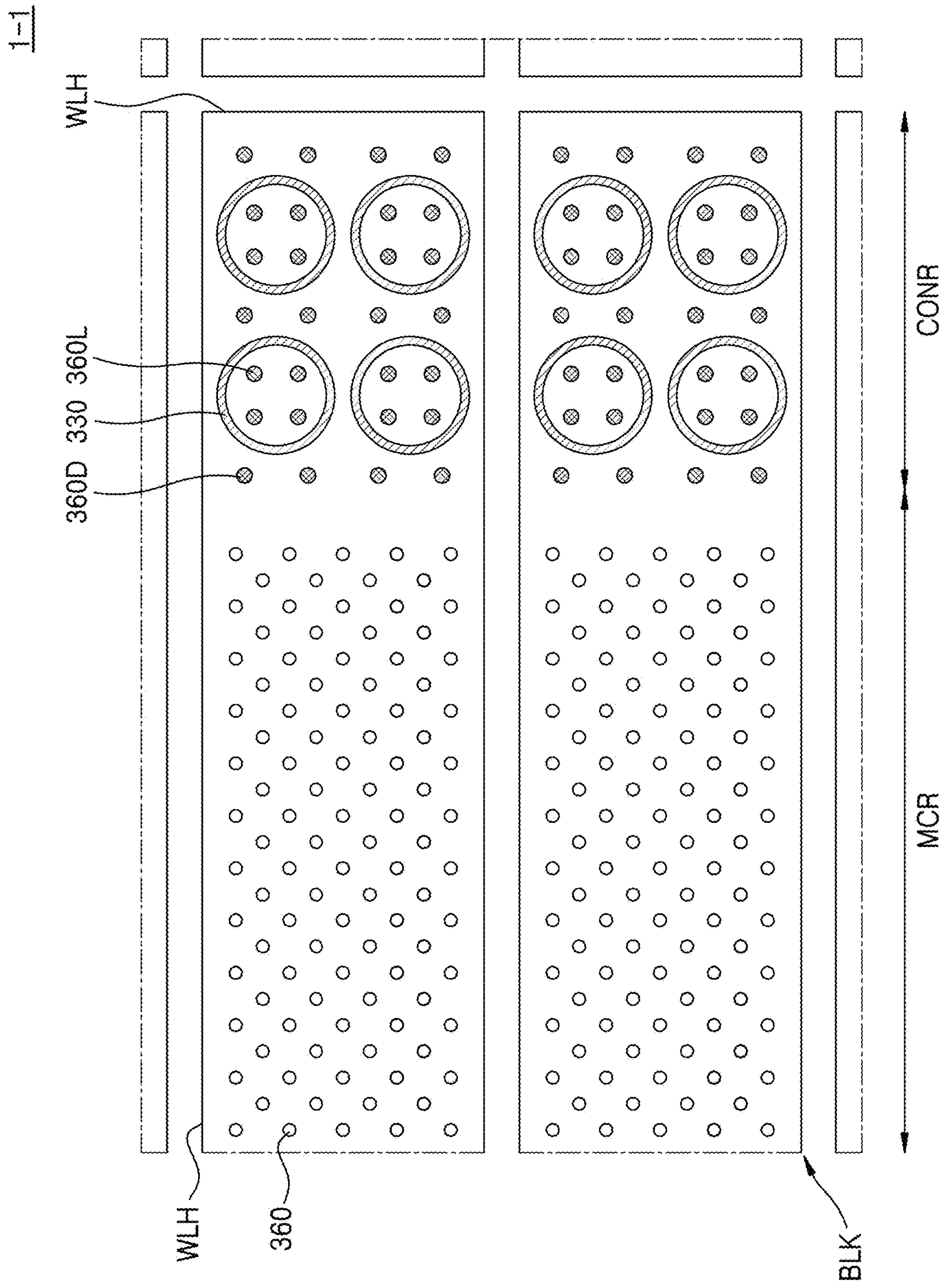
FIGS. 29A to 29C are planar layouts each illustrating an integrated circuit device according to some example embodiments.
Figure 29B:
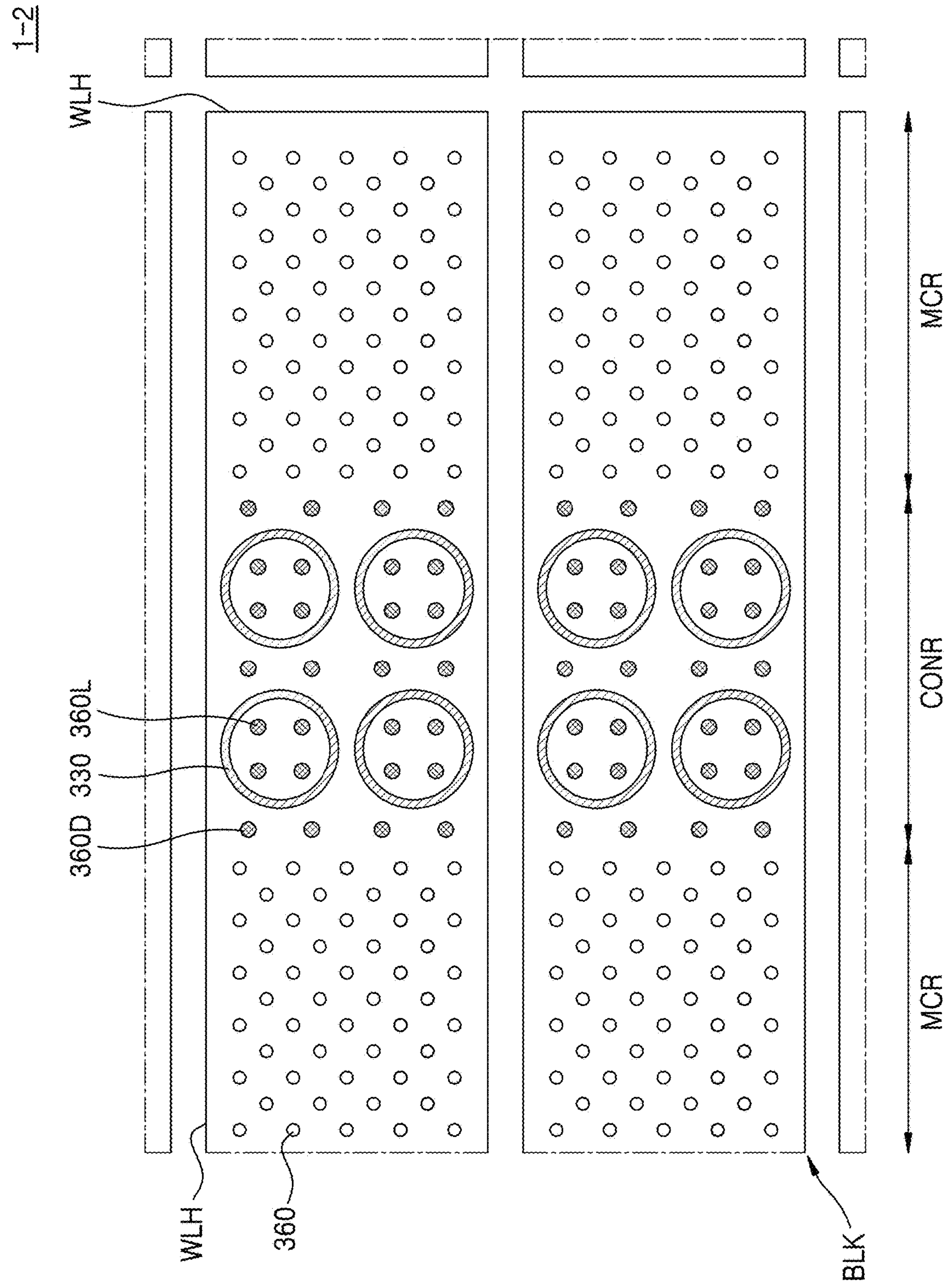
Figure 29C:
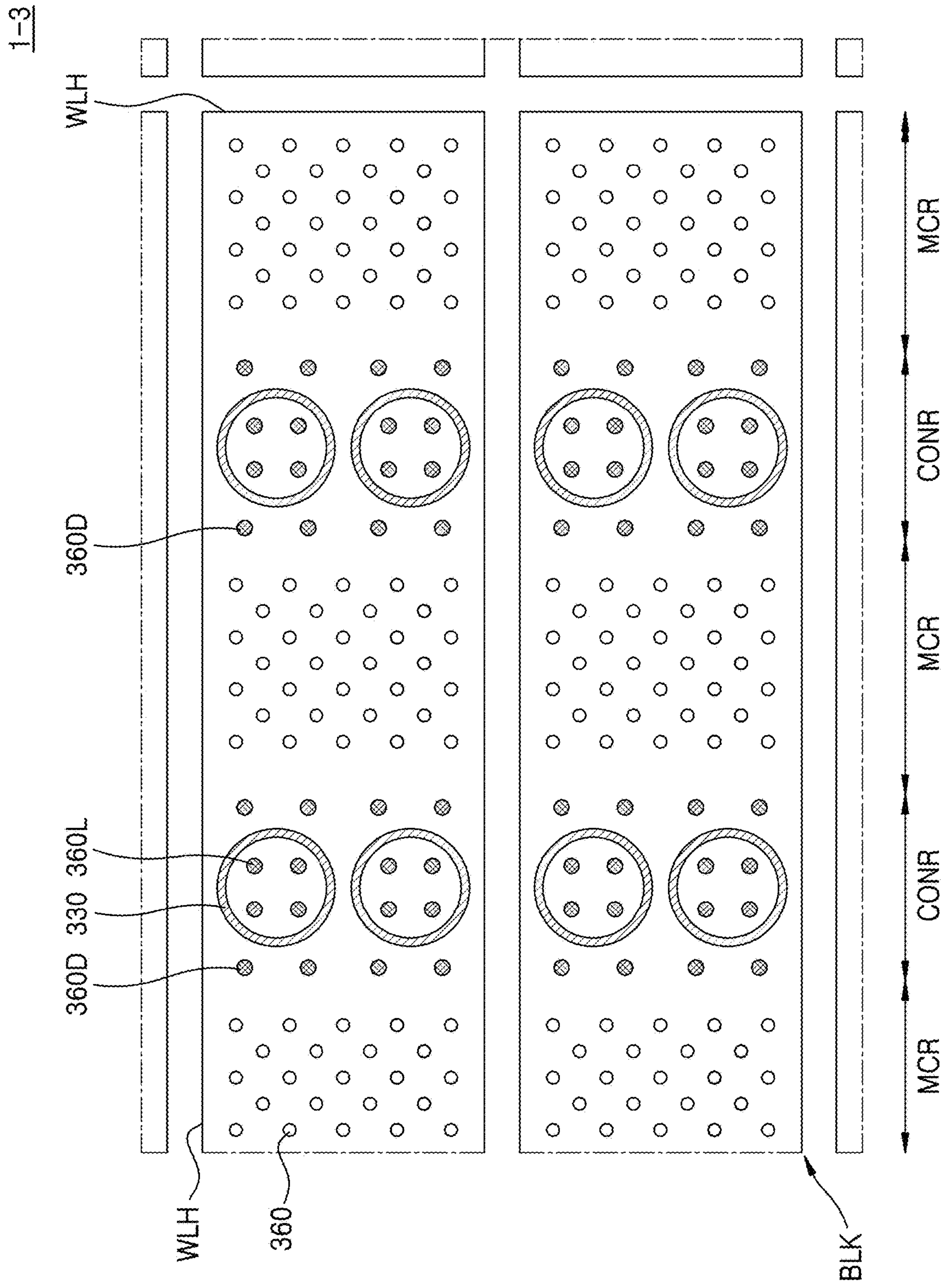

FIGS. 29A to 29C are planar layouts each illustrating an integrated circuit device according to some example embodiments.

Referring to FIG. 29A, an integrated circuit device 1-1 includes a plurality of memory cell blocks BLK each having the memory cell area MCR and the connection area CONR. The connection area CONR may be arranged adjacent to one edge of each of the plurality of memory cell blocks BLK. The gate stack separation opening WLH may extend along a region between the plurality of memory cell blocks BLK, and each of the plurality of memory cell blocks BLK may be surrounded by the gate stack separation opening WLH.

The plurality of channel structures 360 may be arranged in the memory cell area MCR. The plurality of dummy structures 360D and the plurality of gate connection structures 330 may be arranged in the connection area CONR. FIG. 29A illustrates that a horizontal cross-section of each of the plurality of gate connection structures 330 has a circular shape, but example embodiments are not limited thereto. For example, the horizontal cross-section of each of the plurality of gate connection structures 330 may have a polygonal shape or a curved shape, such as a circle, an ellipse, a rectangle, or a corner-rounded rectangle.

Some of the plurality of dummy structures 360D may be the loss dummy structures 360L surrounded by each of the plurality of gate connection structures 330, in a top view.

Referring to FIG. 29B, an integrated circuit device 1-2 includes the plurality of memory cell blocks BLK each having the memory cell area MCR and the connection area CONR. The connection area CONR may be arranged inside each of the plurality of memory cell blocks BLK, and thus, the memory cell area MCR may be arranged on both sides of the connection area CONR.

Referring to FIG. 29C, an integrated circuit device 1-3 includes the plurality of memory cell blocks BLK each having the memory cell area MCR and the connection area CONR. Each of the plurality of memory cell blocks BLK may have at least two connection areas CONR that are apart from each other. In some example embodiments, the memory cell area MCR may be arranged on both sides of each of the at least two connection areas CONR.

Referring together to FIGS. 4 to 29C, in the integrated circuit devices 1, 1-1, 1-2, and 1-3 according to example embodiments, the plurality of memory cell blocks BLK may be separated from each other by the gate stack separation opening WLH, and thus, the gate stack separation opening WLH may surround each of the plurality of memory cell blocks BLK. Therefore, edges of a plurality of gate electrodes of a memory cell block BLK may be aligned with edges of a plurality of insulating layers of the memory cell block BLK, and thus, a gate stack, in which the plurality of gate electrodes and the plurality of insulating layers are alternately arranged, may not have a stepwise structure. Therefore, the connection area CONR of the cell array structure CS may not be arranged in a portion of the gate stack, which has a stepwise structure. There may be an improvement in fabrication, and/or a corresponding decrease in costs and/or increase in yield.

In the integrated circuit devices 1, 1-1, 1-2, and 1-3 according to various example embodiments, the gate connection structure 330, which covers the inner side surface and the bottom surface of the gate connection opening GPO, may be in contact and connected with a gate electrode located at the bottom surface of the gate connection opening GPO, and the gate contact CNT, which is connected to the upper end of the gate connection structure 330, may connect the gate connection structure 330 with the conductive line ML. Therefore, the plurality of gate contacts CNT, which are respectively and electrically connected with a plurality of gate lines located at different vertical levels from each other, may be formed with the same vertical height at the same vertical level, and thus, to form the plurality of gate contacts CNT, there is no need to form contact holes having different vertical heights from each other.

Because the dummy structure 360D, for example, the loss dummy structure 360L, which passes through gate electrodes and insulating layers located under each of the plurality of gate connection openings GPO, may be a support structure supporting the gate stack, the gate stack may be prevented from collapsing during the process of forming the plurality of gate connection openings GPO, and thus, the structural reliability of each of the integrated circuit devices 1, 1-1, 1-2, and 1-3 may be secured or more likely to be secured.

In the case where the gate stack has a stepwise structure, when an etching process, for example, an etching process for forming the plurality of support holes SPH each including the first support hole SPH1 and the second support hole SPH2, is performed on a portion of the gate stack, which has the stepwise structure, because proportions of materials to be removed may vary with respective positions of the plurality of support holes SPH in the stepwise structure, the difficulty of an etching process may increase. However, because the gate stack of each of the integrated circuit devices 1, 1-1, 1-2, and 1-3 has no stepwise structure, the etching process for forming the plurality of support holes SPH, which each include the first support hole SPH1 and the second support hole SPH2, may be easily performed.

Alternatively or additionally, in the integrated circuit devices 1, 1-1, 1-2, and 1-3 according to various example embodiments, because there is no need to arrange the connection area CONR of the cell array structure CS in the stepwise structure of the gate stack, the connection area CONR may be freely arranged within the memory cell block BLK.

Figure 30:
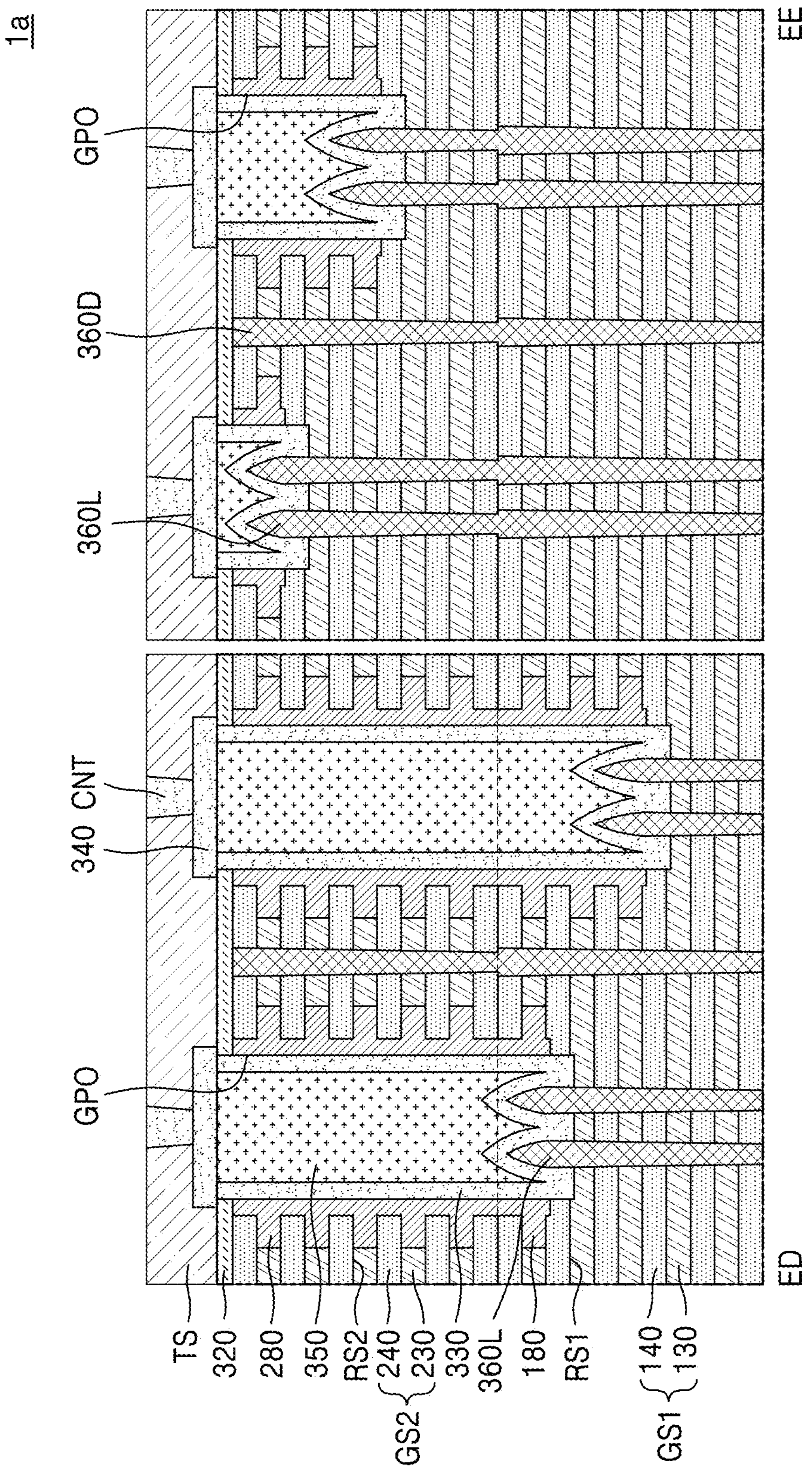
FIG. 30 is a cross-sectional view illustrating an integrated circuit device according to some example embodiments.

FIG. 30 is a cross-sectional view illustrating an integrated circuit device according to some example embodiments. Specifically, FIG. 30 is an enlarged cross-sectional view illustrating regions corresponding to the regions ED and EE of FIG. 28A and, regarding FIG. 30, repeated descriptions given with reference to FIGS. 4 to 29C may be omitted.

Referring to FIG. 30, an integrated circuit device la may include a plurality of landing pads 340 respectively between the plurality of gate connection structures 330 and the plurality of gate contacts CNT. The plurality of landing pads 340 may respectively contact the upper ends of the plurality of gate connection structures 330 and may be respectively arranged on a plurality of filling insulating layers 350. In some example embodiments, the plurality of landing pads 340 may respectively cover the upper surfaces of the plurality of gate connection structures 330 and upper surfaces of the plurality of filling insulating layers 350 and also respectively cover portions of the cover insulating layer 320 adjacent to the plurality of gate connection structures 330. The plurality of gate contacts CNT may be respectively in contact and connected with upper surfaces of the plurality of landing pads 340, which are respectively in contact and connected with the plurality of gate connection structures 330.

Figure 31:
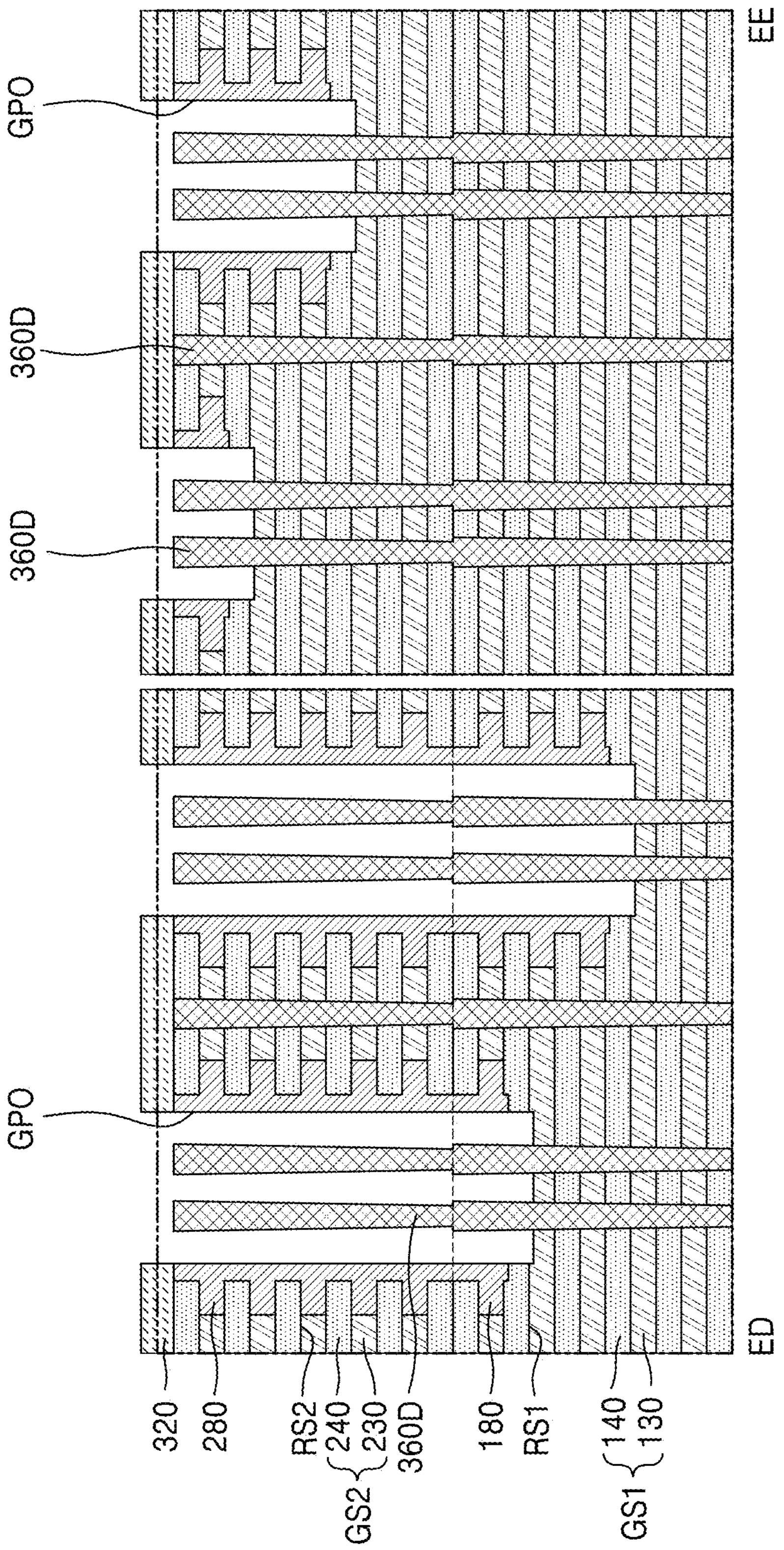
FIG. 31 is a cross-sectional view illustrating a method of fabricating an integrated circuit device, according to some example embodiments.
Figure 32:
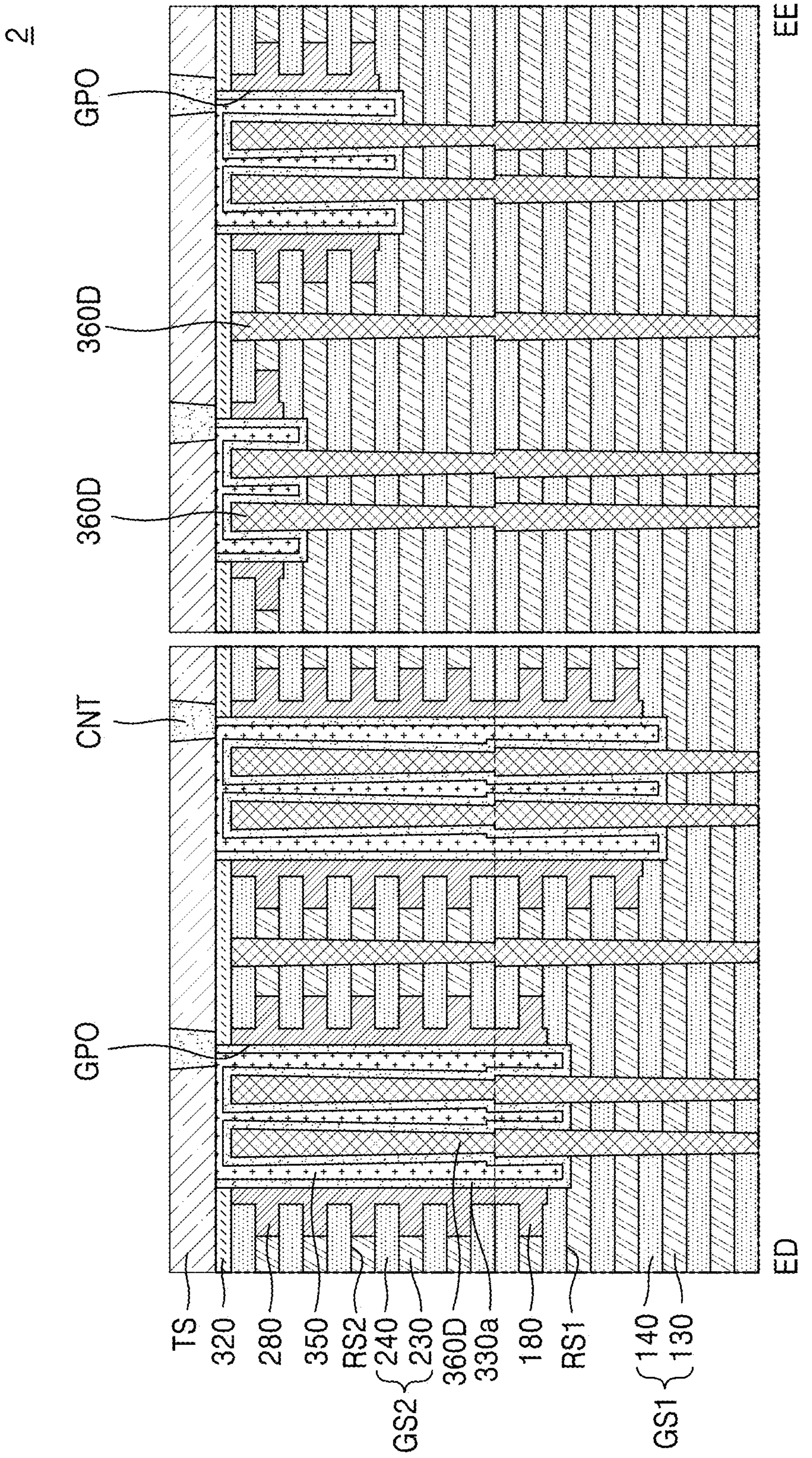
FIG. 32 is a cross-sectional view illustrating an integrated circuit device according to some example embodiments.

FIG. 31 is a cross-sectional view illustrating a method of fabricating an integrated circuit device, according to some example embodiments, and FIG. 32 is a cross-sectional view illustrating an integrated circuit device according to some example embodiments. Specifically, FIGS. 31 and 32 are enlarged cross-sectional views each illustrating regions corresponding to the regions ED and EE of FIG. 28A and, regarding FIGS. 31 and 32, repeated descriptions given with reference to FIGS. 4 to 29C may be omitted.

Referring to FIGS. 24 and 31, portions of the plurality of first spacer insulating layers 180 and portions of the plurality of second spacer insulating layers 280, which are exposed at the bottom surfaces of the plurality of gate connection openings GPO, may be removed, followed by removing portions of the plurality of first insulating layers 140 and portions of the plurality of second insulating layers 240 respectively under the removed portions of the plurality of first spacer insulating layers 180 and the removed portions of the plurality of second spacer insulating layers 280, whereby portions of the plurality of first gate electrodes 130 and portions of the plurality of second gate electrodes 230, respectively under the removed portions of the plurality of first insulating layers 140 and the removed portions of the plurality of second insulating layers 240, may be exposed at the bottom surfaces of the plurality of gate connection openings GPO.

In some example embodiments, to expose the plurality of first gate electrodes 130 and the plurality of second gate electrodes 230, during the process of removing the plurality of second sacrificial layers 290 and the plurality of first sacrificial layers 190 and then removing the portions of the plurality of first spacer insulating layers 180, the portions of the plurality of second spacer insulating layers 280, the portions of the plurality of first insulating layers 140, and the portions of the plurality of second insulating layers 240, portions of the dummy structures 360D in the plurality of gate connection openings GPO may remain without being removed. The dummy structures 360D in the plurality of gate connection openings GPO may protrude upward from the respective upper surfaces of the plurality of first gate electrodes 130 and the plurality of second gate electrodes 230, which are exposed at the bottom surfaces of the plurality of gate connection openings GPO.

Referring to FIG. 32, a plurality of gate connection structures 330*a*, the plurality of filling insulating layers 350, the upper support layer TS, the plurality of gate contacts CNT, the plurality of bit line contacts BCT (see FIG. 28A), the upper buried layer 155 (see FIG. 28A), the bit line BL (see FIG. 28A), and the plurality of conductive lines ML (see FIG. 28A) may be formed by referring to the method described with reference to FIGS. 26 to 28C, thereby forming an integrated circuit device 2.

The plurality of gate connection structures 330*a* may be respectively arranged in the plurality of gate connection openings GPO to be respectively in contact and connected with plurality of first gate electrodes 130 and the plurality of second gate electrodes 230, which are exposed at the bottom surfaces of the plurality of gate connection openings GPO. One gate connection structure 330*a* may cover a surface, that is, a side surface and an upper surface, of at least one dummy structure 360D located in one gate connection opening GPO.

Figure 33:
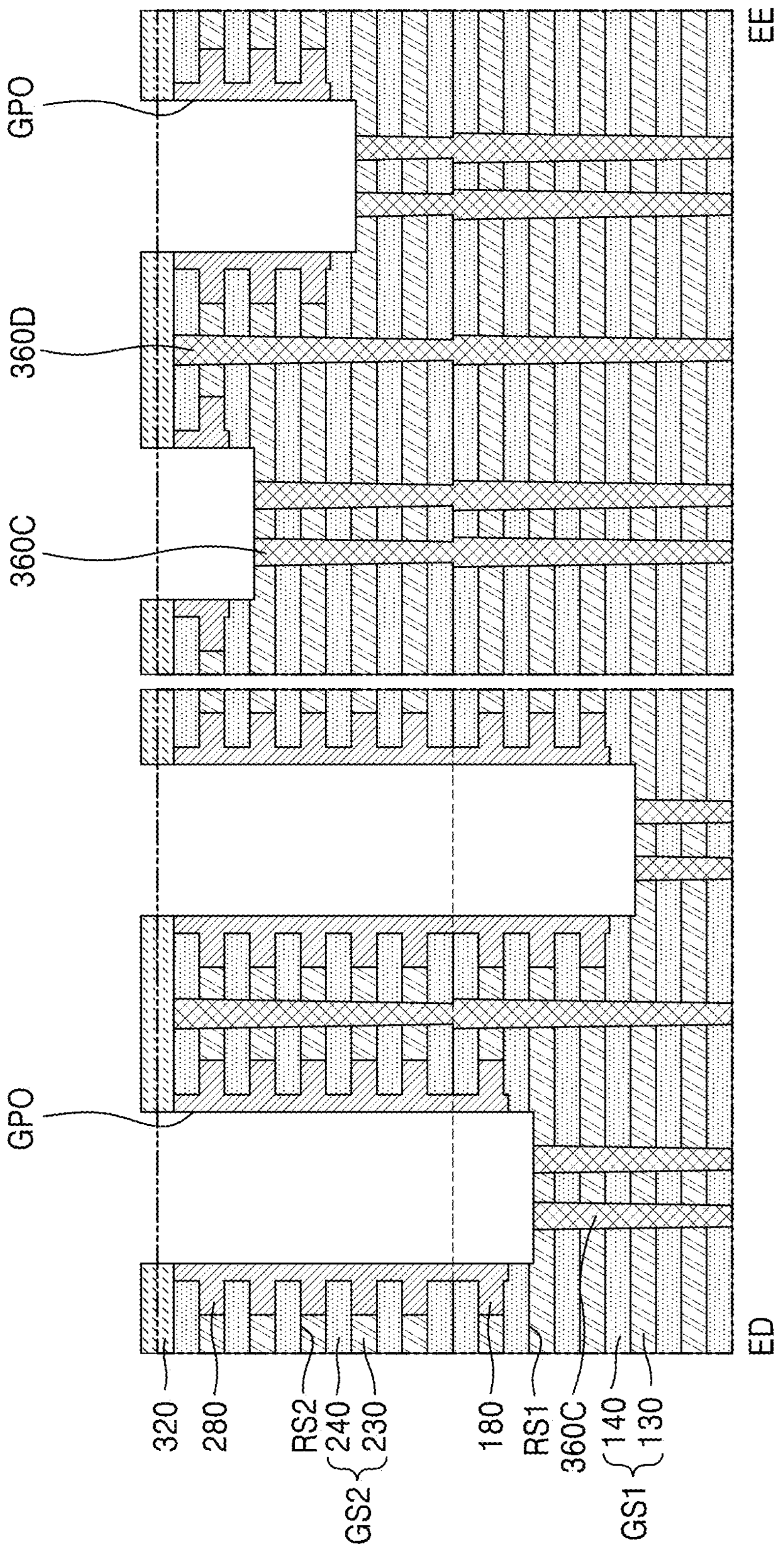
FIG. 33 is a cross-sectional view illustrating a method of fabricating an integrated circuit device, according to some example embodiments.
Figure 34:
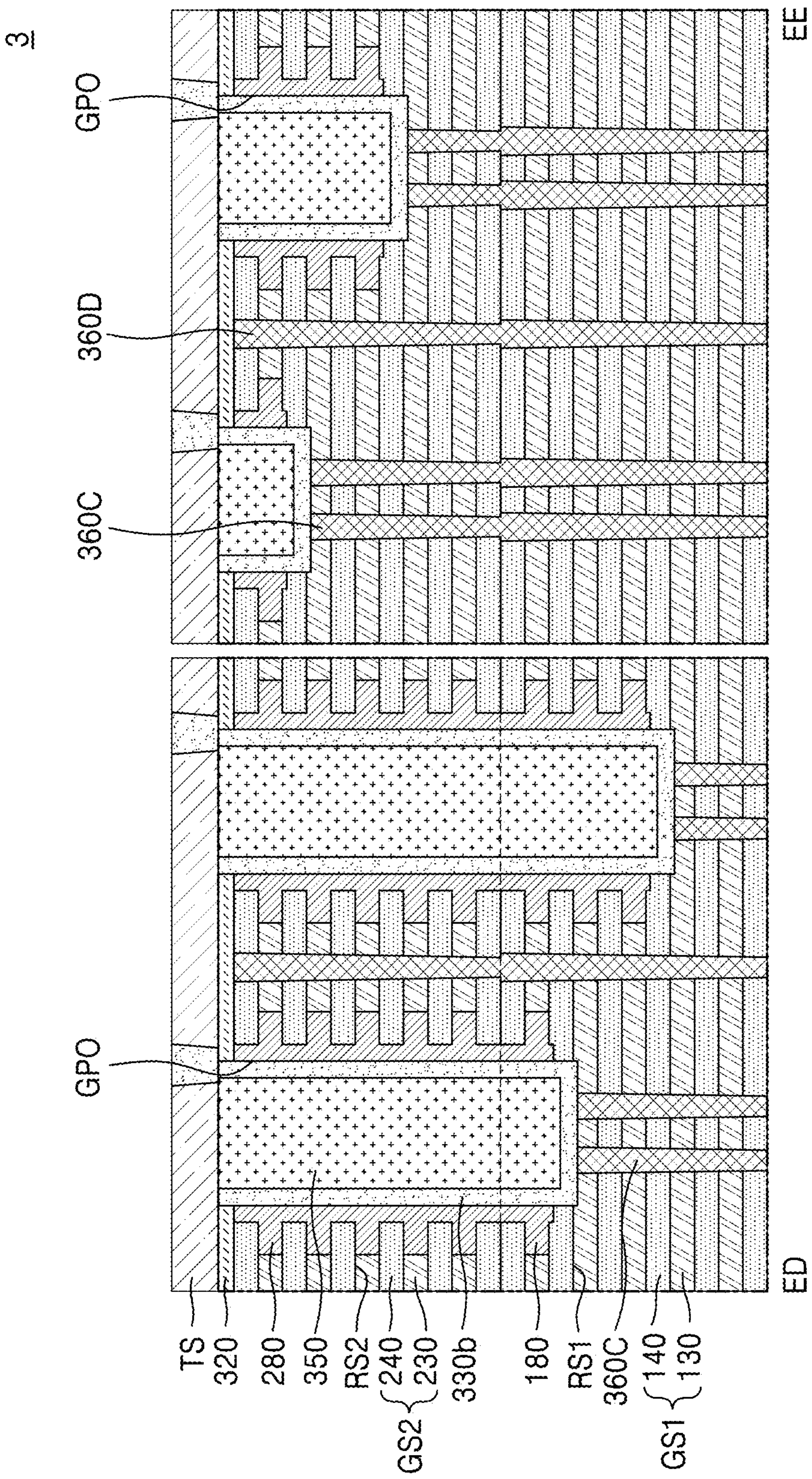
FIG. 34 is a cross-sectional view illustrating an integrated circuit device according to some example embodiments.

FIG. 33 is a cross-sectional view illustrating a method of fabricating an integrated circuit device, according to some example embodiments, and FIG. 34 is a cross-sectional view illustrating an integrated circuit device according to some example embodiments. Specifically, FIGS. 33 and 34 are enlarged cross-sectional views each illustrating regions corresponding to the regions ED and EE of FIG. 28A and, regarding FIGS. 33 and 34, repeated descriptions given with reference to FIGS. 4 to 29C may be omitted.

Referring to FIGS. 24 and 33, portions of the plurality of first spacer insulating layers 180 and portions of the plurality of second spacer insulating layers 280, which are exposed at the bottom surfaces of the plurality of gate connection openings GPO, may be removed, followed by removing portions of the plurality of first insulating layers 140 and portions of the plurality of second insulating layers 240 respectively under the removed portions of the plurality of first spacer insulating layers 180 and the removed portions of the plurality of second spacer insulating layers 280, whereby portions of the plurality of first gate electrodes 130 and portions of the plurality of second gate electrodes 230, respectively under the removed portions of the plurality of first insulating layers 140 and the removed portions of the plurality of second insulating layers 240, may be exposed at the bottom surfaces of the plurality of gate connection openings GPO.

In various example embodiments, to expose the plurality of first gate electrodes 130 and the plurality of second gate electrodes 230, during the process of removing the plurality of second sacrificial layers 290 and the plurality of first sacrificial layers 190 and then removing the portions of the plurality of first spacer insulating layers 180, the portions of the plurality of second spacer insulating layers 280, the portions of the plurality of first insulating layers 140, and the portions of the plurality of second insulating layers 240, portions of the dummy structures 360D in the plurality of gate connection openings GPO may be completely removed. To distinguish from the dummy structures 360D, which do not undergo upper portion removal, from among the plurality of dummy structures 360D, each of the dummy structures 360D having undergone upper portion removal may be referred to as a loss dummy structure 360C or a loss support structure. In some example embodiments, loss dummy structures 360C may not protrude upward from the respective upper surfaces of the plurality of first gate electrodes 130 and the plurality of second gate electrodes 230, which are exposed at the bottom surfaces of the plurality of gate connection openings GPO. In various example embodiments, upper surfaces of the loss dummy structures 360C may be at the same vertical level as the upper surfaces of the plurality of first gate electrodes 130 and the plurality of second gate electrodes 230, which are exposed at the bottom surfaces of the plurality of gate connection openings GPO, and thus, may be coplanar with the upper surfaces thereof.

Referring to FIG. 34, a plurality of gate connection structures 330*b*, the plurality of filling insulating layers 350, the upper support layer TS, the plurality of gate contacts CNT, the plurality of bit line contacts BCT (see FIG. 28A), the upper buried layer 155 (see FIG. 28A), the bit line BL (see FIG. 28A), and the plurality of conductive lines ML (see FIG. 28A) may be formed by referring to the method described with reference to FIGS. 26 to 28C, thereby forming an integrated circuit device 3.

The plurality of gate connection structures 330*b* may be respectively arranged in the plurality of gate connection openings GPO to be respectively in contact and connected with plurality of first gate electrodes 130 and the plurality of second gate electrodes 230, which are exposed at the bottom surfaces of the plurality of gate connection openings GPO. The plurality of gate connection structures 330*b* may respectively cover the upper surfaces of the plurality of first gate electrodes 130 and the plurality of second gate electrodes 230, which are exposed at the bottom surfaces of the plurality of gate connection openings GPO, and the upper surfaces of the loss dummy structures 360C.

Figure 35:
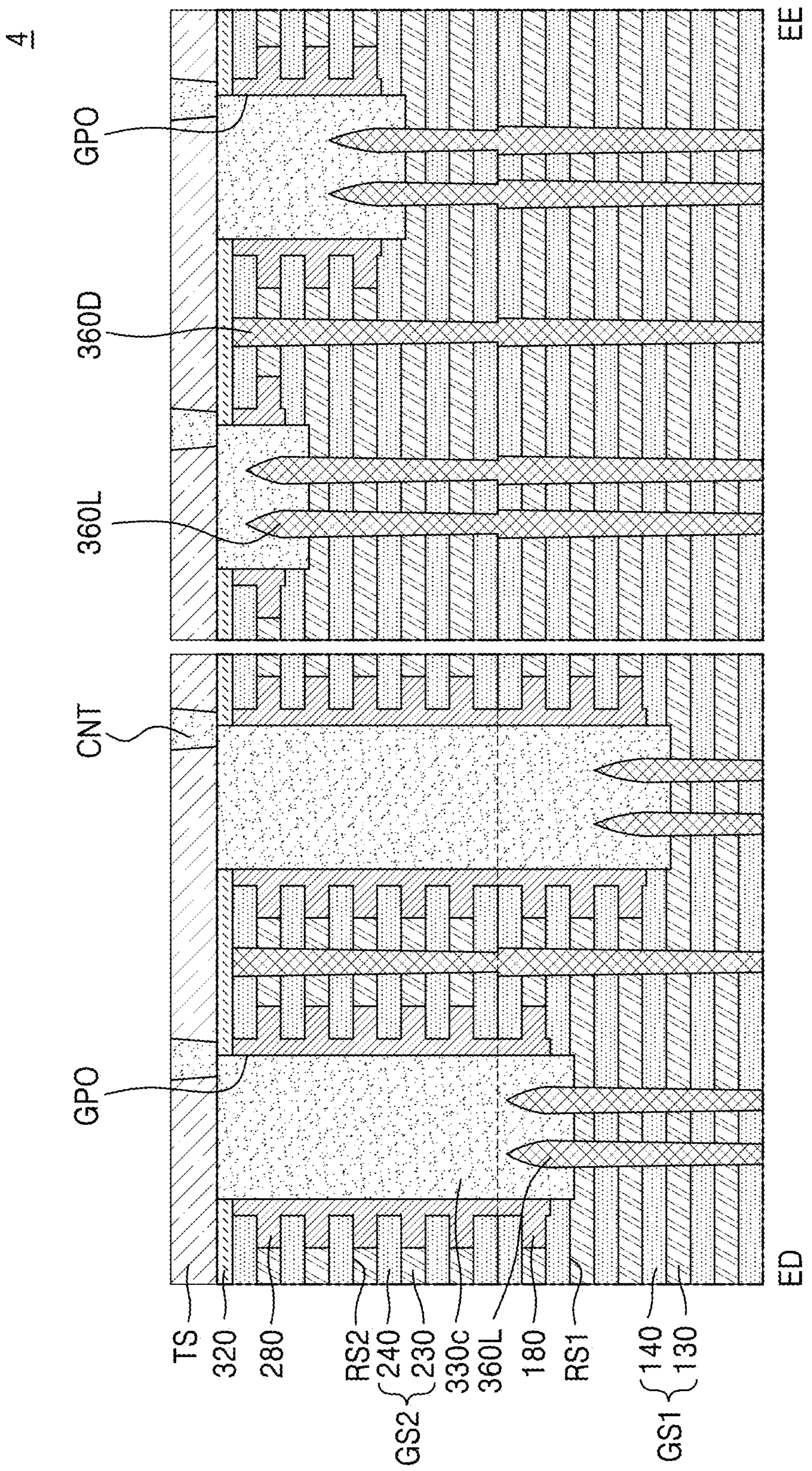
FIGS. 35 to 37 are cross-sectional views respectively illustrating integrated circuit devices according to some example embodiments.
Figure 36:
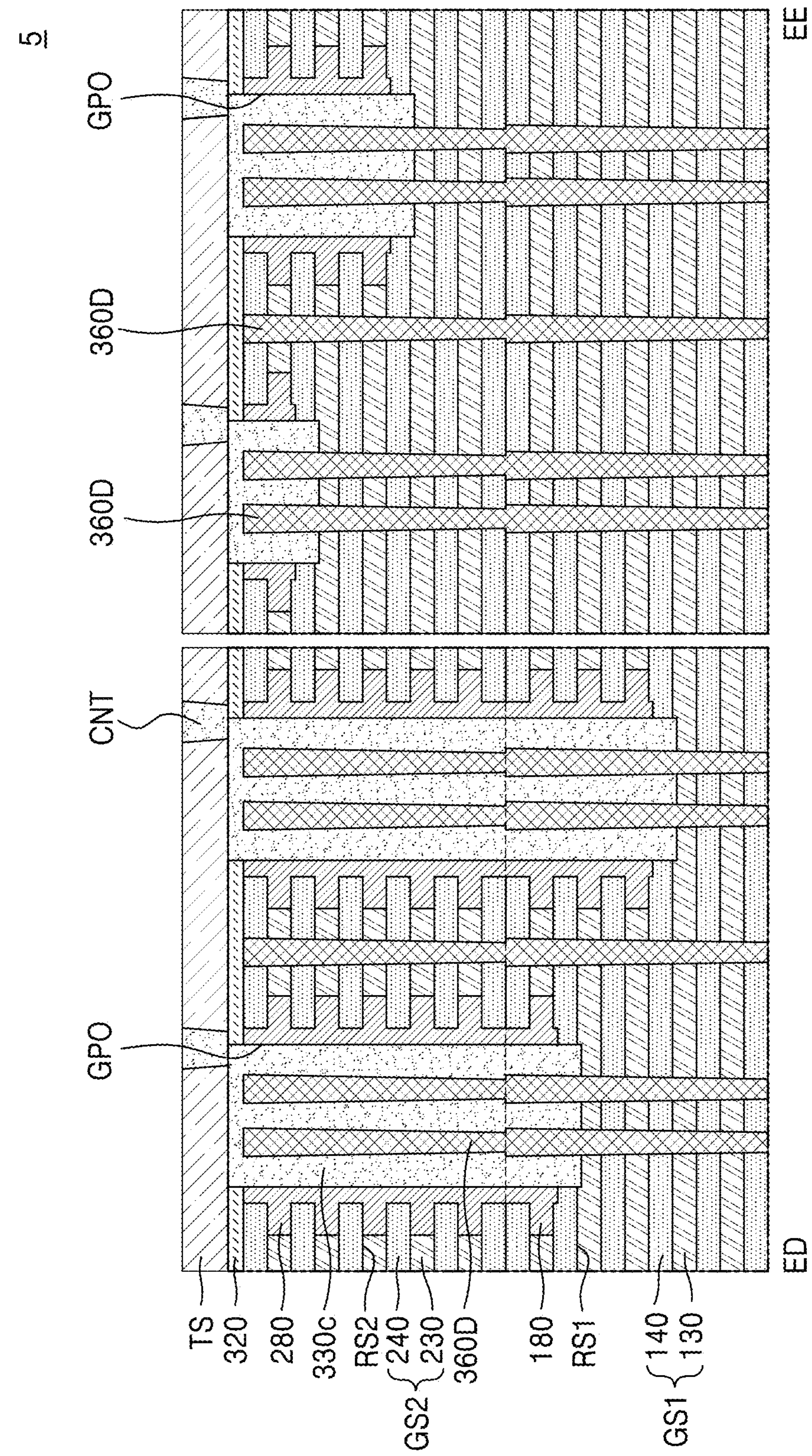
Figure 37:
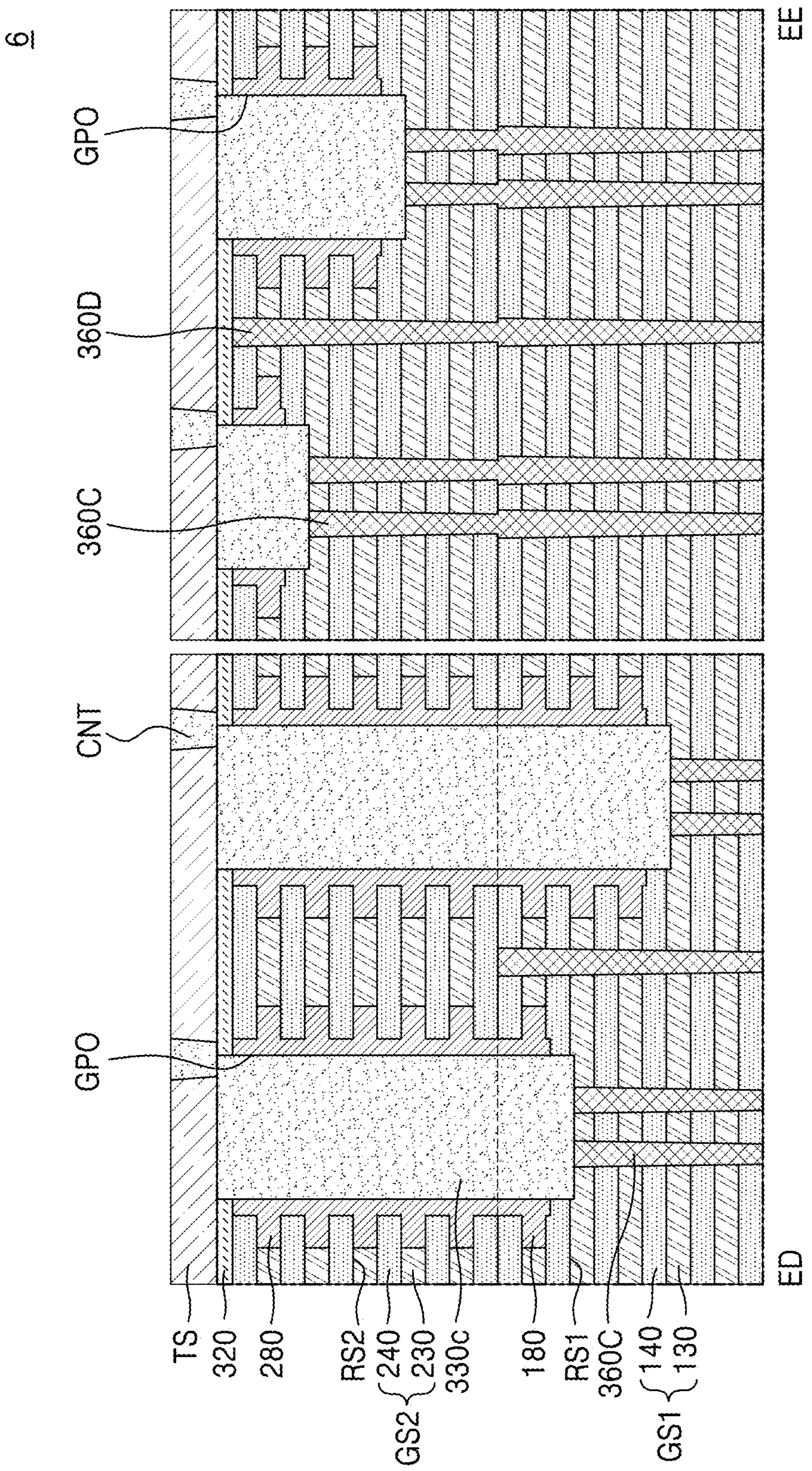

FIGS. 35 to 37 are cross-sectional views respectively illustrating integrated circuit devices according to some example embodiments. Specifically, FIGS. 35 to 37 are enlarged cross-sectional views each illustrating regions corresponding to the regions ED and EE of FIG. 28A and, regarding FIGS. 35 to 37, repeated descriptions given with reference to FIGS. 4 to 29C may be omitted.

Referring to FIG. 35, an integrated circuit device 4 includes only a plurality of gate connection structures 330*c*, instead of the plurality of gate connection structures 330 and the plurality of filling insulating layers 350 of the integrated circuit device 1 shown in FIGS. 28A to 28C.

Instead of or in addition to forming the preliminary pad material layer 330P to cover the inner surfaces of the plurality of gate connection openings GPO and the upper surface of the cover insulating layer 320, a preliminary pad material layer may be formed to fill the plurality of gate connection openings GPO, followed by removing a portion of the preliminary pad material layer such that the upper surface of the cover insulating layer 320 is exposed, thereby forming the plurality of gate connection structures 330*c*.

The plurality of gate connection structures 330*c* may cover the bottom surfaces and the inner side surfaces of the plurality of gate connection openings GPO and completely fill the plurality of gate connection openings GPO, respectively.

Referring to FIG. 36, an integrated circuit device 5 includes only the plurality of gate connection structures 330*c*, instead of the plurality of gate connection structures 330*a* and the plurality of filling insulating layers 350 of the integrated circuit device 2 shown in FIG. 32.

Referring to FIG. 37, an integrated circuit device 6 includes only the plurality of gate connection structures 330*c*, instead of the plurality of gate connection structures 330*b* and the plurality of filling insulating layers 350 of the integrated circuit device 3 shown in FIG. 34.

Figure 38:
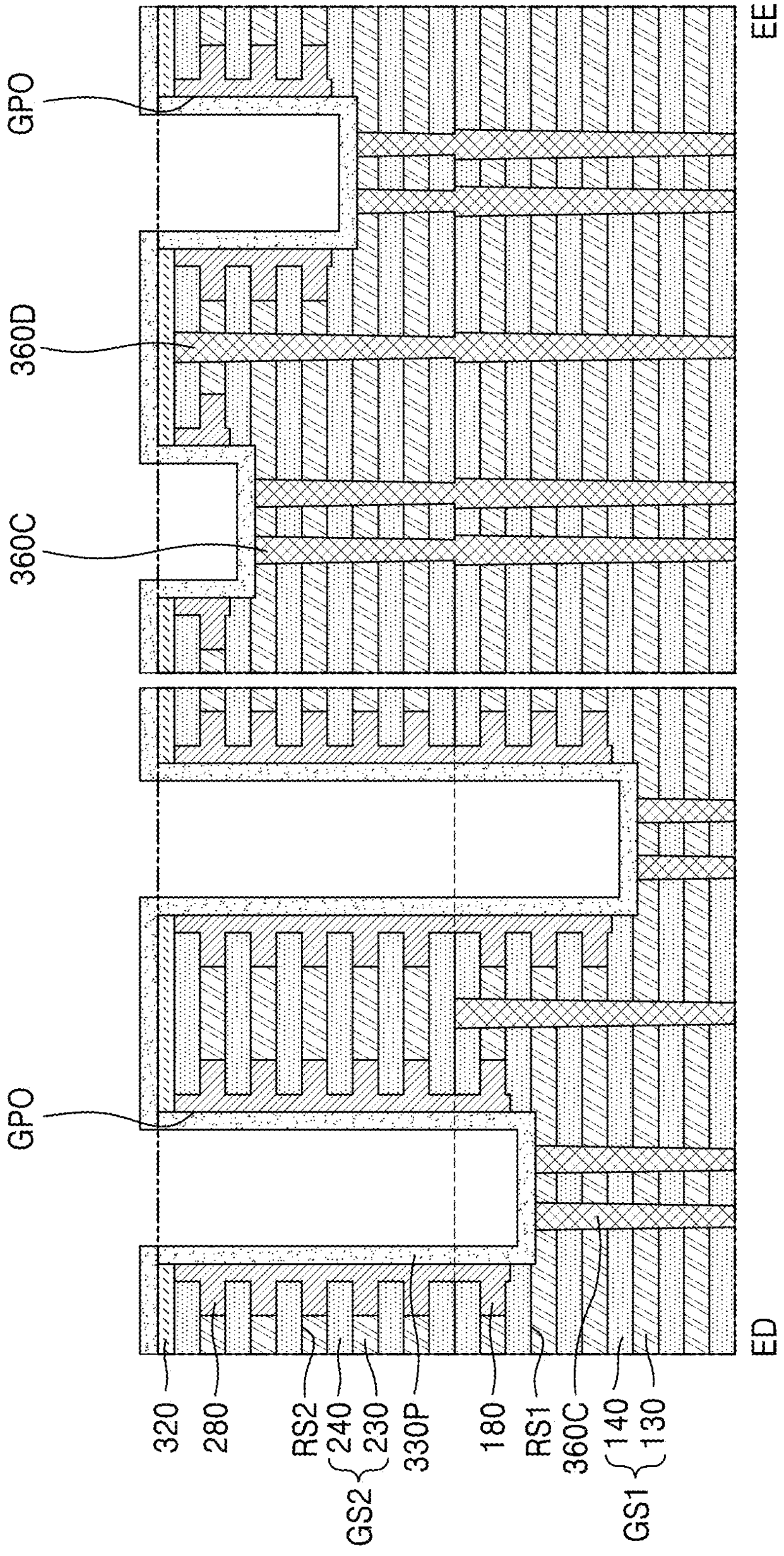
FIGS. 38 and 39 are cross-sectional views illustrating a method of fabricating an integrated circuit device, according to some example embodiments.
Figure 39:
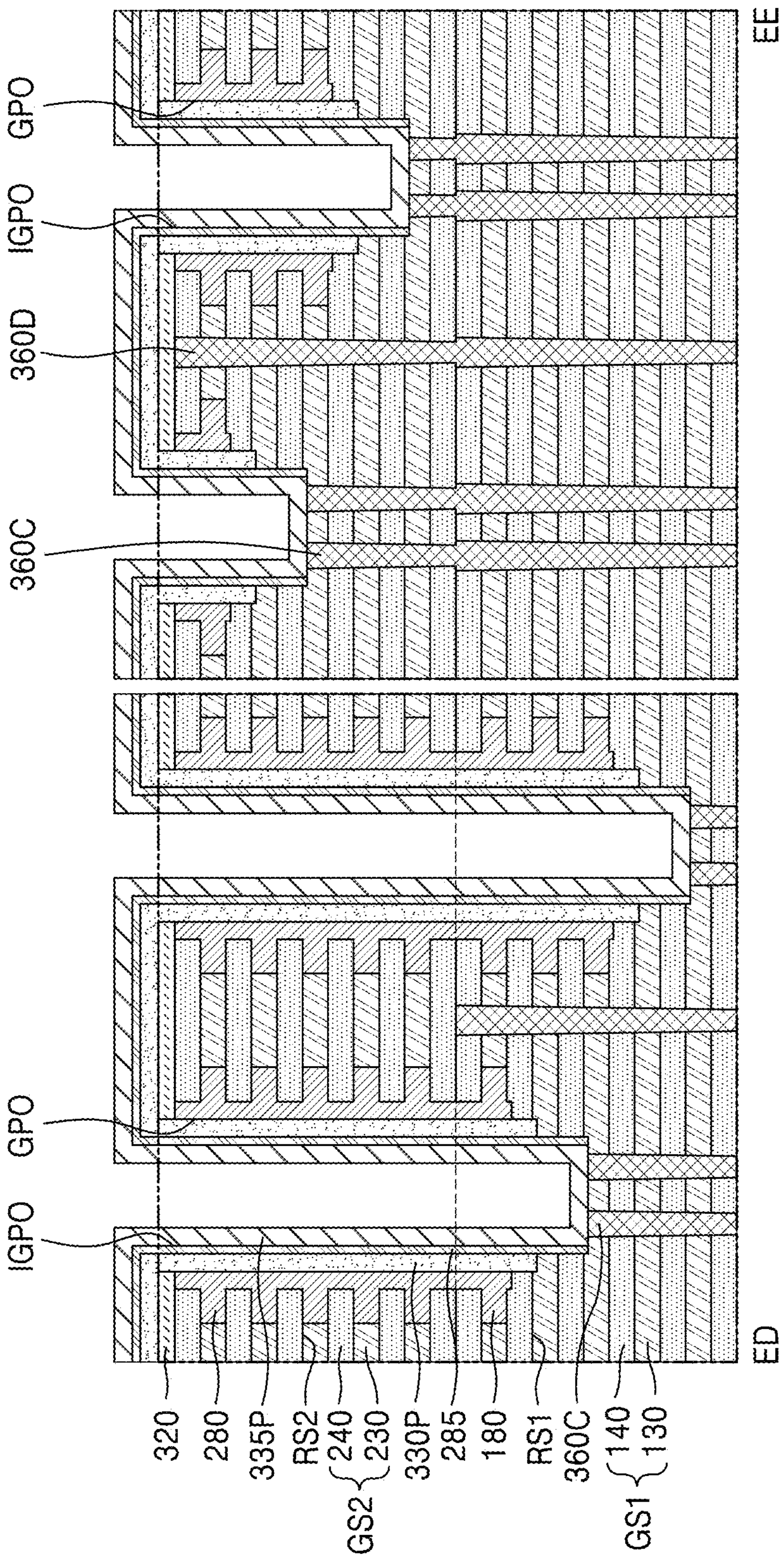
Figure 40A:
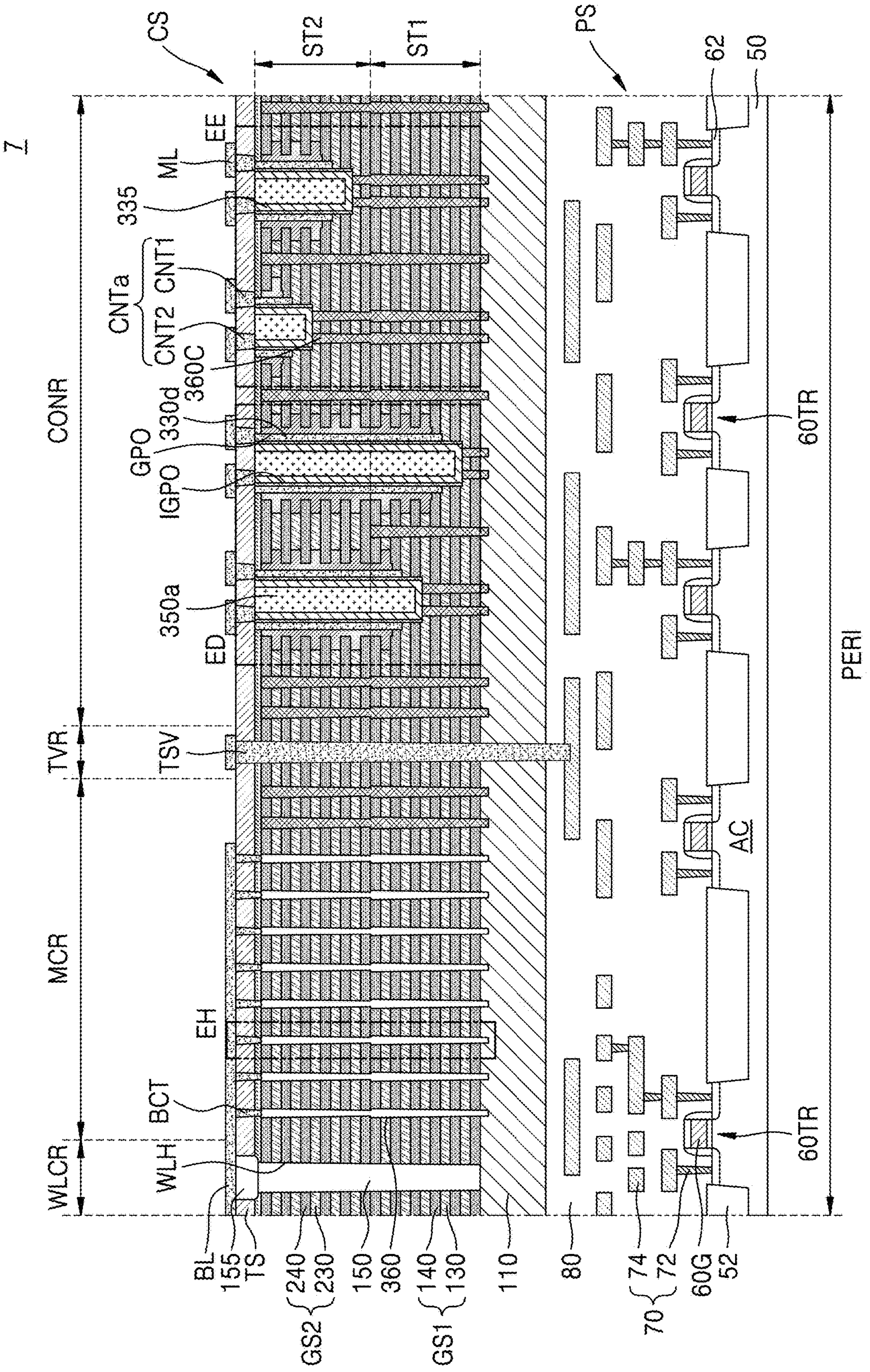
FIGS. 40A to 40C are respectively cross-sectional views and a perspective view illustrating an integrated circuit device according to some example embodiments.
Figure 40B:
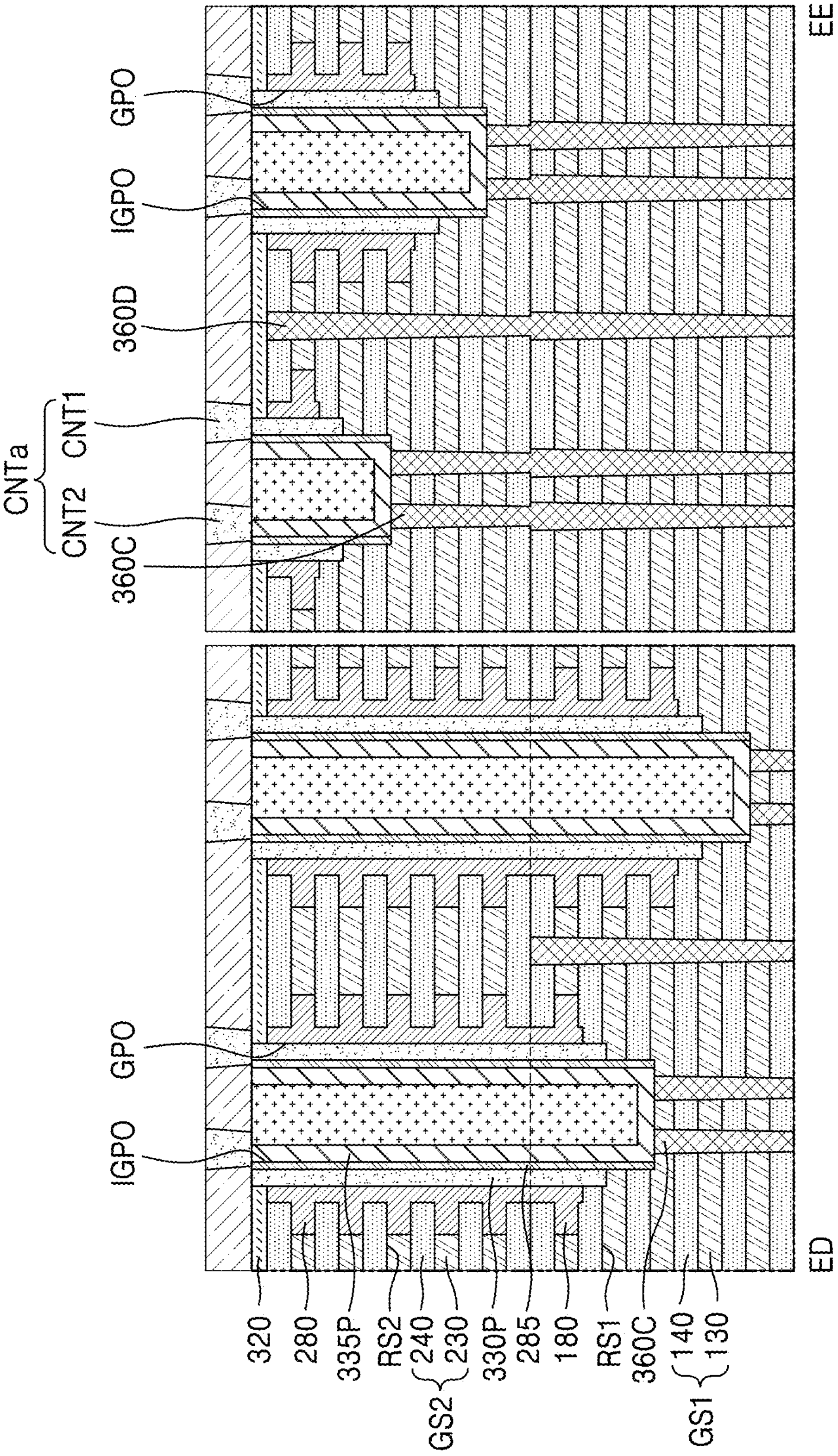
Figure 40C:
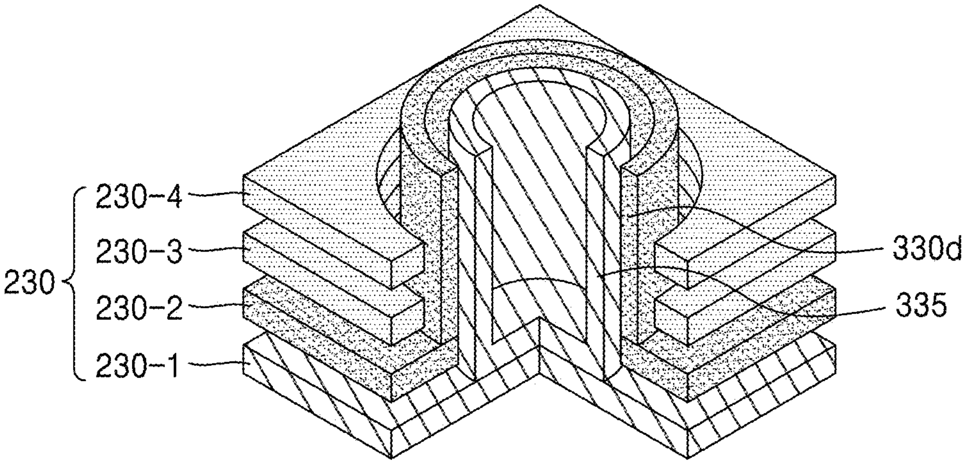

FIGS. 38 and 39 are cross-sectional views illustrating a method of fabricating an integrated circuit device, according to some example embodiments, and FIGS. 40A to 40C are respectively cross-sectional views and a perspective view illustrating an integrated circuit device according to some example embodiments. Specifically, FIGS. 38, 39, and 40B are enlarged cross-sectional views each illustrating regions corresponding to the regions ED and EE of FIG. 40A, and FIG. 40C is a perspective view illustrating some components of the integrated circuit device shown in FIG. 40A. Here, regarding FIGS. 38 to 40C, repeated descriptions given with reference to FIGS. 4 to 37 may be omitted.

Referring to FIGS. 33 and 38, the preliminary pad material layer 330P is formed to cover the inner surfaces of the plurality of gate connection openings GPO and the upper surface of the cover insulating layer 320. The preliminary pad material layer 330P may conformally cover the plurality of first spacer insulating layers 180, the plurality of second spacer insulating layers 280, the loss dummy structures 360C, the plurality of first gate electrodes 130, and the plurality of second gate electrodes 230, which are exposed in the plurality of gate connection openings GPO, and the upper surface of the cover insulating layer 320. The preliminary pad material layer 330P may further cover respective side surfaces of the plurality of first insulating layers 140 and the plurality of second insulating layers 240, which cover respective upper surfaces of the plurality of first gate electrodes 130 and the plurality of second gate electrodes 230 that are in contact with the preliminary pad material layer 330P.

Referring together to FIGS. 38 and 39, a portion of the preliminary pad material layer 330P, which covers the bottom surface of each of the plurality of gate connection openings GPO, a portion of one gate electrode, which is located at the bottom surface of each of the plurality of gate connection openings GPO, from among the plurality of first gate electrodes 130 and the plurality of second gate electrodes 230, and a portion of one insulating layer under the portion of the one gate electrode from among the plurality of first insulating layers 140 and the plurality of second insulating layers 240 are removed, thereby exposing another gate electrode, which is at a lower vertical level than the one gate electrode located at the bottom surface of each of the plurality of gate connection openings GPO, from among the plurality of first gate electrodes 130 and the plurality of second gate electrodes 230.

The one gate electrode, which is located at the bottom surface of each of the plurality of gate connection openings GPO, from among the plurality of first gate electrodes 130 and the plurality of second gate electrodes 230 may be referred to as an upper gate electrode, and the other gate electrode that is at a lower vertical level than the upper gate electrode may be referred to as a lower gate electrode.

By forming an inner spacer insulating layer 285 to cover the preliminary pad material layer 330P, a plurality of inner gate connection openings IGPO, which are defined by the inner spacer insulating layer 285, may be respectively formed in the plurality of gate connection openings GPO. Next, a preliminary inner pad material layer 335P is formed to cover an inner side surface and a bottom surface of an inner gate connection opening IGPO. The inner spacer insulating layer 285 may be formed not to cover the lower gate electrode. Although FIG. 39 illustrates that the inner spacer insulating layer 285 covers a portion of the preliminary pad material layer 330P, which covers the upper surface of the cover insulating layer 320, this is only an example, and the inventive concept is not limited thereto. For example, in the plurality of gate connection openings GPO, the inner spacer insulating layer 285 may not cover an upper surface of the lower gate electrode while covering the preliminary pad material layer 330P and a side surface of the upper gate electrode.

Referring together to FIGS. 40A to 40C, a filling insulating layer 350*a* is formed to fill the plurality of inner gate connection openings IGPO, followed by removing respective portions of the preliminary pad material layer 330P and the preliminary inner pad material layer 335P such that the upper surface of the cover insulating layer 320 is exposed, thereby forming a plurality of gate connection structures 330*d* and a plurality of inner gate connection structures 335. Next, the upper support layer TS, a plurality of gate contacts CNTa, the plurality of bit line contacts BCT, the upper buried layer 155, the bit line BL, and the plurality of conductive lines ML may be formed, thereby forming an integrated circuit device 7.

The plurality of gate connection structures 330*d* may be respectively arranged in the plurality of gate connection openings GPO, and each of the plurality of gate connection structures 330*d* may be in contact and connected with an upper surface of the upper gate electrode exposed at the bottom surface of each of the plurality of gate connection openings GPO. The plurality of inner gate connection structures 335 may be respectively arranged in the plurality of inner gate connection openings IGPO, and each of the plurality of inner gate connection structures 335 may be in contact and connected with the upper surface of the lower gate electrode exposed at a bottom surface of each of the plurality of inner gate connection openings IGPO. A plurality of inner spacer insulating layers 285 may be respectively arranged between the plurality of gate connection structures 330*d* and the plurality of inner gate connection structures 335.

For example, each of the plurality of gate connection structures 330*d* may have a cylinder shape with open top and bottom. Each of the plurality of inner gate connection openings IGPO may pass through the upper gate electrode and extend to the lower gate electrode. Each of the plurality of inner gate connection openings IGPO may not pass through the lower gate electrode. A lower surface of each of the plurality of gate connection structures 330*d* may be in contact with an upper surface of a portion of the upper gate electrode, the portion being close to the inner gate connection opening IGPO. A horizontal inner diameter of a gate connection structure 330*d* may be greater than a horizontal width of the inner gate connection opening IGPO.

For example, each of the plurality of inner gate connection structures 335 may have a cylinder shape with open top and closed bottom. A lower surface of each of the plurality of inner gate connection structures 335 may be in contact with an upper surface of a portion of the lower gate electrode at the bottom surface of the inner gate connection opening IGPO. A horizontal outer diameter of an inner gate connection structure 335 may be equal to the horizontal width of the inner gate connection opening IGPO.

Each of the plurality of gate contacts CNTa may include a first gate contact CNT1 and a second gate contact CNT2. The first gate contact CNT1 may be in contact and connected with an upper end of the gate connection structure 330*d*, and the second gate contact CNT2 may be in contact and connected with an upper end of the inner gate connection structure 335. The gate connection structure 330*d* and the inner gate connection structure 335 may be referred to as a first gate connection structure and a second gate connection structure, respectively. The plurality of conductive lines ML may be respectively in contact and connected with upper surfaces of the plurality of gate contacts CNTa and upper surfaces of the plurality of through-electrodes TSV, and thus, may respectively and electrically connect the plurality of gate contacts CNTa with the plurality of through-electrodes TVS.

FIG. 40C is a perspective view illustrating an example in which the gate connection structure 330*d* and the inner gate connection structure 335 are respectively connected with the plurality of second gate electrodes 230. For example, the plurality of second gate electrodes 230 may include a first electrode 230-1, a second electrode 230-2, a third electrode 230-3, and a fourth electrode 230-4, which are arranged apart from each other in the vertical direction. The first electrode 230-1 may be the lower gate electrode, and the second electrode 230-2 may be the upper gate electrode. The inner gate connection structure 335 may be in contact with an upper surface of the first electrode 230-1. The inner gate connection structure 335 may pass through the fourth electrode 230-4, the third electrode 230-3, and the second electrode 230-2 and contact the upper surface of the first electrode 230-1. The inner gate connection structure 335 may have a cylinder shape with open top and closed bottom. The gate connection structure 330*d* may be in contact with an upper surface of the second electrode 230-2. Each of the plurality of gate connection structures 330*d* may have a cylinder shape with open top and bottom.

Although FIGS. 40A to 40C illustrate that the first gate connection structure and the second gate connection structure, that is, the gate connection structure 330*d* and the inner gate connection structure 335, are arranged in one gate connection opening GPO, this is only an example, and the inventive concept is not limited thereto. For example, three or more gate connection structures, which are apart from each other by an inner spacer insulating layer, may be arranged in one gate connection opening GPO, and here, among the three or more gate connection structures, the innermost gate connection structure may have a cylinder shape with open top and closed bottom, like the inner gate connection structure 335, and the other gate connection structures may each have a cylinder shape with open top and bottom, like the gate connection structure 330*d* . The three or more gate connection structures arranged in the one gate connection opening GPO may be in contact and connected with gate electrodes that are at three or more vertical levels different from each other, respectively.

Figure 41:
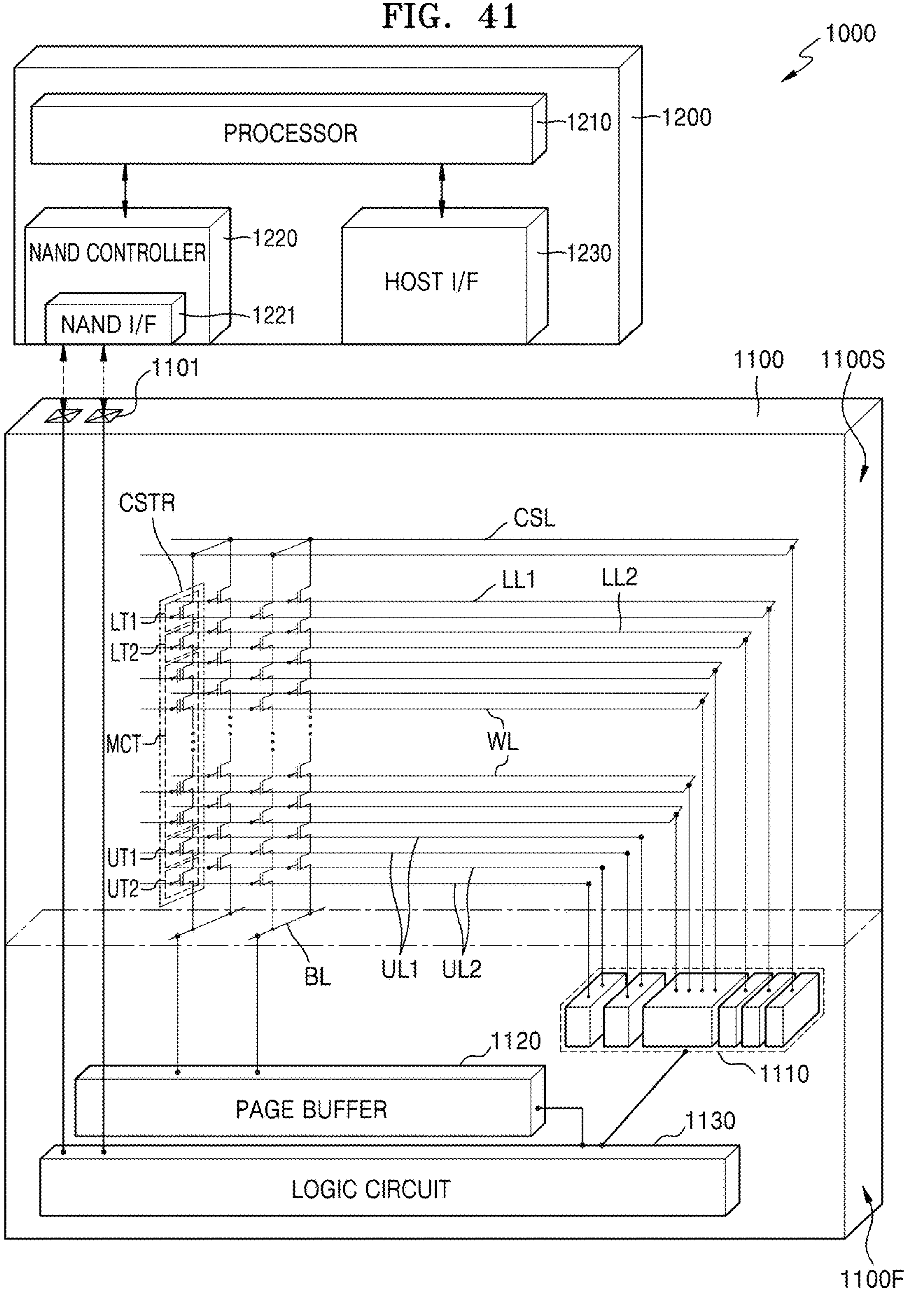
FIG. 41 is a diagram schematically illustrating an electronic system including an integrated circuit device according to some example embodiments.

FIG. 41 is a diagram schematically illustrating an electronic system including an integrated circuit device according to some example embodiments.

Referring to FIG. 41, an electronic system 1000 may include one or more memory devices 1100 and a memory controller 1200 that is electrically connected with the memory devices 1100. For example, the electronic system 1000 may include a solid-state drive (SSD) device, a universal serial bus (USB), a computing system, a medical device, or a communication device, which includes at least one memory device 1100.

The memory device 1100 may include an integrated circuit device including a nonvolatile memory device. For example, the memory device 1100 may include an integrated circuit device, which include one of the integrated circuit devices 1, 1-1, 1-2, 1-3, 1*a*, 2, 3, 4, 5, 6, and 7 described with reference to FIGS. 4 to 40C or a combination thereof. The memory device 1100 may include a first structure 1100F and a second structure 1100S on the first structure 1100F. The first structure 1100F may correspond to the peripheral circuit structure PS shown in FIGS. 2, 28A, and 40A. The peripheral circuit structure PS shown in FIGS. 2, 28A, and 40A may include a row decoder 1110, a page buffer 1120, and a logic circuit 1130.

The second structure 1100S may correspond to the cell array structure CS shown in FIGS. 2, 28A, and 40A. The second structure 1100S may include the bit line BL, the common source line CSL, the plurality of word lines WL, first and second string select lines UL1 and UL2, first and second ground select lines LL1 and LL2, and a plurality of memory cell strings CSTR between the bit line BL and the common source line CSL. The plurality of first gate electrodes 130, the plurality of second gate electrodes 230, and the plurality of channel structures 360, which are shown in FIGS. 28A and 40A, may form the plurality of memory cell strings CSTR.

In the second structure 1100S, each of the plurality of memory cell strings CSTR may include ground select transistors LT1 and LT2 adjacent to the common source line CSL, string select transistors UT1 and UT2 adjacent to the bit line BL, and a plurality of memory cell transistors MCT between the ground select transistors LT1 and LT2 and the string select transistors UT1 and UT2. The respective numbers of ground select transistors LT1 and LT2 and string select transistors UT1 and UT2 may be variously modified depending on embodiments. One of the plurality of channel structures 360 shown in FIGS. 28A and 40A and one of the plurality of first gate electrodes 130 and the plurality of second gate electrodes 230 shown in FIGS. 28A and 40A may form one of the plurality of transistors (that is, LT1, LT2, UT1, UT2, and MCT).

In some example embodiments, a plurality of ground select lines (that is, LL1 and LL2) may be respectively connected to gate electrodes of the ground select transistors LT1 and LT2. The word line WL may be connected to a gate electrode of a memory cell transistor MCT. A plurality of string select transistors (that is, UT1 and UT2) may be respectively connected to gate electrodes of the string select lines UT1 and UT2.

The common source line CSL, the plurality of ground select lines (that is, LL1 and LL2), the plurality of word lines WL, and the plurality of string select lines (that is, UL1 and UL2) may be connected to the row decoder 1110. The plurality of bit lines BL may be electrically connected to the page buffer 1120.

The memory device 1100 may communicate with the memory controller 1200 via an external connection pad 1101 that is electrically connected with the logic circuit 1130. The external connection pad 1101 may be electrically connected with the logic circuit 1130.

The memory controller 1200 may include a processor 1210, a NAND controller 1220, and a host interface 1230. In some example embodiments, the electronic system 1000 may include a plurality of memory devices 1100, and in this case, the memory controller 1200 may control the plurality of memory devices 1100.

The processor 1210 may control overall operations of the electronic system 1000 including the memory controller 1200. The processor 1210 may be operated according to certain firmware and may access the memory device 1100 by controlling the NAND controller 1220. The NAND controller 1220 may include a NAND interface 1221 for processing communication with the memory device 1100. At least one of a control command for controlling the memory device 1100, data intended to be written to the plurality of memory cell transistors MCT of the memory device 1100, data intended to be read from the plurality of memory cell transistors MCT of the memory device 1100, and the like may be transmitted via the NAND interface 1221. The host interface 1230 may provide a function of communication between the electronic system 1000 and an external host. When receiving a control command from the external host via the host interface 1230, the processor 1210 may control the memory device 1100 in response to the control command.

Figure 42:
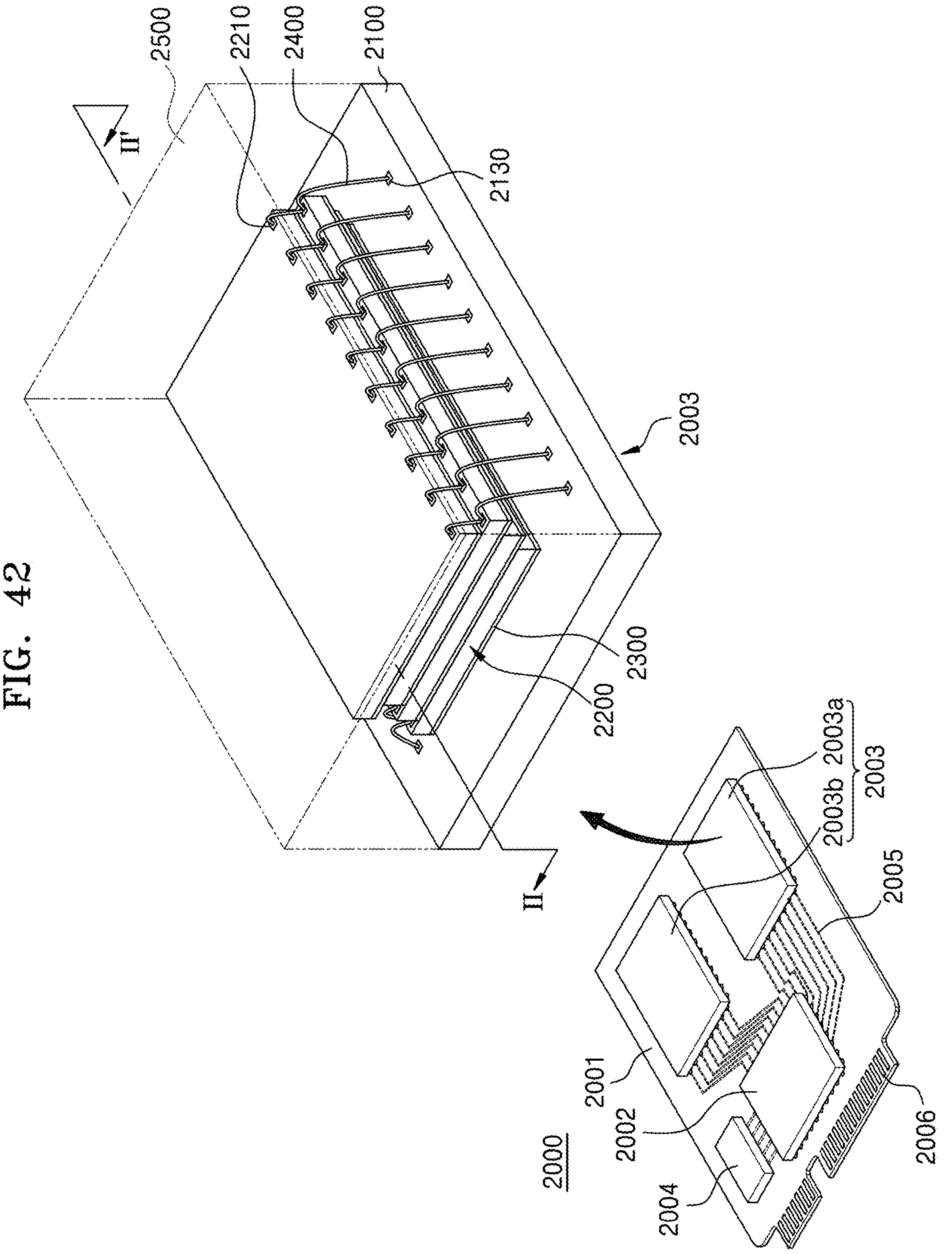
FIG. 42 is a perspective view schematically illustrating an electronic system including an integrated circuit device according to some example embodiments.

FIG. 42 is a perspective view schematically illustrating an electronic system including an integrated circuit device according to some example embodiments.

Referring to FIG. 42, an electronic system 2000 according to various example embodiments may include a main substrate 2001, and a memory controller 2002, one or more semiconductor packages 2003, and DRAM 2004, which are mounted on the main substrate 2001. The semiconductor packages 2003 and the DRAM 2004 may be connected with the memory controller 2002 by a plurality of wiring patterns 2005 formed on the main substrate 2001.

The main substrate 2001 may include a connector 2006 including a plurality of pins to be coupled with an external host. The number of pins and the arrangement of the plurality of pins, in the connector 2006, may vary depending on a communication interface between the electronic system 2000 and the external host. In some example embodiments, the electronic system 2000 may communicate with the external host according to one or more of interfaces, such as Universal Serial Bus (USB), Peripheral Component Interconnect Express (PCI-Express), Serial Advanced Technology Attachment (SATA), and M-Phy for Universal Flash Storage (UFS). In some example embodiments, the electronic system 2000 may be operated by power supplied from the external host via the connector 2006. The electronic system 2000 may further include a power management integrated circuit (PMIC) distributing the power, which is supplied from the external host, to the memory controller 2002 and the semiconductor packages 2003.

The memory controller 2002 may write data to or read data from the semiconductor packages 2003 and may improve an operation speed of the electronic system 2000.

The DRAM 2004 may be or include or be included in a buffer memory for alleviating a speed difference between the external host and the semiconductor packages 2003, which are data storage spaces. The DRAM 2004 in the electronic system 2000 may operate as a kind of cache memory and may provide a space for temporarily storing data in a control operation on the semiconductor packages 2003. When the DRAM 2004 is included in the electronic system 2000, the memory controller 2002 may further include a DRAM controller for controlling the DRAM 2004, in addition to a NAND controller for controlling the semiconductor packages 2003.

The semiconductor package 2003 may include first and second semiconductor packages 2003*a* and 2003*b*, which are apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 with the package substrate 2100, and a molding layer 2500 arranged on the package substrate 2100 to cover the plurality of semiconductor chips 2200 and the connection structure 2400.

The package substrate 2100 may include a printed circuit board including a plurality of package upper pads 2130. Each of the plurality of semiconductor chips 2200 may include an input/output pad 2210. Each of the plurality of semiconductor chips 2200 may include at least one of the integrated circuit devices 1, 1-1, 1-2, 1-3, 1*a*, 2, 3, 4, 5, 6, and 7 described with reference to FIGS. 4 to 40C.

In some example embodiments, the connection structure 2400 may include a bonding wire electrically connecting the input/output pad 2210 with a package upper pad 2130. Therefore, in the first and second semiconductor packages 2003*a* and 2003*b*, the plurality of semiconductor chips 2200 may be electrically connected to each other in a bonding wire manner and may be electrically connected with the package upper pads 2130 of the package substrate 2100. In some example embodiments, in the first and second semiconductor packages 2003*a* and 2003*b*, the plurality of semiconductor chips 2200 may be electrically connected to each other by a connection structure including a through-silicon via (TSV) structure rather than or in addition to the connection structure 2400 of a bonding wire type.

In some example embodiments, the memory controller 2002 and the plurality of semiconductor chips 2200 may be included in one package. In some example embodiments, the memory controller 2002 and the plurality of semiconductor chips 2200 may be mounted on a separate interposer substrate, which is different from the main substrate 2001, and may be connected to each other by wiring lines formed on the interposer substrate.

Figure 43:
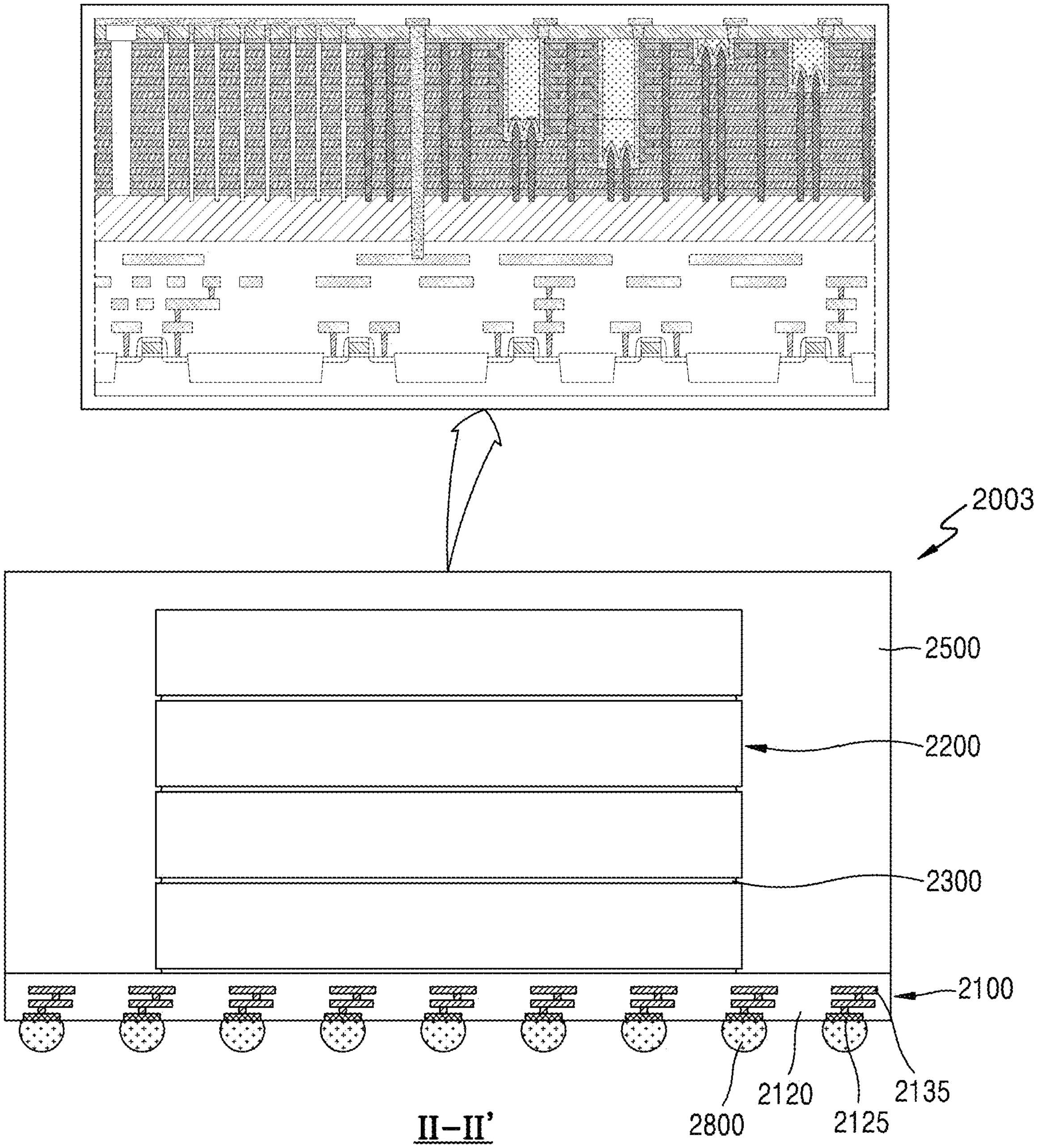
FIG. 43 is a cross-sectional view schematically illustrating a semiconductor package including an integrated circuit device according to some example embodiments.

FIG. 43 is a cross-sectional view schematically illustrating a semiconductor package including an integrated circuit device according to some example embodiments.

Referring to FIG. 43, in the semiconductor package 2003, the package substrate 2100 may include a printed circuit board. The package substrate 2100 may include a package substrate body 2120, the plurality of package upper pads 2130 (see FIG. 42) arranged on an upper surface of the package substrate body 2120, a plurality of lower pads 2125 arranged on or exposed by a lower surface of the package substrate body 2120, and a plurality of inner wiring lines 2135 arranged inside the package substrate body 2120 to electrically connect the plurality of package upper pads 2130 (see FIG. 42) with the plurality of lower pads 2125. As shown in FIG. 42, the plurality of package upper pads 2130 may be electrically connected with a plurality of connection structures 2400, respectively. The plurality of lower pads 2125 may be connected to the plurality of wiring patterns 2005 on the main substrate 2001 of the electronic system 2000 shown in FIG. 42 via a plurality of conductive bumps 2800, respectively. Each of the plurality of semiconductor chips 2200 may include at least one of the integrated circuit devices 1, 1-1, 1-2, 1-3, 1*a*, 2, 3, 4, 5, 6, and 7 described with reference to FIGS. 4 to 40C.

While the inventive concept has been particularly shown and described with reference to embodiments thereof, it will be understood that various changes in form and details may be made therein without departing from the spirit and scope of the following claims. Furthermore, example embodiments are not necessarily mutually exclusive with one another. For example, some example embodiments may include one or more features described with reference to one or more figures and may also include one or more other features described with reference to one or more other figures.

What is claimed is:

1. An integrated circuit device comprising:

a substrate comprising a memory cell area and a connection area;

a gate stack on the substrate and comprising a plurality of gate electrodes that are apart from each other in a vertical direction with a plurality of gate connection openings defined in the connection area to extend inward from an upper surface of the gate stack, one of the plurality of gate electrodes being exposed at a bottom surface of each of the plurality of gate connection openings;

a plurality of gate connection structures respectively covering at least inner side surfaces of the plurality of gate connection openings, each of the plurality of gate connection structures being connected with the one of the plurality of gate electrodes; and a plurality of gate contacts respectively connected to upper ends of the plurality of gate connection structures, wherein the plurality of gate connection structures are conformally on bottoms of the plurality of gate connection openings.

2. The integrated circuit device of claim 1, wherein the connection area further defines a plurality of stack openings arranged in the connection area to extend inward from the upper surface of the gate stack, and the integrated circuit device further comprises a plurality of spacer insulating layers respectively covering inner side surfaces of the plurality of stack openings and respectively defining the plurality of gate connection openings.

3. The integrated circuit device of claim 1, further comprising:

a plurality of channel structures passing through the gate stack in the memory cell area; and a plurality of dummy structures apart from the plurality of channel structures and passing through the gate stack, wherein at least one of the plurality of dummy structures is arranged in each of the plurality of gate connection openings and is covered by each of the plurality of gate connection structures.

4. The integrated circuit device of claim 3, wherein the at least one of the plurality of dummy structures comprises a loss dummy structure having an upper end below those of upper ends of other dummy structures not arranged in the plurality of gate connection openings.

5. The integrated circuit device of claim 4, wherein the loss dummy structure passes through the one of the plurality of gate electrodes, which is connected with each of the plurality of gate connection structures, and protrudes upward from an upper surface of the one of the plurality of gate electrodes.

6. The integrated circuit device of claim 4, wherein the loss dummy structure passes through the one of the plurality of gate electrodes, which is connected with each of the plurality of gate connection structures, and does not protrude upward from an upper surface of the one of the plurality of gate electrodes.

7. The integrated circuit device of claim 1, wherein the plurality of gate connection structures extend from the bottom surfaces of the plurality of gate connection openings to uppermost ends of the plurality of gate connection openings along inner side surfaces of the plurality of gate connection openings, respectively.

8. The integrated circuit device of claim 7, wherein the plurality of gate connection structures at least partly fill the plurality of gate connection openings, respectively.

9. The integrated circuit device of claim 1, wherein the plurality of gate contacts are respectively and electrically connected with the plurality of gate electrodes through the plurality of gate connection structures, and the plurality of gate contacts, which are respectively and electrically connected with the plurality of gate electrodes that are at different vertical levels from each other, have a same vertical height.

10. The integrated circuit device of claim 1, wherein the gate stack comprises a plurality of memory cell blocks and has no stepwise structure, each of the plurality of memory cell blocks being surrounded by a gate stack separation opening that passes through the gate stack.

11. An integrated circuit device comprising:

a substrate comprising a memory cell area and a connection area;

a gate stack on the substrate and comprising a plurality of insulating layers and a plurality of gate electrodes, which are alternately arranged in a vertical direction;

a plurality of channel structures passing through the gate stack in the memory cell area with a plurality of gate connection openings defined in the connection area to extend inward from an upper surface of the gate stack, one of the plurality of gate electrodes being exposed at a bottom surface of each of the plurality of gate connection openings;

a plurality of dummy structures apart from the plurality of channel structures and passing through the gate stack, at least one of the plurality of dummy structures being arranged in each of the plurality of gate connection openings;

a plurality of gate connection structures conformally covering inner side surfaces and bottom surfaces of the plurality of gate connection openings, respectively, wherein each of the plurality of gate connection structures is connected with the one of the plurality of gate electrodes, which is exposed at the bottom surface of each of the plurality of gate connection openings, and covers the at least one of the plurality of dummy structures arranged in each of the plurality of gate connection openings; and a plurality of gate contacts respectively connected to upper ends of the plurality of gate connection structures.

12. The integrated circuit device of claim 11, further comprising:

a plurality of spacer insulating layers each between each of the plurality of gate connection structures and another one of the plurality of gate electrodes above the one of the plurality of gate electrodes, which is exposed at the bottom surface of each of the plurality of gate connection openings from among the plurality of gate electrodes.

13. The integrated circuit device of claim 12, wherein each of the plurality of spacer insulating layers is between two insulating layers adjacent to each other in the vertical direction from among the plurality of insulating layers.

14. The integrated circuit device of claim 11, wherein the at least one of the plurality of dummy structures in each of the plurality of gate connection openings passes through the one of the plurality of gate electrodes connected with each of the plurality of gate connection structures respectively in the plurality of gate connection openings.

15. The integrated circuit device of claim 14, wherein the at least one of the plurality of dummy structures in each of the plurality of gate connection openings, from among the plurality of dummy structures, has an upper end at a vertical level that is lower than those of upper ends of other dummy structures not arranged in the plurality of gate connection openings.

16. The integrated circuit device of claim 14, wherein the at least one of the plurality of dummy structures in each of the plurality of gate connection openings protrudes upward from an upper surface of the one of the plurality of gate electrodes connected with each of the plurality of gate connection structures respectively in the plurality of gate connection openings.

17. The integrated circuit device of claim 14, wherein the at least one of the plurality of dummy structures in each of the plurality of gate connection openings does not protrude upward from an upper surface of the one of the plurality of gate electrodes connected with each of the plurality of gate connection structures respectively in the plurality of gate connection openings.

18. The integrated circuit device of claim 11, wherein the plurality of gate contacts have a same vertical height.

19. An electronic system comprising:

a main substrate;

an integrated circuit device on the main substrate; and a controller on the main substrate and electrically connected with the integrated circuit device, wherein the integrated circuit device comprises, a gate stack comprising a plurality of gate electrodes, which are apart from each other in a vertical direction on a substrate comprising a memory cell area and a connection area, a plurality of channel structures passing through the gate stack in the memory cell area with a plurality of gate connection openings defined in the connection area to extend inward from an upper surface of the gate stack, one of the plurality of gate electrodes being exposed at a bottom surface of each of the plurality of gate connection openings, a plurality of dummy structures apart from the plurality of channel structures and passing through the gate stack, at least one of the plurality of dummy structures being arranged in each of the plurality of gate connection openings, a plurality of gate connection structures respectively and conformally covering inner side surfaces and bottom surfaces of the plurality of gate connection openings, each of the plurality of gate connection structures being connected with the one of the plurality of gate electrodes, and a plurality of gate contacts respectively connected to upper ends of the plurality of gate connection structures.

20. The electronic system of claim 19, wherein the plurality of gate connection structures extend from the bottom surfaces of the plurality of gate connection openings to uppermost ends of the plurality of gate connection openings along the inner side surfaces of the plurality of gate connection openings, respectively, and the plurality of gate contacts have a same vertical height.

* * * * *